(12) United States Patent
Fujiwara et al.

(10) Patent No.: US 6,388,922 B1
(45) Date of Patent: May 14, 2002

(54) SEMICONDUCTOR MEMORY AND METHOD OF OPERATING SEMICONDUCTOR MEMORY

(75) Inventors: Hideaki Fujiwara, Hashima; Hideharu Nagasawa, Takatsuki; Shoji Sudo; Takashi Hiroshima, both of Gifu, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/590,954

(22) Filed: Jun. 9, 2000

(30) Foreign Application Priority Data

| Jun. 9, 1999 | (JP) | 11-162501 |
| Feb. 8, 2000 | (JP) | 2000-030017 |
| Feb. 9, 2000 | (JP) | 2000-031370 |
| Feb. 18, 2000 | (JP) | 2000-041806 |
| Feb. 18, 2000 | (JP) | 2000-041883 |

(51) Int. Cl.$^7$ .................................................. G11C 16/04
(52) U.S. Cl. .............................. 365/185.18; 365/185.01; 257/315
(58) Field of Search ...................... 365/185.18, 185.01; 257/314, 315; 438/257

(56) References Cited

U.S. PATENT DOCUMENTS

| 5,452,250 A | * | 9/1995 | Riggio, Jr. | 365/185 |
| 5,592,001 A | * | 1/1997 | Asano | 365/185.05 |
| 5,617,351 A | * | 4/1997 | Bertin et al. | 355/185.01 |

* cited by examiner

Primary Examiner—Huan Hoang
(74) Attorney, Agent, or Firm—Armstrong, Westerman & Hattori, LLP

(57) ABSTRACT

A semiconductor memory capable of attaining a long life, a low voltage, a high-speed operation, low power consumption and high integration is provided. The semiconductor memory comprises a control gate electrode, a floating gate electrode, a semiconductor region, a first insulator film formed on one surface of the semiconductor region and a second insulator film formed on another surface of the semiconductor region. A prescribed voltage is applied to the control gate electrode or a drain region thereby injecting carriers from the control gate electrode or the drain region into the floating gate electrode through the first insulator film, the semiconductor region and the second insulator film.

60 Claims, 32 Drawing Sheets

SECTION ALONG DIRECTION X

SECTION ALONG DIRECTION Y

SECTION ALONG DIRECTION X

SECTION ALONG DIRECTION X

SECTION ALONG DIRECTION X

SECTION ALONG DIRECTION X

SECTION ALONG DIRECTION X

SECTION ALONG DIRECTION X

SECTION ALONG DIRECTION X

SECTION ALONG DIRECTION Y

SECTION ALONG DIRECTION X

SECTION ALONG DIRECTION X

SECTION ALONG DIRECTION X

SECTION ALONG DIRECTION X

SECTION ALONG DIRECTION X

SECTION ALONG LINE 200-200

SECTION ALONG LINE 200-200

SECTION ALONG LINE 300-300

SECTION ALONG LINE 400-400

SEMICONDUCTOR MEMORY AND METHOD OF OPERATING SEMICONDUCTOR MEMORY

BACKGROUND OF THE INVENTION

1. Field of the Invention

The present invention relates to a semiconductor memory and a method of operating a semiconductor memory.

2. Description of the Prior Art

In recent years, a nonvolatile semiconductor memory such as an EPROM (erasable and programmable read only memory) or an EEPROM (electrically erasable and programmable read only memory) is watched with interest as a semiconductor memory capable of substituting for a hard disk or a floppy disk serving as a magnetic memory.

In a memory cell of an EPROM or an EEPROM, carriers are stored in a floating gate electrode for storing data by presence/absence of the carriers and reading data by detecting change of a threshold voltage following presence/absence of carriers. In particular, the EEPROM includes a flash EEPROM erasing data in a memory cell array as a whole or dividing the memory cell array into arbitrary blocks and erasing data in units of the respective blocks. The flash EEPROM, also referred to as a flash memory, capable of attaining a large capacity, low power consumption and a high-speed operation with excellent impact resistance is applied to various types of portable apparatuses. Further, the flash EEPROM having memory cells each formed by a single transistor can be readily integrated as compared with the EEPROM.

In general, a stacked gate memory cell and a split gate memory cell are proposed for forming the flash EEPROM.

In a write operation of storing electrons in a floating gate electrode of the stacked gate memory cell, electrons contained in a channel of a semiconductor substrate are converted to hot electrons and injected into the floating gate electrode. At this time, a voltage of ten-odd volts must be applied to a control gate electrode. In an erase operation of extracting electrons stored in the floating gate electrode of the stacked gate memory cell, a Fowler-Nordheim tunnel current (hereinafter referred to as an FN tunnel current) is fed from a drain region to the floating gate electrode. At this time, a voltage of ten-odd volts must be applied to the drain region.

In a write operation of storing electrons in a floating gate electrode of the split gate memory cell, electrons contained in a channel of a semiconductor substrate are converted to hot electrons and injected into the floating gate electrode. At this time, a voltage of ten-odd volts must be applied to a drain region. In an erase operation of extracting electrons stored in the floating gate electrode of the split gate memory cell, an FN tunnel current is fed from a control gate electrode to the floating gate electrode. At this time, a voltage of ten-odd volts must be applied to the control gate electrode.

Thus, in the conventional stacked gate or split gate memory cell, electrons are injected into the floating gate electrode as hot electrons in the write operation, and the electrons stored in the floating gate electrode are extracted through the FN tunnel current in the erase operation.

In order to hold carriers stored in the floating gate electrode over a long period of time, the thickness of an insulator film enclosing the floating gate electrode must be increased. However, the electrons are injected into or extracted from the floating gate electrode as hot electrons or through the FN tunnel current. Therefore, the voltage (hereinafter referred to as the operating voltage of the memory cell) applied to the control gate electrode or the drain region in the write or erase operation must be increased as the thickness of the insulator film enclosing the floating gate electrode is increased.

A step-up circuit generates the operating voltage of the memory cell. In this case, the step-up circuit can practically generate a voltage of up to ten-odd volts. When employing a silicon oxide film as the insulator film enclosing the floating gate electrode, the thickness of this silicon oxide film cannot exceed 8 to 10 nm assuming that the operating voltage of the memory cell is ten-odd volts. In general, therefore, the thickness of the silicon oxide film employed as the insulator film enclosing the floating gate electrode is set to 8 to 10 nm, in order to suppress the operating voltage of the memory cell to ten-odd volts. When the thickness of the silicon oxide film is about 8 to 10 nm, electrons stored in the floating gate electrode can be held for a period practically satisfactory to some extent.

Also when storing holes in the floating gate electrode, the thickness of the silicon oxide film forming the insulator film enclosing the floating gate electrode is set to 8 to 10 nm similarly to the aforementioned case of storing electrons, thereby suppressing the operating voltage of the memory cell to ten-odd volts and holding the holes stored in the floating gate electrode for a period practically satisfactory to some extent.

The feature of the flash memory resides in that cells sharing a word line are temporarily subjected to batch erasing and thereafter subjected to rewriting. In relation to the memory cell array, a structure operable with a small number of contacts is employed in order to improve the degree of integration.

Recently, the flash EEPROM is also required to attain a lower voltage, operations at a higher speed, lower power consumption and higher integration while attaining a longer life by increasing the period for holding carriers stored in the floating gate electrode.

When forming the insulator film enclosing the floating gate electrode by the silicon oxide film having the thickness generally set to 8 to 10 nm as described above, the thickness of the silicon oxide film must not be reduced below 8 nm, in order to attain a long life.

When reducing the operating voltage of the memory cell, the time (lead time) for stepping up the voltage is so reduced that the write and erase operations can be performed at a higher speed. Further, power consumption can also be reduced.

The circuit scale of the step-up circuit for generating the operating voltage of the memory cell is increased as the generated voltage is increased. The occupied area (transistor size) of a transistor forming a peripheral circuit, such as a decoder, a sense amplifier or a buffer, of the flash EEPROM is increased on the substrate as the voltage resistance thereof is increased. When reducing the operating voltage of the memory cell, therefore, the circuit scale of the step-up circuit as well as the size of the transistor forming the peripheral circuit are reduced, whereby higher integration can be attained.

Thus, operations at a higher speed, lower power consumption and higher integration can be simultaneously implemented by reducing the operating voltage of the memory cell.

In the conventional stacked gate or split gate memory cell, however, electrons are injected into or extracted from the floating gate electrode as hot electrons or through the FN tunnel current. When employing the silicon oxide film as the insulator film enclosing the floating gate electrode, therefore, it is difficult to reduce the operating voltage of the memory cell beyond the current level while maintaining the thickness of the silicon oxide film at the current level of 8 to 10 nm. In other words, it is difficult to reduce the operating voltage of the memory cell while keeping the life of the conventional stacked gate or split gate memory cell at the current level without changing the structure thereof.

As described above, the feature of the flash memory resides in that the cells sharing a word line are subjected to batch erasing and thereafter subjected to rewriting. Therefore, the cells sharing the word line must be subjected to erasing and writing also when data may not be rewritten. In this case, the data are rewritten in two stages of erasing and writing. Therefore, it is difficult to perform writing on a group of cells forming a block (sector) subjected to batch erasing simultaneously with batch erasing or to perform the so-called overwriting performed in a magnetic disk. Thus, it is difficult to increase the speed for write and erase operations.

SUMMARY OF THE INVENTION

An object of the present invention is to provide a semiconductor memory capable of attaining a longer life, a lower voltage, operations at a higher speed, lower power consumption and a higher degree of integration.

Another object of the present invention is to implement the aforementioned semiconductor memory in a simple structure.

Still another object of the present invention is to further refine a first gate electrode and a second gate electrode and suppress dispersion of the gate lengths in the aforementioned semiconductor memory.

A further object of the present invention is to simultaneously perform erasing and writing in the aforementioned semiconductor memory.

A further object of the present invention is to provide a method of operating a semiconductor memory capable of readily operating the aforementioned semiconductor memory.

A semiconductor memory according to a first aspect of the present invention comprises a first gate electrode, a second gate electrode, a semiconductor region, a first insulator film formed on one surface of the semiconductor region and a second insulator film formed on another surface of the semiconductor region, for injecting carriers into the second gate electrode through the first insulator film, the semiconductor region and the second insulator film. In this case, the semiconductor region is preferably formed by a second conductivity type impurity region formed on a first layer consisting of a first conductivity type semiconductor. Preferably, the semiconductor region includes a second conductivity type semiconductor film formed on a first layer consisting of a first conductivity type semiconductor. In this case, the first gate electrode and the second gate electrode may be formed in a self-aligned manner.

A semiconductor memory according to a second aspect of the present invention comprises a second conductivity type first region and a second conductivity type second region formed on a first layer consisting of a first conductivity type semiconductor, a first gate electrode and a second gate electrode formed on the first layer between the first region and the second region, a second conductivity type third region formed on the first layer between the first gate electrode and the second gate electrode, a first insulator film formed between the first gate electrode and the third region and a second insulator film formed between the second gate electrode and the third region.

According to the present invention, therefore, the potential of the third region can be increased by simply applying a prescribed voltage to the second region for readily generating an electric field between the third region and the first gate electrode. Consequently, carriers permeating through a barrier of the insulator film located between the first gate electrode and the third region are accelerated by the electric field generated in the third region, to be injected into and stored in the second gate electrode beyond a barrier of the insulator film located between the third region and the second gate electrode. Therefore, data can be stored by presence/absence of carriers stored in the second gate electrode, and the semiconductor memory operates as a nonvolatile semiconductor memory.

In the aforementioned semiconductor memory according to the second aspect, the third region is preferably formed by a second conductivity type impurity region. Further, the third region may include a second conductivity type conductive film. In this case, the first gate electrode and the second gate electrode are preferably formed in a self-aligned manner.

It is preferable that the first gate electrode is formed through a first gate insulator film with respect to the first layer, and the second gate electrode is formed through a second gate insulator film with respect to the first layer.

It is preferable that the electrostatic capacitance between the second region and the second gate electrode is set larger than the electrostatic capacitance between the third region and the second gate electrode, and a voltage applied to the second region is transmitted to the second gate electrode by electrostatic coupling between the second region and the second gate electrode so that the third region connected with the second region through the first layer is substantially equalized in potential with the second region. Thus, the potential of the second gate electrode can be readily controlled by simply controlling the potential of the second region.

The width of the third region is preferably set substantially not more than the mean free path of carriers permeating through a barrier of the first insulator film located between the first gate electrode and the third region when having energy necessary for passing through a barrier of the second insulator film.

Thus, substantially all carriers permeating through the barrier of the first insulator film located between the first gate electrode and the third region acquire the energy for passing through the barrier of the second insulator film and turn into hot carriers, to be injected into the second gate electrode in an extremely high probability without remaining in the third region. Thus, the aforementioned functions of the present invention can be more reliably attained.

The second gate electrode is preferably formed on the side wall of the second region through a third insulator film. Thus, the areas of the overlapping portions of the second region and the second gate electrode can be readily increased for consequently increasing the electrostatic capacitance between the second region and the second gate electrode.

In this case, a groove may be formed in the first layer so that the second gate electrode is formed in the groove through the third insulator film on the side of the second region. Thus, the second gate electrode can be readily formed on the side wall of the second region.

In the aforementioned semiconductor memory according to the second aspect, it is preferable that a first conductivity type fourth region is formed on the second conductivity type second region, and the second region is formed on the overall region between the first layer and the fourth region.

Thus, the second region and the fourth region form a diode, so that a negative voltage can be readily applied to the second region and the fourth region having the diode structure without employing a complicated structure such as a conventional triple well structure. Therefore, positive and negative voltages can be employed for erase and write operations, and hence the maximum voltage generated in a step-up circuit can be substantially halved. Thus, voltage reduction can be attained and the scale of the step-up circuit can also be reduced, whereby higher integration can be attained. Further, the fourth region can be readily formed through a general process of implanting impurity ions, to result in no burden in the process.

There is a possibility that an excess current flows between the second region and the first layer when applying a negative voltage to the second region without employing the inventive diode structure, while an excess current may flow also between the first region and the second region (between a source and a drain) after erasing when either the first region or the second region is not floated after erasing. In this case, the excess current may disadvantageously exceed the allowable current quantity in the step-up circuit. According to the present invention, flow of such an excess current can be effectively prevented by employing the diode structure.

In this case, the fourth region is preferably capacitively coupled with the second gate electrode through a third insulator film. Thus, the voltage of the fourth region, which is directly applied from a power source through a wire, can be efficiently transmitted to the second gate electrode by capacitive coupling.

In the aforementioned semiconductor memory according to the second aspect, the first gate electrode preferably includes a side wall film formed in a self-aligned manner with respect to the third region. Thus, the first gate electrode can be formed with no problem of misalignment of a mask in a mask process.

In this case, the side wall film is preferably formed by depositing a first conductive film on the side surface of the third region and thereafter etching back the first conductive film. Thus, the gate length of the first gate electrode can be controlled through the thickness of the first conductive film, whereby the gate length can be reduced below the minimum limit size (minimum exposure size) in the mask process and controlled in higher precision than that in the mask process. Consequently, the first gate electrode can be more refined and dispersion of the gate length can be suppressed.

Preferably, the aforementioned semiconductor memory according to the second aspect further comprises a wire connected to the first region, and the wire is formed in a self-aligned manner with respect to the first region. Thus, the wire can be formed with no problem of misalignment of a mask in a mask process.

In this case, the wire is preferably formed by depositing a second conductive film on the side surface of the first gate electrode through a fourth insulator film and thereafter etching back the second conductive film. Thus, a wire insulated from the first gate electrode can be readily formed on the side portion of the first gate electrode in a self-aligned manner.

In the aforementioned semiconductor memory according to the second aspect, the third region is preferably formed by forming a side wall insulator film on the side surface of the first gate electrode in a self-aligned manner and thereafter etching back the first layer through the side wall insulator film. Thus, the third region can be formed in a self-aligned manner through the side wall insulator film formed in a self-aligned manner with no problem of misalignment of a mask in a mask process. Further, the third region can be formed in a small width below the minimum limit size in the mask process by controlling the thickness of the insulator film for forming the side wall insulator film. In addition, the width of the side wall insulator film can be precisely controlled by controlling the thickness of the insulator film for forming the side wall insulator film, whereby the width of the third region formed through the side wall insulator film can also be precisely controlled. Consequently, the third region can be more refined and dispersion of the width of the third region can be suppressed.

It is preferable that the first gate electrode and the second gate electrode are formed on the major surface of the first layer and the third region consisting of the conductive film is formed between the first gate electrode and the second gate electrode on the major surface of the first layer. When forming the first gate electrode, the second gate electrode and the third region on the first layer in the aforementioned manner, no grooves may be formed in the first layer for embedding the first gate electrode, the second gate electrode and the third region. Therefore, the structure can be simplified as compared with the case of forming such grooves, and the inventive semiconductor memory can consequently be implemented in a simple structure. Further, the first layer may not be formed with grooves and hence the structure having the first gate electrode, the third region and the second gate electrode can be formed through a simple process. In addition, no tunnel insulator film or the like may be formed on the side surface of the first layer damaged by etching for forming such grooves, whereby the quality of a tunnel insulator film is not deteriorated.

In this case, it is preferable that at least part of the third region is formed on the upper surface of the second gate electrode, and at least part of the first gate electrode is formed on the upper surface of the third region. Thus, a structure requiring no grooves in the first layer can be readily obtained by vertically arranging the first gate electrode, the second gate electrode and the third region.

The third region preferably includes a single-crystalline silicon film. Thus, the first insulator film can be formed by oxidizing the single-crystalline silicon film, whereby the first insulator film can be obtained with excellent film quality.

The third region may include a first side wall film consisting of a first conductive film formed in a self-aligned manner. Thus, the third region consisting of the first conductive film can be formed with no problem of misalignment of a mask in a mask process.

In this case, the first side wall film consisting of the first conductive film preferably includes a second side wall film consisting of a second conductive film formed on the side wall of the second gate electrode through the second insulator film and a third side wall film consisting of a third conductive film formed to be in contact with the side surface of the second side wall film and the surface of the first layer. Thus, the third side wall film can connect the third region and the first layer with each other thereby connecting the third region with the second region through the first layer. Thus, the aforementioned functions of the present invention can be more reliably attained.

In this case, it is preferable that the second side wall film is formed by depositing a second conductive film on the side surface of the second gate electrode through the second insulator film and thereafter etching back the second conductive film, and the third side wall film is formed by depositing a third conductive film to cover the first layer and the second side wall film and thereafter etching back the third conductive film, to be in contact with the side surface of the second side wall film and the surface of the first layer.

Thus, the thicknesses of the second side wall film and the third side wall film can be controlled by the thicknesses of the second conductive film and the third conductive film respectively, whereby the third region consisting of the second side wall film and the third side wall film can be formed in a small width below the minimum limit size (minimum exposure size) in the mask process. Further, the widths of the second and third side wall films can be precisely controlled by controlling the widths of the second and third conductive films, whereby the width of the third region consisting of the second and third side wall films can also be precisely controlled. Consequently, the third region can be more refined and dispersion of the width of the third region can be suppressed.

The second region preferably includes a fourth side wall film consisting of a fourth conductive film formed on the side surface of the second gate electrode in a self-aligned manner through a third insulator film. Thus, the fourth side wall film can increase the opposite areas of the second region and the second gate electrode. Therefore, the electrostatic capacitance between the second region and the second gate electrode can be readily increased. Consequently, the electrostatic capacitance between the second region and the second gate electrode can be readily increased beyond the electrostatic capacitance between the third region and the second gate electrode. Therefore, the potential of the second gate electrode can be readily controlled by varying the voltage applied to the second region.

In this case, the fourth side wall film preferably includes a fifth side wall film consisting of a fifth conductive film formed on the side wall of the second gate electrode through the third insulator film and a sixth side wall film consisting of a sixth conductive film formed to be in contact with the side surface of the fifth side wall film and the surface of the first layer. Thus, the sixth side wall film enables connection with the first layer, whereby the fifth and sixth side wall films can be readily connected with the second region consisting of the impurity region formed on the first layer. Consequently, the fifth and sixth side wall films can be readily employed as part of the second region.

The fourth side wall film defining the second region is preferably formed simultaneously with the first side wall film defining the third region. Thus, the fabrication process is not complicated also when providing the fourth side wall film.

It is preferable that the first region and the second region are so formed on the first layer as to expose the side surfaces thereof, the first gate electrode includes a seventh side wall film formed on the side surface of the first region in a self-aligned manner through a third insulator film, and the second gate electrode includes an eighth side wall film formed on the side surface of the second region in a self-aligned manner through a fourth insulator film.

Thus, the gate lengths of the first gate electrode and the second gate electrode can be controlled by the thickness of the deposited conductive film and hence the gate lengths can be reduced below the minimum limit size (minimum exposure size) in a mask process and controlled in higher precision than that in the mask process. Consequently, the first gate electrode and the second gate electrode can be more refined and dispersion of the gate lengths can be suppressed.

In this case, the seventh side wall film and the eighth side wall film are preferably simultaneously formed by depositing a seventh conductive film to cover the overall surface and thereafter etching back the seventh conductive film. Thus, the first gate electrode and the second gate electrode are simultaneously formed so that the fabrication process can be simplified.

The third region consisting of the conductive film may be formed in a self-aligned manner with respect to the first gate electrode and the second gate electrode. Thus, the third region can be formed in addition to the first gate electrode and the second gate electrode with no problem of misalignment of a mask in a mask process.

In this case, the third region is preferably formed to fill up a clearance between the seventh side wall film and the eighth side wall film. Thus, the third region can be readily formed in a self-aligned manner.

The thickness of the first insulator film is preferably smaller than the thickness of the second insulator film. Thus, a barrier of the first insulator film on the side of the first gate electrode for extracting carriers can be reduced in thickness for readily extracting the carriers from the first gate electrode. Further, the carriers stored in the second gate electrode can be held over a long period of time with the thick second insulator film on the side of the second gate electrode.

In this case, the first insulator film and the second insulator film are preferably formed by introducing an impurity suppressing oxidation into the first gate electrode while introducing an impurity prompting oxidation into the second gate electrode and thereafter oxidizing the first gate electrode and the second gate electrode respectively. Thus, the second insulator film and the first insulator film having a smaller thickness than the second insulator film can be simultaneously formed through a single oxidation step.

Preferably, a fifth insulator film is formed between the upper surface of the third region located between the first gate electrode and the second gate electrode and the upper side surfaces of the first gate electrode and the second gate electrode. Thus, the fifth insulator film can reliably insulate the first gate electrode and the second gate electrode from the third region.

A semiconductor memory according to a third aspect of the present invention comprises a second conductivity type region formed on a first layer consisting of a first conductivity type semiconductor, a gate electrode and a semiconductor region formed between the second conductivity type region and the gate electrode through insulator films respectively. Carriers are injected into the gate electrode from the second conductivity type region through the insulator films and the semiconductor region. The operation of injecting carriers includes not only injection of electrons but also extraction of electrons. In this case, the semiconductor region preferably consists of a second conductivity type impurity region formed on the first layer consisting of the first conductivity type semiconductor.

A semiconductor memory according to a fourth aspect of the present invention comprises a second conductivity type first region and a second conductivity type second region formed on a first layer consisting of a first conductivity type semiconductor, a first gate electrode formed on the first layer, a second gate electrode formed on the first layer between the first region and the second region, a second conductivity type third region formed between either the first gate electrode or the second region on the first layer and the second gate electrode, a first insulator film formed on one surface of the third region and a second insulator film formed on another surface of the third region.

According to the present invention, therefore, the potential of the third region can be increased by applying a prescribed voltage to the first gate electrode or the second region thereby readily generating an electric field between the third region and the first gate electrode or the second region. Consequently, carriers permeating through a barrier of the insulator film located between the first gate electrode or the second region and the third region are accelerated by the electric field generated in the third region to be injected into (written in) and stored in the second gate electrode through the barrier of the insulator film located between the third region and the second gate electrode. Therefore, data can be stored by presence/absence of the carriers stored in the second gate electrode, and the semiconductor memory operates as a nonvolatile semiconductor memory.

In this case, it is preferable that the semiconductor memory further comprises a third insulator film formed between the second gate electrode and the first region, the first gate electrode extends in a direction intersecting with the first region and the second region, the first insulator film is formed between the third region and the second region, and the second insulator film is formed between the third region and the second gate electrode. This structure is hereinafter referred to as a structure 1.

When employing the structure 1, the potential of the third region can be increased by applying a positive voltage to the first region and the first gate electrode and a negative voltage to the second region, thereby readily generating an electric field between the third region and the second region. Consequently, carriers permeating through a barrier of the first insulator film located between the second region and the third region are accelerated by the electric field generated in the third region to be injected into (written in) and stored in the second gate electrode through the barrier of the second insulator film located between the third region and the second gate electrode. Therefore, data can be stored by presence/absence of the carriers stored in the second gate electrode, and the semiconductor memory operates as a nonvolatile semiconductor memory. As to a memory cell subjected to erasing, a negative voltage is applied to the first gate electrode thereby extracting the electrons stored in the second gate electrode toward the first region for performing erasing.

According to this structure 1, write and erase operations can be controlled only with a positive/negative voltage applied to the first gate electrode. Thus, batch rewriting is enabled for simultaneously performing erasing and writing on about 1000 to 4000 memory cells connected to a plurality of first gate electrodes respectively, which are subjected to writing after batch erasing in the conventional flash memory.

In the aforementioned semiconductor memory according to the structure 1, the second gate electrode is preferably formed through a gate insulator film with respect to the first layer. Thus, the second gate electrode can be operated as the gate of a transistor in the write operation.

In the aforementioned semiconductor memory according to the structure 1, the electrostatic capacitance between the first gate electrode and the second gate electrode is set larger than the electrostatic capacitance of the remaining parts, and a voltage applied to the first gate electrode is transmitted to the second gate electrode by electrostatic coupling between the first gate electrode and the second gate electrode so that the third region connected with the first region through the first layer is substantially equalized in potential with the first region. Thus, the potential of the second gate electrode can be readily controlled by simply controlling the potential of the first gate electrode.

In the aforementioned semiconductor memory according to the structure 1, the third region and the second region are preferably connected through a diode such as a p-n junction diode or a Schottky barrier diode. Thus, the potential difference between the second region and the third region can be held when a negative voltage is applied to the second region and a positive or ground voltage is transmitted to the third region in writing. When a positive voltage is applied to the second region in reading, on the other hand, a current can be fed between the second region and the third region with no or low resistance.

In the aforementioned semiconductor memory according to the structure 1, the second region may include a material having a Schottky barrier with respect to silicon. Thus, potential difference is held between the third region and the second region due to the Schottky barrier, whereby electrons can be accelerated. Further, the Schottky barrier has a relatively low level of about 0.5 eV, and hence a large quantity of electrons can be extracted from the second region also when the potential difference between the second and third regions is small. In this case, the first insulator film preferably has the smallest possible thickness within the range stabilizing the interface between the second region and the third region. Thus, the thickness of a barrier formed by the first insulator film can be reduced by reducing the thickness of the first insulator film, so that the first insulator film can be prevented from influencing the Schottky barrier characteristic. At the same time, the first insulator film can readily stabilize the interface between the second region and the third region readily unstabilized due to generation of a large number of interfacial levels.

The thickness of the Schottky barrier can be precisely controlled with the impurity concentration of the third region. In this case, a potential gradient can be provided on the third region by lowering the impurity concentration of the third region. Thus, the electrons extracted from the second region can be gradually accelerated and supplied with energy for passing through a barrier of an oxide film immediately before injection into the second gate electrode. Thus, the electrons are transported to a portion close to the second gate electrode in a low energy state with a long mean free path and further accelerated to be injected into the second gate electrode, to hardly lose energy in the course of the process. Consequently, the electrons are injected into the second gate electrode with a high probability.

In this case, an insulator film located between the second region and the first layer preferably has a thickness capable of insulating the second region and the first layer from each other. Thus, also when the third region and the second region are reverse-biased through the Schottky barrier and the second region and the first layer are forward-biased, the insulator film can sufficiently insulate the second region and the first layer from each other.

In the aforementioned semiconductor memory according to the structure 1, the width of the third region is preferably set substantially not more than the mean free path of carriers permeating through a barrier of the first insulator film located between the second region and the third region when having energy necessary for passing through a barrier of the second insulator film. Thus, almost all carriers permeating through the barrier of the first insulator film located between the second region and the third region acquire energy for passing through the barrier of the second insulator film and turn into hot carriers, to be injected into the second gate electrode in an extremely high probability without remaining in the third region. Therefore, the aforementioned functions of the present invention can be more reliably attained.

A method of operating a semiconductor memory according to a fifth aspect of the present invention is a method of operating a semiconductor memory comprising a second conductivity type first region and a second conductivity type second region formed on a first layer consisting of a first conductivity type semiconductor, a first gate electrode formed on the first layer between the first region and the second region through a first gate insulator film with respect to the first layer, a second gate electrode formed on the first layer between the first region and the second region through a second gate insulator film with respect to the first layer, a second conductivity type third region formed on the first layer between the first gate electrode and the second gate electrode, a first insulator film formed between the first gate electrode and the third region and a second insulator film formed between the second gate electrode and the third region, for writing data by injecting hot carriers into the second gate electrode from the first gate electrode through the first insulator film, the third region and the second insulator film.

In an initial stage of a write operation, prescribed potential difference is caused between the first gate electrode and the third region and between the first gate electrode and the second gate electrode, for continuously performing writing. Hot carriers are continuously injected into the second gate electrode as the write operation progresses, so that the potential of the second gate electrode gradually lowers from the initial value. The potential of the third region also lowers along with reduction of the potential of the second gate electrode, so that the potential difference between the first gate electrode and the third region finally lowers below a prescribed value. Thus, the hot carriers contained in the first gate electrode cannot permeate through the barrier of the second insulator film even if the hot carriers contained in the first gate electrode can permeate through the barrier of the first insulator film, to automatically terminate the write operation.

In the aforementioned method of operating a semiconductor device according to the fifth aspect, data of at least three values may be written by varying the initial field intensity between the first gate electrode and the third region thereby controlling the quantity of the hot carriers injected into the second gate electrode. Thus, multivalued data can be stored in a single semiconductor memory.

It is preferable to erase data by extracting the hot carriers from the second gate electrode to the third region through the second insulator film.

The electrostatic capacitance between the second region and the second gate electrode is preferably set larger than the electrostatic capacitance between the third region and the second gate electrode, and a voltage applied to the second region is preferably transmitted to the second gate electrode by electrostatic coupling between the second region and the second gate electrode so that the third region connected with the second region through the first layer is substantially equalized in potential with the second region. Thus, the potential of the second gate electrode can be readily controlled by simply controlling the potential of the second region.

The width of the third region is preferably set substantially not more than the mean free path of carriers permeating through a barrier of the first insulator film located between the first gate electrode and the third region when having energy necessary for passing through a barrier of the second insulator film.

Thus, almost all carriers permeating through the barrier of the first insulator film located between the first gate electrode and the third region acquire energy for passing through the barrier of the second insulator film and turn into hot carriers, to be injected into the second gate electrode in an extremely high probability without remaining in the third region. Therefore, the aforementioned functions of the present invention can be more reliably attained.

When erasing data, it is preferable to temporarily set the voltage of the second region coupled with the second gate electrode to a prescribed value and thereafter hold the second region in an open state.

In an initial stage of an erase operation, prescribed potential difference is caused between the second gate electrode and the third region, for continuously performing erasing. The potential of the second gate electrode gradually rises as the erase operation progresses. When the potential difference between the second gate electrode and the third region is less than a prescribed value, electrons contained in the second gate electrode cannot permeate through the barrier of the second insulator film, not to further perform the erase operation. Thus, the erase operation is automatically terminated.

A method of operating a semiconductor memory according to a sixth aspect of the present invention is a method of operating a semiconductor memory comprising a second conductivity type first region and a second conductivity type second region formed on a first layer consisting of a first conductivity type semiconductor, a first gate electrode formed on the first layer, a second gate electrode formed on the first layer between the first region and the second region through a gate insulator film with respect to the first layer, a second conductivity type third region formed between either the first gate electrode or the second region on the first layer and the second gate electrode, a first insulator film formed on one surface of the third region and a second insulator film formed on another surface of the third region, for writing data by injecting hot carriers from either the first gate electrode or the second region into the second gate electrode through the first insulator film, the third region and the second insulator film.

In an initial stage of a write operation, prescribed potential difference is caused between the first gate electrode or the second region and the third region and between the first gate electrode or the second region and the second gate electrode, for continuously performing writing. Hot carriers are continuously injected into the second gate electrode as the write operation progresses, so that the potential of the second gate electrode gradually lowers from the initial value. The potential of the third region also lowers along with reduction of the potential of the second gate electrode, so that the potential difference between the first gate electrode or the second region and the third region finally lowers below a prescribed value. Thus, the hot carriers contained in the first gate electrode or the second region cannot permeate through the barrier of the second insulator film even if the hot carriers contained in the first gate electrode or the second region can permeate through the barrier of the first insulator film, to automatically terminate the write operation.

In the method of operating a semiconductor memory according to the sixth aspect of the present invention, it is preferable to erase data by extracting the hot carriers from the second gate electrode to the first region through a third insulator film.

In the aforementioned method of operating a semiconductor memory according to the sixth aspect, the electrostatic capacitance between the first gate electrode and the second gate electrode is set larger than the electrostatic capacitance of the remaining parts, and a voltage applied to the first gate electrode is transmitted to the second gate electrode by electrostatic coupling between the first gate electrode and the second gate electrode so that the third region connected with the first region through said first layer is substantially equalized in potential with the first region. Thus, the potential of the second gate electrode can be readily controlled by simply controlling the potential of the first gate electrode.

In the aforementioned method of operating a semiconductor memory according to the sixth aspect, the width of the third region is preferably set substantially not more than the mean free path of carriers permeating through a barrier of the first insulator film located between the second region and the third region when having energy necessary for passing through a barrier of the second insulator film.

Thus, almost all carriers permeating through the barrier of the first insulator film located between the second region and the third region acquire energy for passing through the barrier of the second insulator film and turn into hot carriers, to be injected into the second gate electrode in an extremely high probability without remaining in the third region. Therefore, the aforementioned functions of the present invention can be more reliably attained.

In the aforementioned method of operating a semiconductor memory according to the sixth aspect, it is preferable to apply a positive voltage and a negative voltage to the first region and the second region respectively while applying a negative voltage and a positive voltage to the first gate electrode of a memory cell subjected to erasing and the first gate electrode of a memory cell subjected to writing respectively when rewriting data thereby simultaneously performing erasing and writing on a plurality of memory cells connected with a plurality of first gate electrodes respectively and holding data as such as to a memory cell requiring no data change.

Thus, batch rewriting is enabled for simultaneously performing erasing and writing on 1000 to 4000 memory cells connected to a plurality of first gate electrodes respectively, which are subjected to batch erasing and thereafter to writing in the conventional flash memory. Further, a memory cell requiring no rewriting automatically holds data as such without erasing the data and newly rewriting the same data, whereby stress on a tunnel insulator film reduces. Thus, the life of the tunnel insulator film is increased and the number of rewriting times can consequently be increased.

In the aforementioned method of operating a semiconductor memory according to the sixth aspect, the voltage of the first gate electrode coupled with the second gate electrode may be temporarily set to a prescribed negative potential for thereafter returning the potential of the first gate electrode to a potential set as a ground potential or a neutral potential when erasing data.

Thus, weak writing is caused so that overerasing can be corrected. When overerasing is performed until the second gate electrode reaches a positive potential exceeding the threshold voltage and the first gate electrode is returned to a potential set as a ground potential (0 V) or a neutral potential, the potential difference between the second gate electrode and the first region first reduces to terminate erasing. A transistor located under the second gate electrode is turned on. Thus, the potential of the third region increases. In this case, a negative voltage is applied to the second region to cause potential difference between the third region and the second region, and electrons are consequently injected from the second region into the second gate electrode for performing weak writing. Thus, overerasing can be corrected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
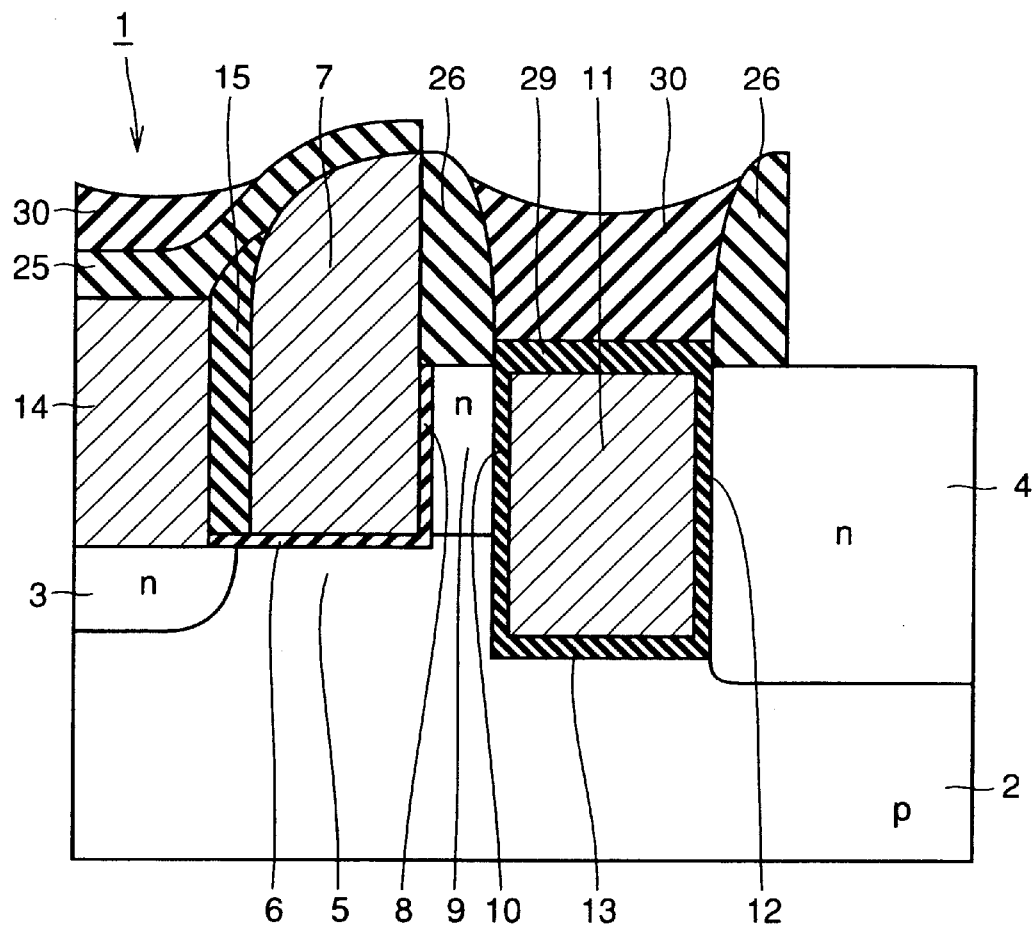
FIG. 1 is a partially fragmented sectional view of a memory cell according to a first embodiment of the present invention.

Embodiments of the present invention are now described with reference to the drawings.

(First Embodiment)

The structure of a memory cell 1 according to a first embodiment of the present invention is now described with reference to FIG. 1.

In the memory cell 1 according to the first embodiment, an n-type source region 3 and an n-type drain region 4 are formed on the surface of a p-type single-crystalline silicon substrate 2 at a prescribed space. A first gate insulator film 6 of a silicon oxide film, a control gate electrode 7 of a doped polysilicon film, a first tunnel insulator film 8 of a silicon oxide film, an n-type impurity region 9, a second tunnel insulator film 10 of a silicon oxide film, a floating gate electrode 11 of a doped polysilicon film and a third insulator film 12 of a silicon oxide film are formed in this order on a channel region 5 located between the source region 3 and the drain region 4 on the surface of the substrate 2. The second tunnel insulator film 10 and a second gate insulator film 13 of a silicon oxide film isolate the floating gate electrode 11 and the channel region 5 from each other.

The floating gate electrode 11 is embedded in a trench formed in the p-type single-crystalline silicon substrate 2, and formed on the side walls of the drain region 4 through the third insulator film 12.

A source electrode 14 of a doped polysilicon film is connected to the source region 3. A fourth insulator film 15 of a silicon oxide film isolates the source electrode 14 and the control gate electrode 7 from each other.

The thicknesses of the aforementioned members are set as follows:

the thickness of the first gate insulator film 6: 3 to 4 nm the thickness of the first tunnel insulator film 8: 3 to 4 nm the thickness of the second tunnel insulator film 10: 8 to 10 nm the thickness of the third insulator film 12: 8 to 10 nm the thickness of the second gate insulator film 13: 8 to 10 nm the thickness of the fourth insulator film 15: 30 to 40 nm the width of the n-type impurity region 9 (the distance between the first tunnel insulator film 8 and the second tunnel insulator film 10): 20 to 40 nm (the width of the n-type impurity region 9 is most preferably 20 to 30 nm, so that electrons having energy of 3 to 5 eV used for writing reach the floating gate electrode 11 by at least several %)

The area of the third insulator film 12 located between the drain region 4 and the floating gate electrode 11 is larger than that of the second tunnel insulator film 10 located between the n-type impurity region 9 and the floating gate electrode 11. In the memory cell 1 according to this embodiment, therefore, the electrostatic capacitance between the drain region 4 and the floating gate electrode 11 is larger than that between the n-type impurity region 9 and the floating gate electrode 11. Thus, the coupling ratio between the n-type impurity region 9 and the floating gate electrode 11 exceeds that between the drain region 4 and the floating gate electrode 11. Consequently, the potential of the drain region 4 is readily transmitted to the floating gate electrode 11.

Figure 2:
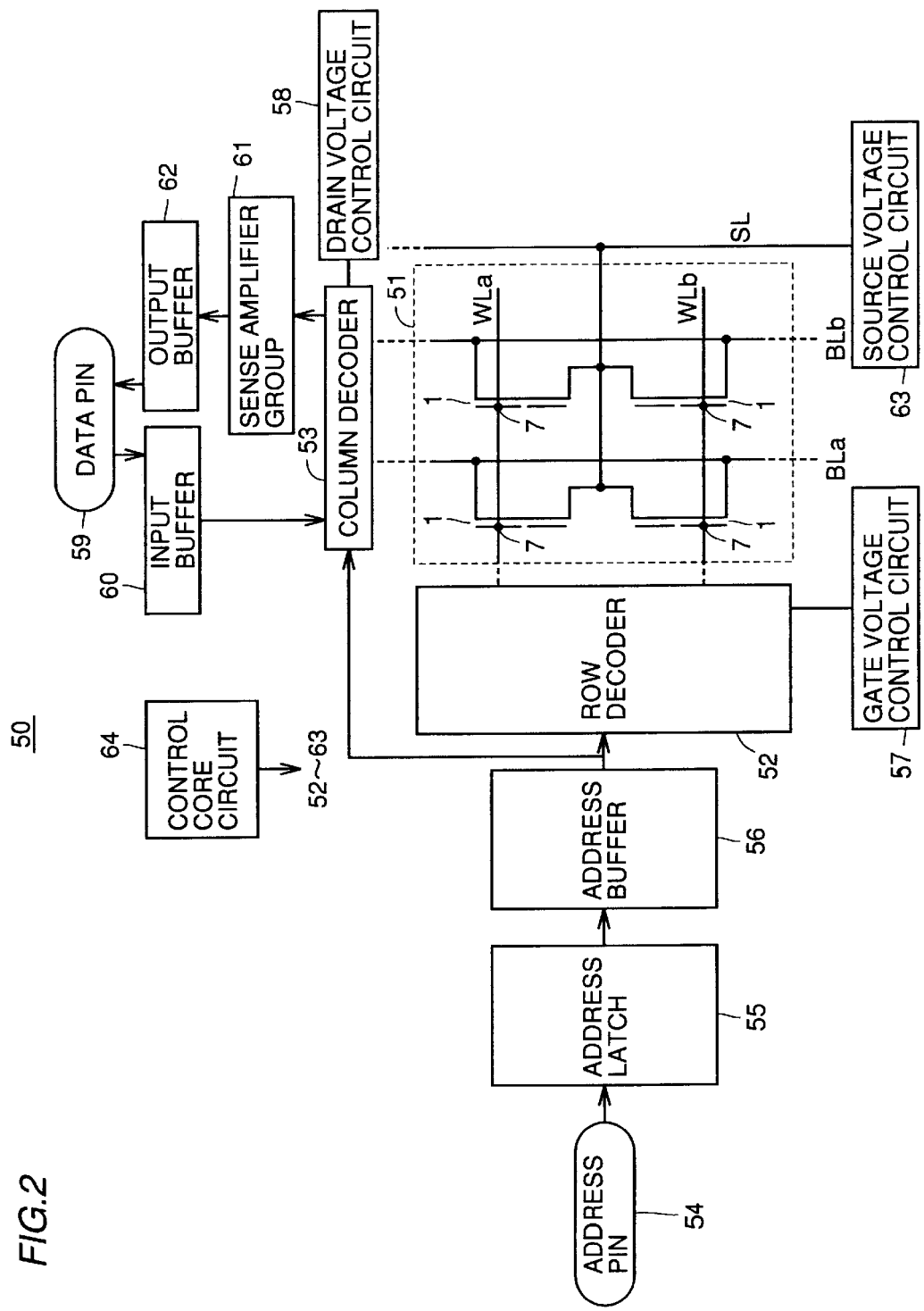
FIG. 2 is a block circuit diagram of a semiconductor memory according to the first embodiment of the present invention.

FIG. 2 illustrates the overall structure of a nonvolatile semiconductor memory 50 employing the memory cell 1.

As shown in FIG. 2, a memory cell array 51 is formed by arranging a plurality of memory cells 1 in the form of a matrix (FIG. 2 shows only four memory cells 1, in order to simplify the illustration).

In the memory cells 1 arranged in a row direction, the control gate electrodes 7 are connected to common word lines $WL_1$ to $WL_n$.

In the memory cells 1 arranged in a column direction, the drain regions 4 are connected to common bit lines $BL_1$ to $BL_n$, and the source electrodes 14 are connected to a common source line SL.

The word lines $WL_1$ to $WL_n$ are connected to a row decoder 52, and the bit lines $BL_1$ to $BL_n$ are connected to a column decoder 53.

Externally specified row and column addresses are input in an address pin 54. The address pin 54 transfers the row and column addresses to an address latch 55. In the row and column addresses latched in the address latch 55, the row address is transferred to the row decoder 52 through an address buffer 56, and the column address is transferred to the column decoder 53 through the address buffer 56.

The row decoder 52 selects a word line corresponding to the row address latched in the address latch 55 from the word lines $WL_1$ to $WL_n$ and controls the potentials of the word lines $WL_1$ to $WL_n$ in correspondence to respective operation modes described later on the basis of a signal from a gate voltage control circuit 57.

The column decoder 53 selects a bit line corresponding to the column address latched in the address latch 55 from the bit lines $BL_1$ to $BL_n$ and controls the potentials of the bit lines $BL_1$ to $BL_n$ in correspondence to the respective operation modes described later in response to a signal from a drain voltage control circuit 58.

Externally specified data is input in a data pin 59. The data pin 59 transfers the data to the column decoder 53 through an input buffer 60. The column decoder 53 controls the potentials of the bit lines $BL_1$ to $BL_n$ in correspondence to the data as described later.

Data read from an arbitrary memory cell 1 is transferred from the bit lines $BL_1$ to $BL_n$ to a sense amplifier group 61 through the column decoder 53. The sense amplifier group 61 is formed by current sense amplifiers. The data determined in the sense amplifier group 61 is output from an output buffer 62 through the data pin 59.

A source voltage control circuit 63 controls the potential of the source line SL in correspondence to the operation modes described later.

A control core circuit 54 controls operations of the aforementioned circuits 52 to 63.

Respective operations (write, erase and read operations) of the memory cell 1 having the aforementioned structure are now described. A source voltage Vs is applied to the source region 3 (the source electrode 14) through the source line SL. A drain voltage Vd is applied to the drain region 4 through the bit lines $BL_1$ to $BL_n$. A control gate voltage Vcg is applied to the control gate electrode 7 through the word lines $WL_1$ to $WL_n$. A substrate voltage Vsub is applied to the substrate 2.

(Write Operation)

Before performing the write operation, the floating gate electrode 11 is in an erased state (where electrons are extracted), and the floating gate electrode 11 in the erased state keeps a potential of about 2 V in the first embodiment. In the first embodiment, it is assumed that the threshold voltages Vt of transistors having the floating gate electrode 11 and the control gate electrode 7 as gates respectively are 0.5 V.

In the write operation, the source voltage Vs is set to 0 V, the drain voltage Vd is set to 3 V, the control gate voltage Vcg is set to −3 V, and the substrate voltage (well voltage when the memory cell 1 is formed in a p-type well formed in the silicon substrate 2: hereinafter referred to as "well voltage") Vsub is set to 0 V as the operating voltages of the memory cell 1.

The drain region 4 and the floating gate electrode 11 are strongly electrostatically coupled with each other as described above, and hence about ⅔ of the drain voltage (3 V) is added to the potential (about 2 V) in the erased state of the floating gate electrode 11, so that the potential of the floating gate electrode 11 consequently increases to about 4 V. Thus, the transistor having the floating gate electrode 11 as the gate is turned on and the potential of the n-type impurity region 9 is substantially equalized with that of the drain region 4.

In other words, the potential of the n-type impurity region 9 reaches 3 V (voltage level-shifted from the potential of the floating gate electrode 11 by the aforementioned threshold voltage Vt with an upper limit of the drain voltage Vd) and a high electric field is generated between the n-type impurity region 9 and the control gate electrode 7. Consequently, a Fowler-Nordheim tunnel current (hereinafter referred to as an FN tunnel current) flows and electrons move from the control gate electrode 7 to the n-type impurity region 9. Electrons permeating through (tunneling) the barrier of the first tunnel insulator film 8 located between the control gate electrode 7 and the n-type impurity region 9 are accelerated by the high electric field generated between the n-type impurity region 9 and the control gate electrode 7, and injected into the floating gate electrode 11 through the second tunnel insulator film 10. Consequently, the floating gate electrode 11 stores the electrons for writing data.

The electrons require energy of 3.2 eV for passing through the barrier of the second tunnel insulator film 10 of a silicon oxide film, and potential difference necessary for acquiring the energy is 3.2 V. Therefore, the aforementioned operating voltages in writing are so set as to cause potential difference of at least 3.2 V between the control gate electrode 7 and the n-type impurity region 9 and between the control gate electrode 7 and the floating gate electrode 11.

When setting the drain voltage Vd to 3 V and the control gate voltage Vcg to −3V, the voltage of the floating gate electrode 11 reaches about 4 V and the potential of the n-type impurity region 9 reaches 3 V due to the electrostatic coupling between the drain region 4 and the floating gate electrode 11, as hereinabove described. Therefore, potential difference of 6 V is initially caused between the control gate electrode 7 and the n-type impurity region 9, and potential difference of about 7 V is initially caused between the control gate electrode 7 and the floating gate electrode 11. When the energy of the electrons is about 3.2 eV, the mean free path (the mean value of the moving distances of the electrons) is about 30 to 40 nm. The width of the n-type impurity region 9 is set to 30 nm, which is smaller than the mean free path. Therefore, the electrons permeating through the barrier of the first tunnel insulator film 8 located between the control gate electrode 7 and the n-type impurity region 9 are accelerated to at least 3.2 eV in a short distance not more than the mean free path (=about 30 to 40 nm).

Therefore, almost all electrons permeating through the barrier of the first tunnel insulator film 8 acquire energy for passing through the barrier (=3.2 eV) of the second tunnel insulator film 10 and turn into hot electrons, which are injected into the floating gate electrode 11 in an extremely high probability without remaining in the n-type impurity region 9.

The energy of the electrons and the probability of passing through the barrier of the first insulator film 8 can be adjusted by the source voltage Vs, the drain voltage Vd and the control gate voltage Vcg. Therefore, the hot electrons can be injected into the floating gate electrode 11 when acquiring energy slightly exceeding the barrier of the second tunnel insulator film 10.

As hereinabove described, the potential difference of at least 3.2 V is caused between the control gate electrode 7 and the n-type impurity region 9 and between the control gate electrode 7 and the floating gate electrode 11 in the initial stage of the write operation, for continuously performing writing (injecting electrons into the floating gate electrode 11). The electrons are continuously injected into the floating gate electrode 11 with progress of the write operation, and hence the potential of the floating gate electrode 11 gradually lowers from 4 V. As hereinabove described, the potential of the n-type impurity region 9 reaches a value level-shifted from the potential of the floating gate electrode 11 by the aforementioned threshold voltage Vt with the upper limit of the drain voltage Vd. Therefore, the potential of the n-type impurity region 9 also gradually lowers along with reduction of the potential of the floating gate electrode 11, and the potential difference between the control gate electrode 7 and the n-type impurity region 9 finally reaches a value less than 3.2 V. Thus, the electrons contained in the control gate electrode 7 cannot permeate through the barrier of the second tunnel insulator film 10 even if the electrons contained in the control gate electrode 7 can permeate through the barrier of the first tunnel insulator film 8. Thereby, the write operation is not further performed.

According to this embodiment, the write operation is automatically terminated by potential change of the floating gate electrode 11, whereby no circuit is separately required for detecting termination of the write operation. Thus, simplification of the structure in a peripheral circuit, reduction of the area and reduction of power consumption can be implemented. Particularly in this embodiment, the write operation is not terminated in a constant write time but automatically terminated by the potential change of the floating gate electrode 11, whereby dispersion of the write levels can be effectively prevented between the memory cells 1. Consequently, the write levels of the memory cells 1 can be substantially uniformalized.

(Erase Operation)

In the erase operation, the source voltage Vs is set to 8 V, the drain voltage Vd is set to 0 V, the control gate voltage Vcg is set to 9 V and the substrate voltage (well voltage) Vsub is set to 0 V as the operating voltages of the memory cell 1. In this case, the drain region 4 and the floating gate electrode 11 are strongly electrostatically coupled with each other and hence the potential of the floating gate electrode 11 substantially reaches 0 V.

On the other hand, the potential of the control gate electrode 7 is 9 V and hence the transistor having the control gate electrode 7 as the gate is turned on. Thus, the potential of the n-type impurity region 9 is substantially equalized with that of the source region 3. In other words, the potential of the n-type impurity region 9 reaches 8 V (voltage level-shifted from the potential of the control gate electrode 7 by the aforementioned threshold voltage Vt with an upper limit of the source voltage Vs). Thus, a high electric field of about 10 MV is generated in the second tunnel insulator film 10 located between the n-type impurity region 9 and the floating gate electrode 11. Consequently, an FN tunnel current flows and electrons are extracted from the floating gate electrode 11 to the n-type impurity region 9, for erasing data.

(Read Operation)

In the read operation, the source voltage Vs is set to 0 V, the drain voltage Vd is set to 3 V, the control gate voltage Vcg is set to 3 V and the substrate voltage (well voltage) Vsub is set to 0 V as the operating voltages of the memory cell 1.

When the floating gate electrode 11 stores no electrons (erased state), the floating gate electrode 11 is positively charged (the floating gate electrode 11 has a potential of 2 V in the first embodiment) and hence the channel region 5 located under the floating gate electrode 11 enters an ON state. When the floating gate electrode 11 stores electrons (write state), on the other hand, the floating gate electrode 11 is negatively charged and hence the channel region 5 located under the floating gate electrode 11 enters an OFF state.

When the channel region 5 is in an ON state, a current more readily flows between the source region 3 and the drain electrode 4 as compared with an OFF state. Therefore, whether or not the floating gate electrode 11 stores electrons can be determined by detecting the current (cell current) flowing between the source region 3 and the drain electrode 4. Thus, data stored in the memory cell 1 can be read.

A similar read operation can be performed also when reversing the relation between the potentials of the source voltage Vs and the drain voltage Vd.

According to the first embodiment, the following functions/effects can be attained:

(1) The structure of the memory cell 1 is absolutely different from that of a conventional stacked gate or split gate memory cell. More specifically, the n-type impurity region 9 is provided between the control gate electrode 7 and the floating gate electrode 11 through insulator films (the first and second tunnel insulator films 8 and 10) in the memory cell 1. In the write operation, a high electric field is generated between the n-type impurity region 9 and the control gate electrode 7 thereby moving electrons from the control gate electrode 7 to the n-type impurity region 9 while accelerating the electrons in the first tunnel insulator film 8 and the n-type impurity region 9 and injecting the same into the floating gate electrode 11.

Therefore, the electrons can be efficiently injected from the control gate electrode 7 into the floating gate electrode 11 thereby improving the write characteristics (according to an experiment made by the inventor, the efficiency of injecting the electrons from the control gate electrode 7 into the floating gate electrode 11 can be improved to 10 to 100 times that in the conventional stacked gate or split gate memory cell of a channel hot electron write system). Consequently, writing can be performed in a shorter time as compared with the prior art, for increasing the speed of the write operation. Further, the write voltage can be reduced for contributing to reduction of power consumption in the semiconductor memory.

(2) The potential of the n-type impurity region 9 reaches a value identical or close to that of the drain region 4 in the write operation and a value identical or close to that of the source region 3 in the erase operation.

Therefore, no circuit is required for controlling the potential of the n-type impurity region 9, whereby the layout area as well as the power consumption can be reduced.

In the write operation, further, the operating voltages (the source voltage Vs, the drain voltage Vd and the control gate voltage Vcg) of the memory cell 1 can be set within the range of ±3 V due to the synergistic effect of the items (1) and (2). Thus, the operating voltages of the memory cell 1 can be reduced to fractions of the operating voltages of the conventional stacked gate or split gate memory cell. Consequently, power consumption in the write operation can be reduced.

(3) In the erase operation, the potential of the n-type impurity region 9 can be controlled regardless of the potential of the floating gate electrode 11 by controlling the source voltage Vs and the control gate voltage Vcg.

Therefore, no circuit is required for controlling the potential of the n-type impurity region 9, whereby the layout area as well as power consumption can be reduced. In the erase operation, further, the operating voltages of the memory cell 1 can be set not more than 9 V.

(4) The width of the n-type impurity region 9 is set not more than the mean free path (30 to 40 nm) of electrons in the write operation, whereby almost all electrons permeating through the barrier of the first tunnel insulator film 8 acquire energy for passing through the barrier (=3.2 eV) of the second tunnel insulator film 10 to turn into hot electrons and are injected into the floating gate electrode 11 in a high probability without remaining in the n-type impurity region 9. Consequently, high write efficiency can be attained.

(5) The write operation is automatically terminated and hence no circuit is separately required for detecting termination of the write operation. Thus, the structure of the peripheral circuit can be simplified and the area as well as power consumption can be reduced. When writing data in a plurality of memory cells 1, the write operation is not forcibly terminated after a lapse of a constant write time regardless of the write level of each memory cell 1 but is automatically terminated by potential change of the floating gate electrode 11 of each memory cell 1, whereby the write levels of the memory cells 1 are hardly dispersed. Consequently, the write levels of the memory cells 1 can be substantially uniformalized.

(6) The electrostatic capacitance between the drain region 4 and the floating gate electrode 11 is larger than that between the n-type impurity region 9 and the floating gate electrode 11.

Therefore, the potential of the floating gate electrode 11 can be readily controlled by changing the drain voltage Vd.

(7) The floating gate electrode 11 is embedded in a trench formed in the p-type single-crystalline silicon substrate 2 and formed on the side wall of the drain region 4 through the third insulator film 12, whereby the areas of the overlapping portions of the drain region 4 and the floating gate electrode 11 can be readily increased for readily increasing the electrostatic capacitance between the drain region 4 and the floating gate electrode 11.

A method of fabricating the memory cell 1 according to the first embodiment is now described with reference to FIGS. 3 to 11.

Step 1 (see FIG. 3): Field isolation films 20 of silicon oxide films are formed on the p-type single-crystalline silicon substrate 2 by trench isolation or a LOCOS method. Then, ions for threshold voltage adjustment are implanted into the surface of the substrate 2. Then, silicon oxide films 21 are formed on the surface of the substrate 2 and thereafter worked into the form of transversely arranged stripes through photolithography and etching. The p-type single-crystalline silicon substrate 2 corresponds to the "first layer" in the present invention.

Figure 3:
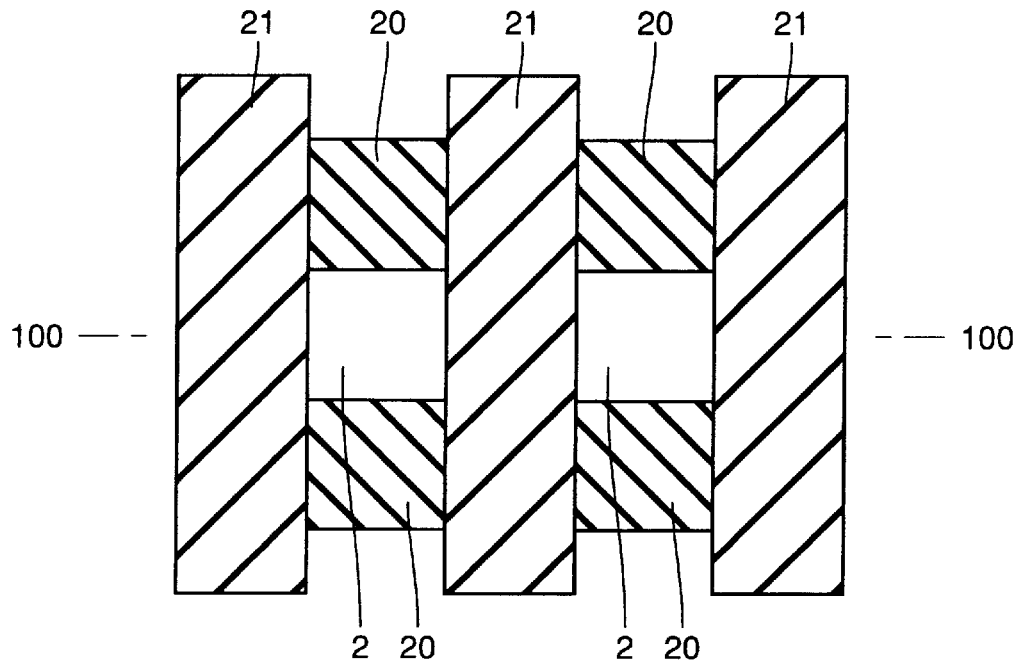
FIG. 3 is a step plan view for illustrating a method of fabricating the memory cell according to the first embodiment.
Figure 4:
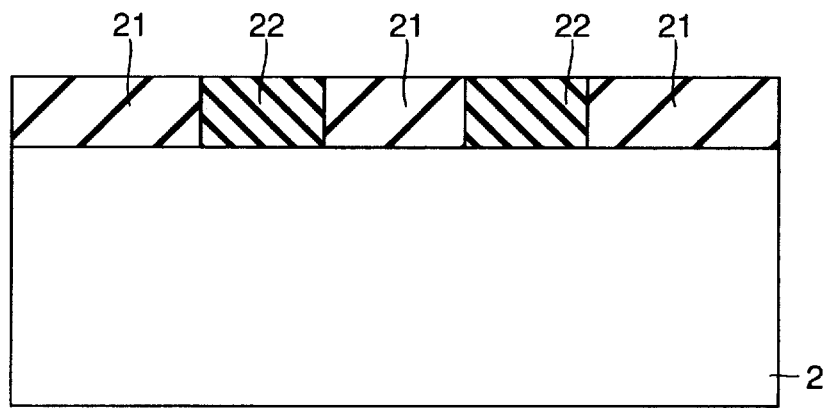
FIGS. 4 to 11 are sectional views showing steps for illustrating the method of fabricating the memory cell according to the first embodiment.
Figure 5:
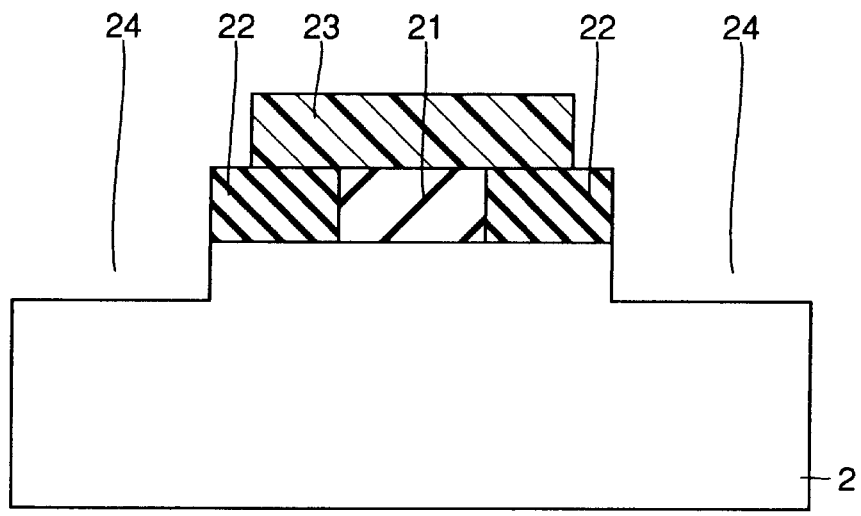
Figure 6:
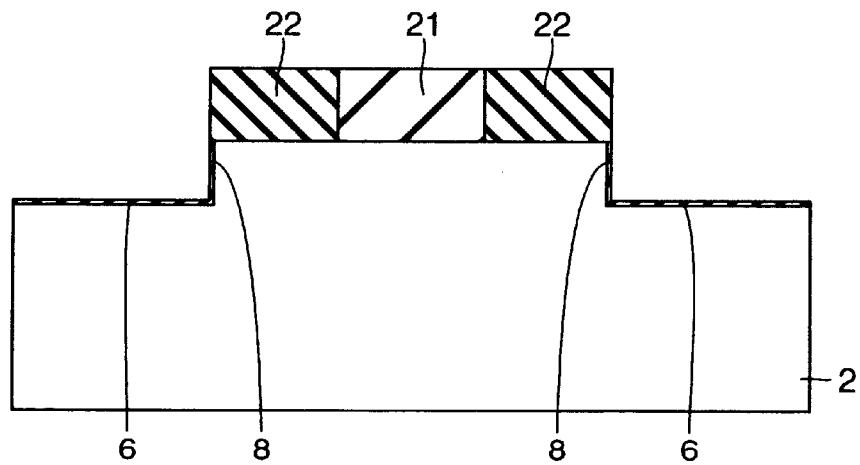
Figure 7:
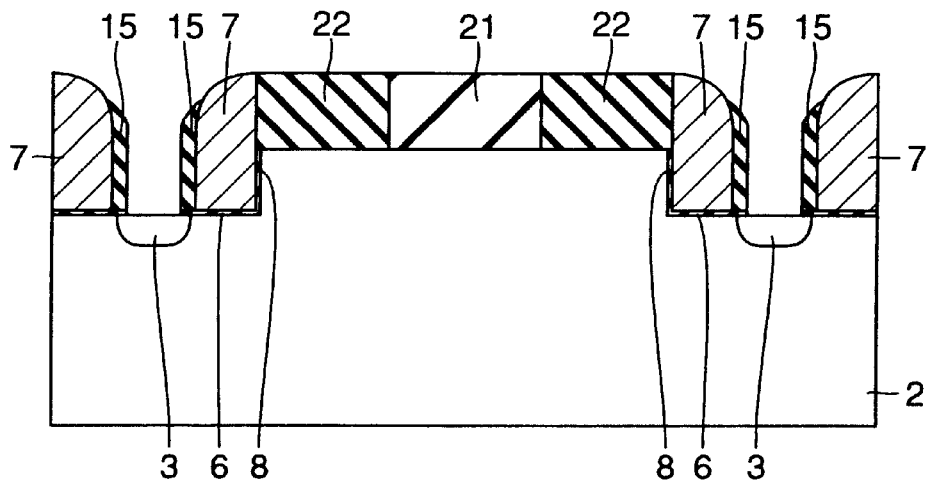
Figure 8:
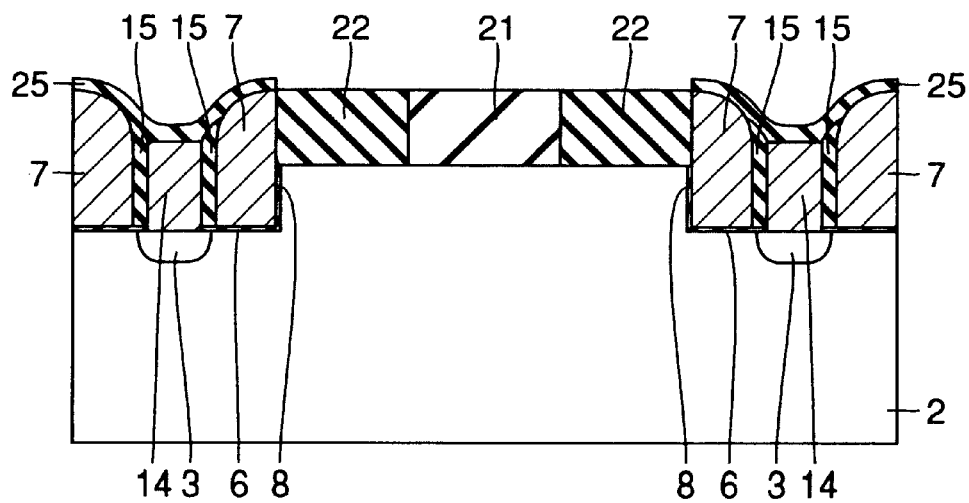
Figure 9:
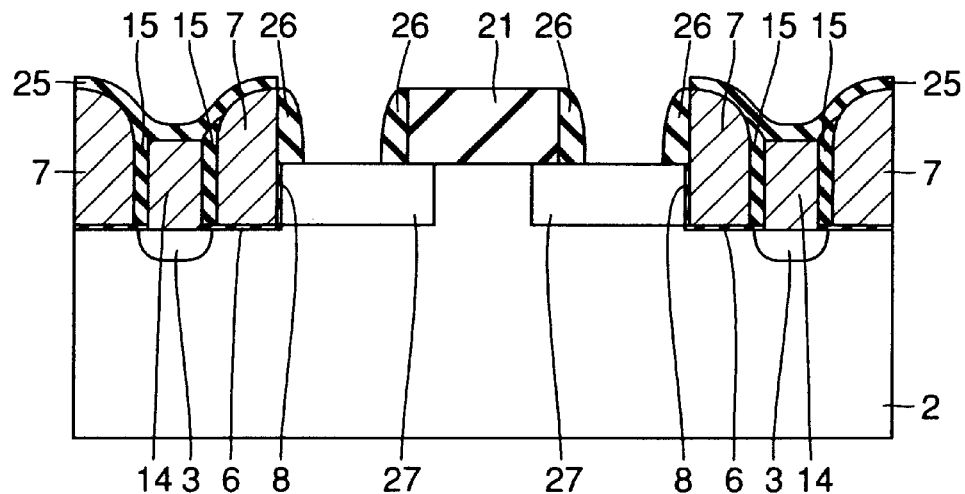

The subsequent steps are described with reference to figures corresponding to a section taken along the line 100—100 in FIG. 3.

Step 2 (see FIG. 4): A silicon nitride film 22 is formed on the overall surface of the substrate 2 and thereafter entirely anisotropically etched back, to be embedded between the silicon oxide films 21.

Every other silicon oxide film 21 is masked with a resist film 23 for thereafter removing the silicon oxide films 21 not covered with the resist film 23. Further, the field isolation film 20 not covered with the resist film 23 and the silicon nitride films 22 are dug down by overetching.

Thereafter etching gas is switched for digging down parts of the substrate 2 not covered with the resist film 23 and the silicon nitride films 22 and forming trenches 24 in these portions.

Step 4 (see FIG. 6): The resist film 23 is removed for thereafter forming thermal oxide films of about 3 nm in thickness in the trenches 24 by thermal oxidation. In each thermal oxide film, the portion formed on the bottom of the trench 24 defines the first gate insulator film 6 and the portion formed on the side wall of the trench 24 defines the first tunnel insulator film 8. The first tunnel insulator film 8 corresponds to the "first insulator film" in the present invention.

Step 5 (see FIG. 7): A doped polysilicon film doped with an n-type impurity such as phosphorus is formed on the overall surface of the substrate 2 including the trenches 24 and thereafter entirely anisotropically etched back for forming the control gate electrodes 7 of side wall spacers over the trenches 24 and the silicon nitride films 22. Thus, the control gate electrodes 7 can be formed in a self-aligned manner with respect to the silicon nitride films 22. Therefore, the control gate electrodes 7 can be formed with no problem of misalignment of a mask in a mask process.

The gate length of the control gate electrodes 7, which can be controlled by the thickness of the doped polysilicon film, can be reduced below the minimum limit size (minimum exposure size) in the mask process and more precisely controlled than the mask process. Consequently, the control gate electrodes 7 can be further refined and prevented from dispersion of the gate length. Each control gate electrode 7 corresponds to the "first gate electrode" in the present invention.

The doped polysilicon film can be formed by any of the following methods:

Method 1: A polysilicon film is formed by LPCVD with raw material gas mixed with gas containing an impurity.

Method 2: A non-doped polysilicon film is formed by LPCVD and thereafter an impurity diffusion source layer of $POCl_3$ or the like is formed on the polysilicon film for diffusing an impurity into the polysilicon film from the impurity diffusion source layer.

Method 3: A non-doped polysilicon film is formed by LPCVD for thereafter implanting impurity ions into the same.

Further, phosphorus ions are implanted into the bottom portions of the trenches 24 through the control gate electrodes 7 serving as masks and thereafter heat treatment is performed for forming the source regions 3. Thereafter a silicon oxide film is formed on the overall surface of the substrate 2 including the trenches 24. The overall surface of the silicon oxide film is anisotropically etched back thereby forming the fourth insulator films 15 of side wall spacers of 30 nm in width on the side walls of the control gate electrodes 7. Each source region 3 corresponds to the "first region" in the present invention.

Step 6 (see FIG. 8): A doped polysilicon film doped with an n-type impurity such as phosphorus is formed on the overall surface of the substrate 2 including the trenches 24. The overall surface of the doped polysilicon film is anisotropically etched back thereby forming the source electrodes 14 connected with the source regions 3 in the trenches 24. Thus, the source electrodes 14 can be formed in a self-aligned manner in the regions enclosed with the control gate electrodes 7 formed in a self-aligned manner. Therefore, the source electrodes 14 can be formed with no problem of misalignment of a mask in a mask process. Each source electrode 14 corresponds to the "wire" of the present invention. The doped polysilicon film is formed by any of the methods described above with reference to the step 5.

Then, thermal oxide films 25 of 30 to 50 nm in thickness are formed on the upper surfaces of the control gate electrodes 7 and the source electrodes 14 by thermal oxidation. The thermal oxide films 25 and the fourth insulator films 15 electrically insulate the control gate electrodes 7 and the source electrodes 14 from each other.

Step 7 (see FIG. 9): The silicon nitride films 22 are removed and thereafter another silicon nitride film is formed on the overall surface of the substrate 2. The overall surface of the silicon nitride film is anisotropically etched back thereby forming side wall spacers 26 on the side walls of the silicon oxide film 21 and the control gate electrodes 7.

Further, phosphorus ions are implanted into the exposed portions of the substrate 2 through the side wall spacers 26 serving as masks and thereafter heat treatment is performed thereby forming n-type impurity regions 27.

Step 8 (see FIG. 10): The substrate 2 (the n-type impurity regions 27) is etched through the side wall spacers 26, the thermal oxide films 25 and the field isolation films 20 serving as masks thereby forming trenches 28 of 200 nm in depth. Each trench 28 divides each n-type impurity region 27 into two portions. Thus, the portion of the n-type impurity region 27 located between each trench 28 and each control gate electrode 7 serves as the n-type impurity region 9. Therefore, the n-type impurity regions 9 can be formed in a self-aligned manner with no misalignment of masks in a mask process by forming the side wall spacers 26 on the side walls of the control gate electrodes 7 and thereafter etching the substrate 2 through the side wall spacers 26.

Further, the n-type impurity regions 9 can be formed with a small width below the limit minimum size in the mask process by controlling the thickness of the silicon nitride film for forming the side wall spacers 26. In addition, the width of the side wall spacers 26 can be precisely controlled by controlling the thickness of the silicon nitride film for forming the side wall spacers 26, whereby the width of the n-type impurity regions 9 formed through the side wall spacers 26 can also be precisely controlled.

Thus, the n-type impurity regions 9 can be further refined and prevented from dispersion in width. Each n-type impurity region 9 corresponds to the "third region" in the present invention.

The width (the distance between the trench 28 and the first tunnel insulator film 8) of each n-type impurity region 9 is 30 nm. The range of the width of the n-type impurity regions 9 is properly not more than 50 nm, desirably not more than 30 to 40 nm below the mean free path of carriers, and more desirably 20 to 30 nm.

If the width of the n-type impurity regions 9 exceeds 50 nm, the write efficiency and the erase efficiency tend to lower.

Then, thermal oxide films of about 8 nm in thickness are formed in the trenches 28 by thermal oxidation. In these thermal oxide films, portions formed on the bottoms of the trenches 28 define the second gate insulator films 13, portions formed on the side walls of the trenches 28 closer to the n-type impurity regions 9 define the second tunnel insulator films 10, and portions formed on the side walls of the trenches 28 closer to the drain regions 4 define the third insulator films 12. Each second tunnel insulator film 10 corresponds to the "second insulator film" in the present invention.

A doped polysilicon film doped with an n-type impurity such as phosphorus is formed on the overall surface of the substrate 2 including the trenches 28 and thereafter entirely anisotropically etched back. Further, the doped polysilicon film is etched toward the surface of the substrate 2 through the side wall spacers 26, the thermal oxide films 25 and the field isolation films 20 serving as masks, thereby embedding/forming the floating gate electrodes 11 in the trenches 28. Each floating gate electrode 11 corresponds to the "second gate electrode" in the present invention.

The doped polysilicon film is formed by any of the methods described above with reference to the step 5.

Thereafter thermal oxide films 29 are formed on the upper surfaces of the floating gate electrodes 11 by thermal oxidation. In this stage, the floating gate electrodes 11 of the respective memory cells 1 are formed independently of each other through the field isolation films 20.

Step 9 (see FIG. 11): A silicon nitride film 30 is formed on the overall surface and thereafter etched back. Regions excluding the silicon oxide film 21 are covered with a resist film 31 and thereafter the silicon oxide film 21 is removed by etching for exposing the substrate 2. Phosphorus ions are implanted into the exposed portion of the substrate 2 and thereafter heat treatment is performed for forming the n-type drain region 4. At this time, the n-type impurity regions 27 are integrated with the drain region 4. Thus, the floating gate electrodes 11 are formed on the side walls of the drain region 4 through the third insulator films 12. The n-type drain region 4 corresponds to the "second region" in the present invention.

Thus, the memory cells 1 are completed.

Thereafter an interlayer isolation film (not shown) is formed on the memory cells 1. The word lines $WL_0$ to $WL_n$ connecting the control gate electrodes 7, the bit lines $BL_0$ to $BL_n$ connecting the drain regions 4 and the source line SL connecting the source electrodes 14 in common are formed thereby forming the memory cell array 50.

(Second Embodiment)

A second embodiment of the present invention is now described. In the second embodiment, data of four values ("00", "01", "10" and "11") are stored in the structure of the memory cell 1 according to the first embodiment. Therefore, the second embodiment is different from the first embodiment only in operating voltages in writing, and the remaining structure of the second embodiment is identical to that of the first embodiment.

In a write operation, operating voltages of the memory cell 1 are set to values shown in Table 1 for the data "01", "10" and "11" respectively. Data "00" is for an erased state.

TABLE 1

| Data | Source Voltage Vs | Control Gate Voltage Vcg | Drain Voltage Vd |
|------|-------------------|--------------------------|------------------|
| 01   | 0                 | −3                       | 3                |
| 10   | 0                 | −3                       | 4                |
| 11   | 0                 | −3                       | 5                |

The drain voltage Vd varies with the types of the data. In the write operation, writing is terminated when the potential difference between the control gate electrode 7 and the n-type impurity region 9 is less than 3.2 V, as described above. On the other hand, the initial voltage of the n-type impurity region 9 is increased in proportion to the drain voltage Vd and hence the time for reducing the potential difference between the control gate electrode 7 and the n-type impurity region 9 to less than 3.2 V is so increased that a large quantity of electrons are injected into the floating gate electrode 11. In other words, the quantity of electrons stored in the floating gate electrode 11 can be varied by changing the drain voltage Vd. Multivalued (four-valued) data can be written by associating the written data with the storage quantities.

In a read operation, a current (cell current) hardly flows between the source region 3 and the drain electrode 4 and the value thereof is reduced as the quantity of electrons stored in the floating gate electrode 11 is increased. Thus, data stored in the memory cell 1 can be read by associating the current values and the four-valued data.

(Third Embodiment)

Figure 12:
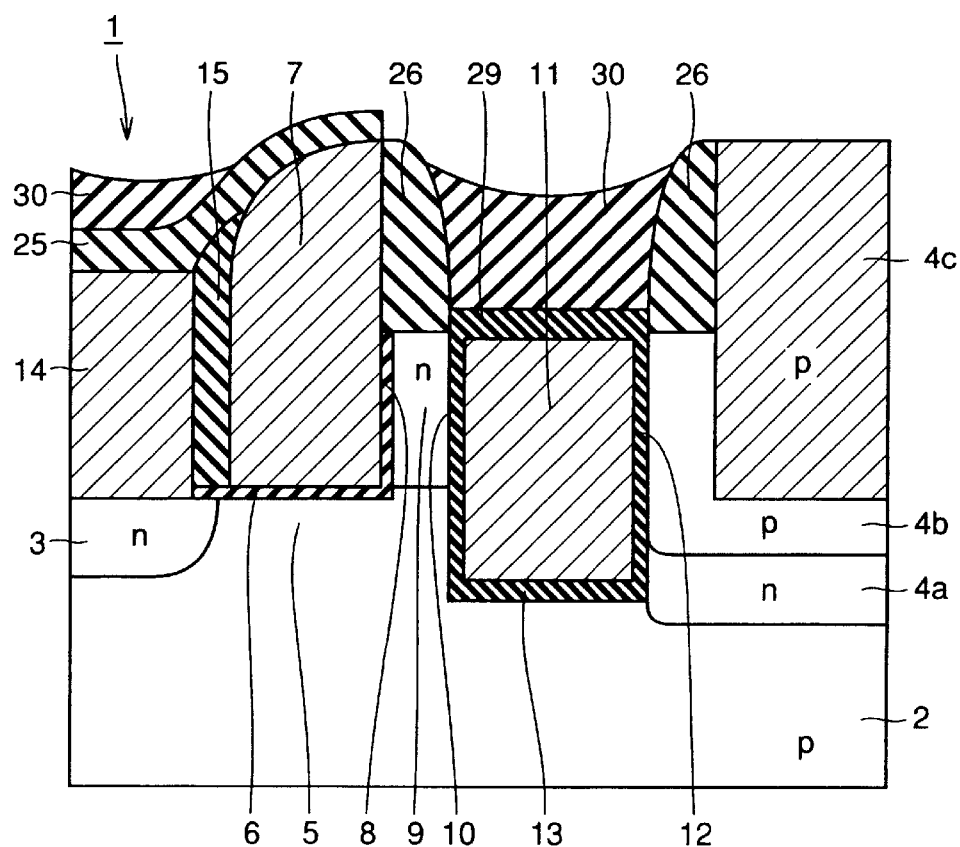
FIG. 12 is a partially fragmented sectional view of a memory cell according to a third embodiment of the present invention.

Referring to FIG. 12, a drain region is formed in a diode structure in a memory cell 1 according to a third embodiment of the present invention having a structure similar to that of the memory cell 1 according to the first embodiment shown in FIG. 1. The remaining structure of the memory cell 1 according to the third embodiment is identical to that of the first embodiment.

According to the third embodiment, an n-type drain region 4a, a p-type drain region 4b and a drain region 4c of a p-type polysilicon film form the drain region of the diode structure, as shown in FIG. 12. The n-type drain region 4a is formed on the overall region between a p-type single-crystalline silicon substrate 2 and the p-type drain region 4b. The p-type drain region 4b and the drain region 4c of a p-type polysilicon film define the "fourth region" of the present invention. The drain region 4c of the p-type polysilicon film is embedded in the p-type drain region 4b. The n-type drain region 4a and the p-type drain region 4b are capacitively coupled with a floating gate electrode 11 through a third insulator film 12.

Write and read operations of the third embodiment are identical to those of the first embodiment. As to operating voltages in an erase operation of the third embodiment, however, a negative voltage is applied to the drain region dissimilarly to the first embodiment.

More specifically, a source voltage Vs is set to 5.5 V, a drain voltage Vd is set to −4 V, a control gate voltage Vcg is set to 5.5 V and a substrate voltage (well voltage) Vsub is set to 0 V as the operating voltages of the memory cell 1 in the erase operation. In this case, the drain region is strongly electrostatically coupled with the floating gate electrode 11 and hence the potential of the floating gate electrode 11 substantially reaches −3 V.

On the other hand, the potential of a control gate electrode 7 is 5.5 V and hence a transistor having the control gate electrode 7 as the gate enters an ON state. Thus, the potential of an n-type impurity region 9 is substantially equalized with that of a source region 3. In other words, the potential of the n-type impurity region 9 reaches 5 V (voltage level-shifted from the potential of the control gate electrode 7 by a threshold voltage Vt with the upper limit of the source voltage Vs). Thus, a high electric field of about 10 MV is generated in a second tunnel insulator film 10 located between the n-type impurity region 9 and the floating gate electrode 11. Consequently, an FN tunnel current flows and electrons are extracted from the floating gate electrode 11 into the n-type impurity region 9 for erasing data.

According to the third embodiment, the following functions/effects can be attained in addition to the aforementioned functions/effects of the first and second embodiments:

(8) Negative voltages can be readily applied to the drain regions 4b and 4c without employing a complicated structure such as the conventional triple well structure by forming a diode by the n-type drain region 4a and the p-type drain regions 4b and 4c. Thus, positive and negative voltages can be employed for the erase and write operations, whereby the maximum voltage generated by a step-up circuit can be substantially halved. More specifically, the operating voltages of the memory cell 1 can be set not more than ±6 V in the erase operation. Thus, the operating voltages as well as power consumption in the erase operation can be reduced as compared with the conventional stacked gate or split gate memory cell. The scale of the step-up circuit is also reduced, whereby integration can be attained.

Further, a negative voltage can be employed for a cell region without introducing a negative voltage into the substrate 2, to require no process such as that for high energy ion implantation for forming a triple well structure necessary for introducing a negative voltage into the substrate 2. According to the third embodiment, the p-type drain region 4b can be readily formed by a general impurity ion implantation process, to result in no burden in process.

When applying a negative voltage to the drain region 4b without employing the diode structure according to the third embodiment, there is a possibility that an excess current flows between the drain region 4a and the p-type single-crystalline silicon substrate 2, while there is a possibility that an excess current flows also between the source region 3 and the drain region when not floating either the source region 3 or the drain region in erasing. In this case, the excess current may disadvantageously exceed an allowable current quantity in the step-up circuit. According to this embodiment, flow of such an excess current can be effectively prevented by employing the diode structure.

(9) The n-type drain region 4a and the p-type drain region 4b are capacitively coupled with the floating gate electrode 11 through the third insulator film 12, whereby the voltage of the p-type drain region 4b directly applied form a power source through a wire can be efficiently transmitted to the floating gate electrode 11 by capacitive coupling.

(10) In the erase operation, the potential of the n-type impurity region 9 can be controlled regardless of the potential of the floating gate electrode 11 by controlling the source voltage Vs and the control gate voltage Vcg. Therefore, no circuit is required for controlling the potential of the n-type impurity region 9, and the layout area as well as power consumption can consequently be reduced.

Figure 10:
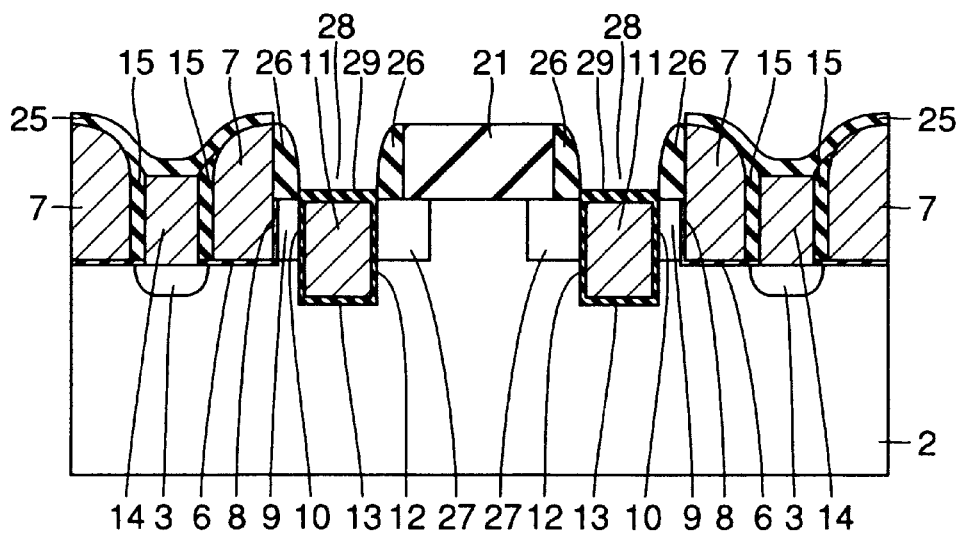
Figure 11:
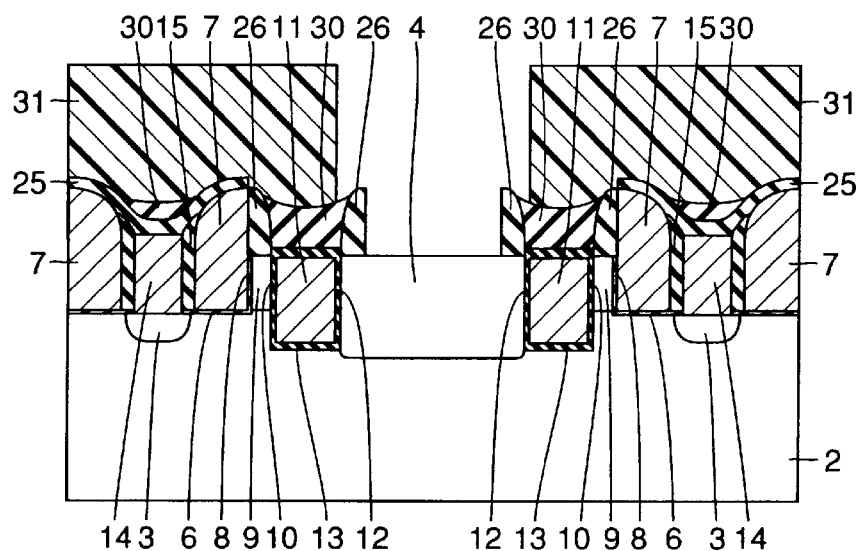
Figure 13:
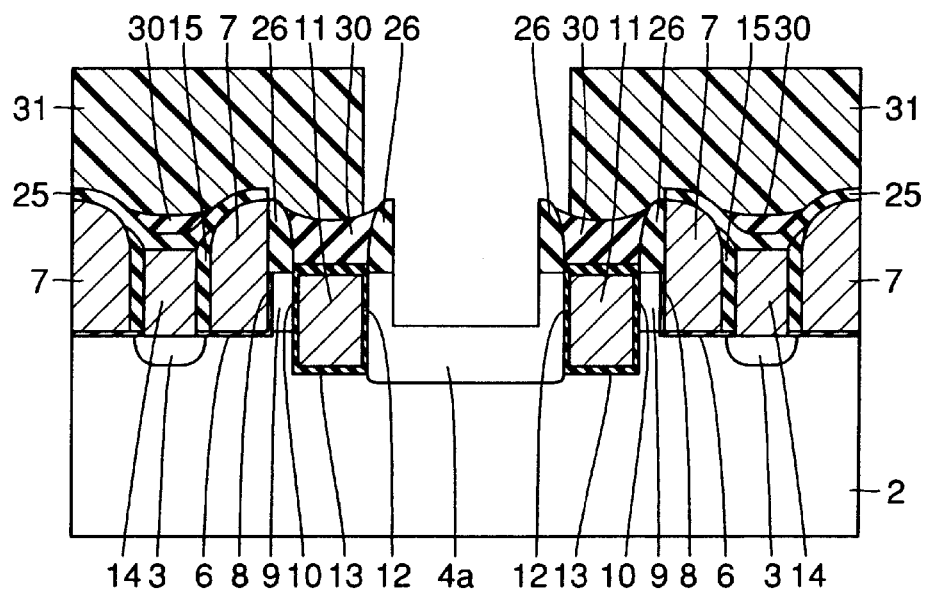
FIGS. 13 and 14 are sectional views for illustrating a method of fabricating the memory cell according to the third embodiment.
Figure 14:
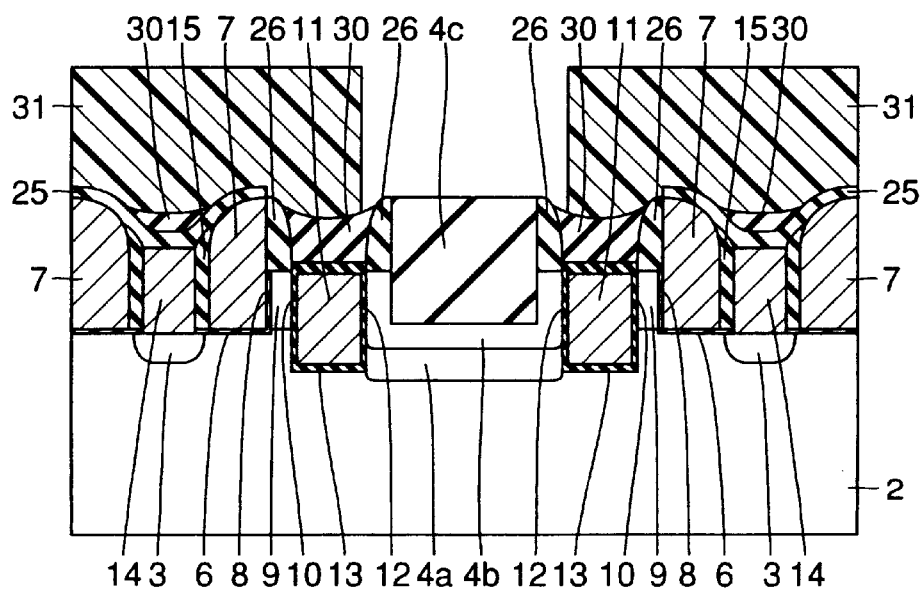

A method of fabricating the memory cell 1 according to the third embodiment is now described with reference to FIGS. 13 and 14. In the fabrication process for the memory cell 1 according to the third embodiment, the structure shown in FIG. 10 is formed through a process similar to the fabrication process according to the first embodiment shown in FIGS. 2 to 10, followed by subsequent steps 10 and 11.

Step 10 (see FIG. 13): A silicon nitride film 30 is formed on the overall surface and thereafter etched back. Regions excluding a silicon oxide film 21 (see FIG. 10) are covered with a resist film 31 and thereafter the silicon oxide film 21 is removed by etching for exposing the substrate 2. The substrate 2 is further dug down. Phosphorus ions are implanted into the exposed part of the substrate 2. Thus, the n-type drain region 4a is formed.

Step 11 (see FIG. 14): A polysilicon film is deposited on the overall surface, and thereafter a p-type impurity is ion-implanted. Heat treatment is performed and thereafter the polysilicon film is etched back. The n-type drain region 4a is activated by the heat treatment while the p-type impurity diffuses from the polysilicon film for forming the p-type drain region 4b. Further, the p-type drain region 4a of a p-type polysilicon film is formed by etching back the polysilicon film.

Thus, the drain region including the n-type drain region 4a, the p-type drain region 4b and the drain region 4c of the p-type polysilicon film is formed. n-type impurity regions 27 (see FIG. 10) are replaced with p-type layers since the quantity of the p-type impurity diffusing later is larger, and integrated with the p-type drain region 4b. The n-type drain region 4a corresponds to the "second region" in the present invention, and the p-type drain regions 4b and 4c correspond to the "fourth region" in the present invention.

The memory cell 1 is completed in the aforementioned manner.

Thereafter an interlayer isolation film (not shown) is formed on each memory cell 1, similarly to the first embodiment. Word lines $WL_0$ to $WL_n$ connecting each control gate electrode 7, bit lines $BL_0$ to $BL_n$ connecting each drain region and a source line SL connecting each source electrode 14 in common are formed for forming a memory cell array 50.

(Fourth Embodiment)

Figure 15:
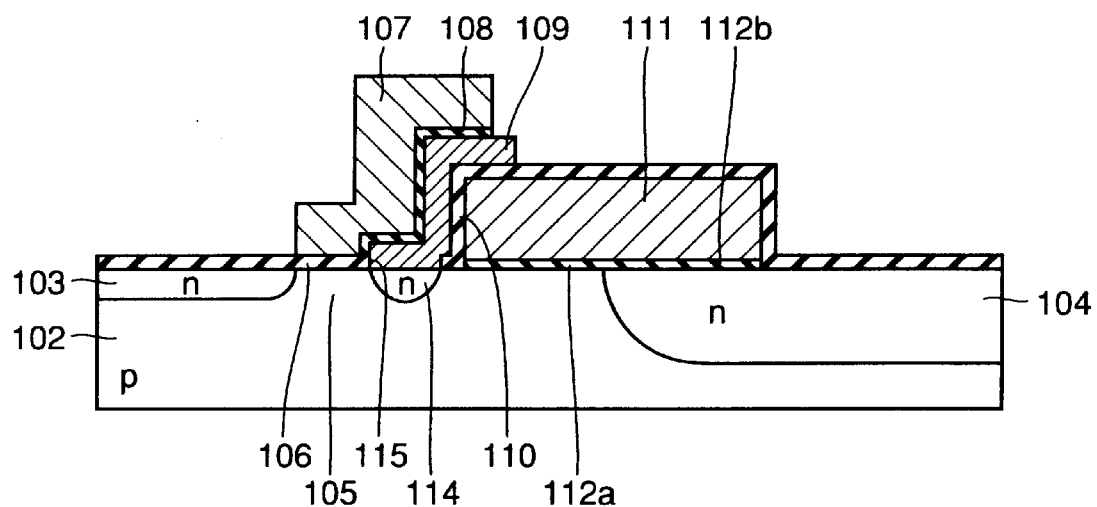
FIG. 15 is a partially fragmented sectional view of a memory cell according to a fourth embodiment of the present invention.
Figure 16:
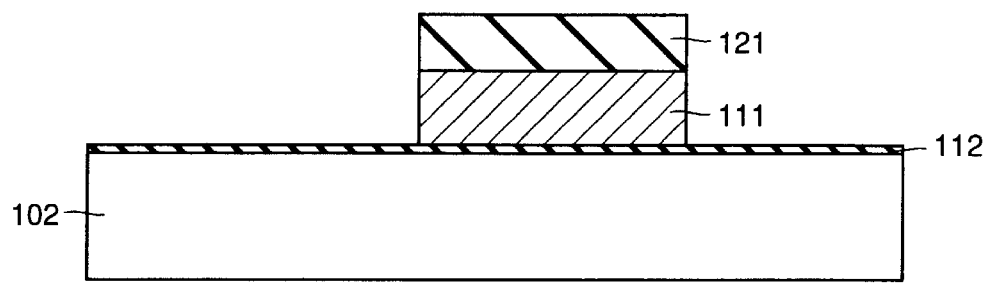
FIGS. 16 to 20 are sectional views for illustrating a method of fabricating the memory cell according to the fourth embodiment.
Figure 17:
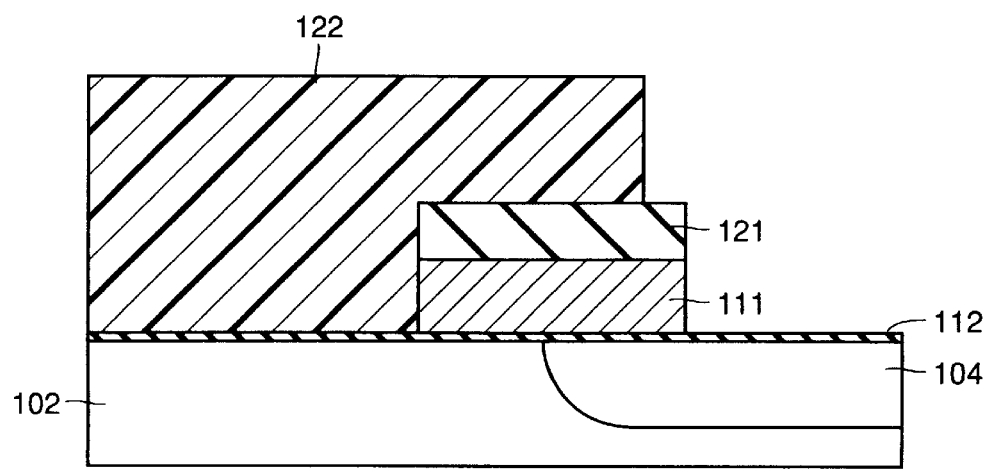
Figure 18:
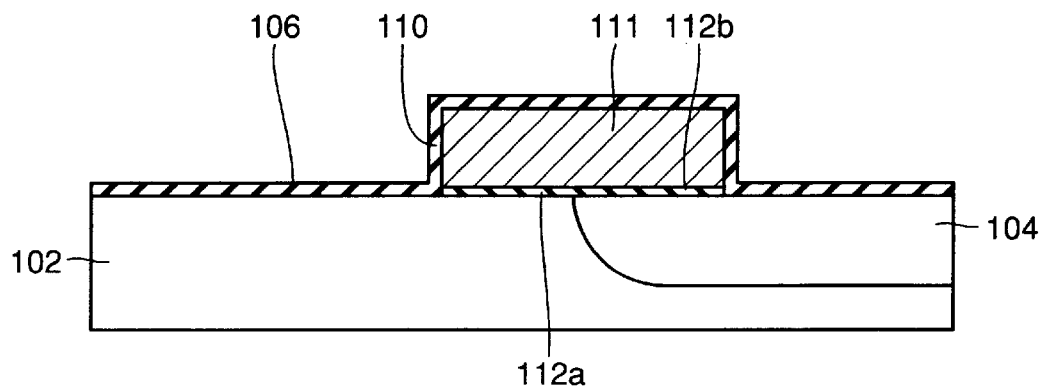
Figure 19:
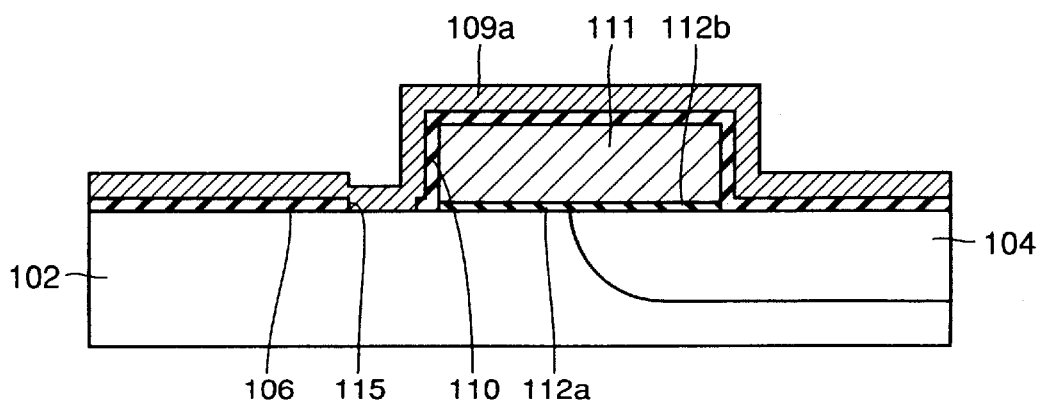
Figure 20:
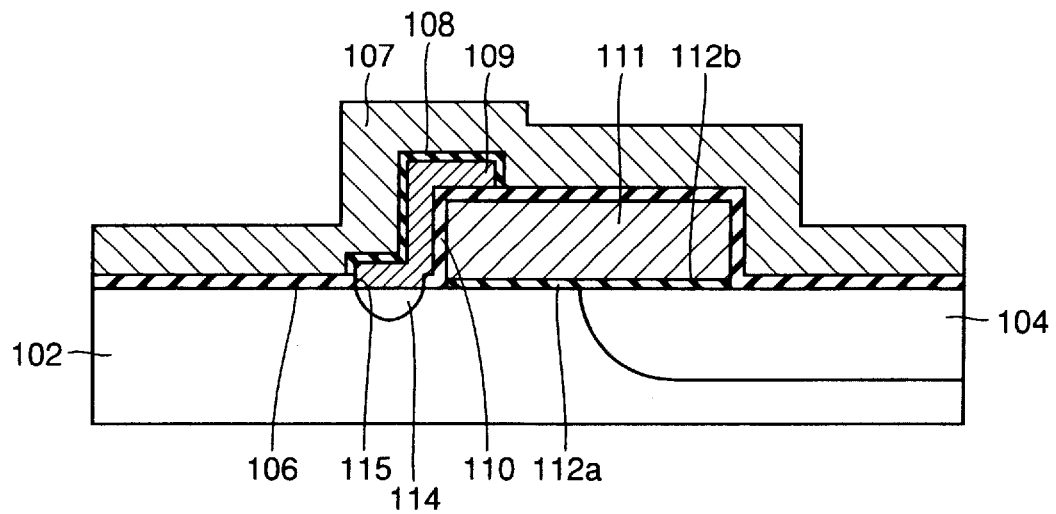

With reference to FIG. 15, the structure of a memory cell 101 according to a fourth embodiment of the present invention is now described.

In the memory cell 101 according to the fourth embodiment, an n-type source region 103 and an n-type drain region 104 are formed on the surface of a p-type single-crystalline silicon substrate 102 at a prescribed space to hold a channel region 105 therebetween. A floating gate electrode 111 of an n-type polysilicon film is formed on the channel region 105 and a part of the drain region 104 through a second gate insulator film 112a of a silicon oxide film and a third insulator film 112b.

An inter-gate 109 of an n-type single-crystalline silicon film is formed on the side surface and the upper surface of the floating gate electrode 111 through a second tunnel insulator film 110. The bottom portion of the inter-gate 109 is in contact with the surface of the p-type single-crystalline silicon substrate 102 through an opening 115. An n-type diffusion layer 114 is formed under the contact surfaces of the inter-gate 109 and the p-type single-crystalline silicon substrate 102.

A control gate electrode 107 of an n-type polysilicon film is formed on the side surface and the upper surface of the inter-gate 109 through a first tunnel insulator film 108. The bottom portion of the control gate electrode 107 is formed on the channel region 105 through a first gate insulator film 106 of a silicon oxide film.

The thicknesses of the aforementioned members in the fourth embodiment are set as follows:

the thickness of the first gate insulator film 106: 16 to 20 nm the thickness of the first tunnel insulator film 108: 3 to 4 nm the thickness of the second tunnel insulator film 110: 8 to 20 nm the thickness of the third insulator film 112b: 8 to 10 nm the thickness of the second gate insulator film 112a: 8 to 10 nm the width of the inter-gate 109 (the distance between the first and second tunnel insulator films 108 and 110): 20 to 40 nm (the width of the inter-gate 109 is most desirably set to 20 to 30 nm, so that electrons having energy of 3 to 5 eV used for writing reach the floating gate electrode 111 by at least several %)

The area of the third insulator film 112b located between the drain region 104 and the floating gate electrode 111 is larger than that of the second tunnel insulator film 110 located between the inter-gate 109 and the floating gate electrode 111 while the thickness of the third insulator film 112b is smaller than that of the second tunnel insulator film 110.

In the memory cell 101 according to this embodiment, therefore, the electrostatic capacitance between the drain region 104 and the floating gate electrode 111 is larger than that between the inter-gate 109 and the floating gate electrode 111. Thus, the coupling ratio between the inter-gate 109 and the floating gate electrode 111 is larger than that between the drain region 104 and the floating gate electrode 111. Consequently, the potential of the drain region 104 is readily transmitted to the floating gate electrode 111.

Respective operations (write, erase and read operations) of the memory cell 101 according to the fourth embodiment are similar to those in the first embodiment.

According to the fourth embodiment, the following functions/effects can be attained in addition to those according to the first to third embodiments:

(11) The floating gate electrode 111, the inter-gate 109 and the control gate electrode 107 are formed on the p-type single-crystalline silicon substrate 102, and hence no grooves may not be formed in the p-type floating gate electrode 111 and the like. Consequently, the structure can be simplified as compared with the case of forming such grooves. Further, no grooves may be formed in the p-type single-crystalline silicon substrate 102 and hence the structure having the control gate electrode 107, the inter-gate 109 and the floating gate electrode 111 can be formed through a simple process. Further, no tunnel insulator film or the like may be formed on the side surface of the p-type single-crystalline silicon substrate 102 damaged by etching for forming such grooves, whereby the quality of a tunnel insulator film is not deteriorated.

(12) The inter-gate 109 is formed by a single-crystalline silicon film, so that the first tunnel insulator film 108 can be formed by oxidizing the single-crystalline silicon film. Thus, the first tunnel insulator film 108 can be obtained with excellent quality.

A method of fabricating the memory cell 101 according to the fourth embodiment is now described with reference to FIGS. 16 to 20.

Step 12 (see FIG. 16): A silicon oxide film 112 is formed on the p-type single-crystalline silicon substrate 102 in a thickness of about 8 to 10 nm by thermal oxidation. A doped polysilicon film doped with an n-type impurity is formed on the silicon oxide film 112 in a thickness of about 200 nm by LPCVD at a deposition temperature of about 620° C. Another silicon oxide film is further deposited on the doped polysilicon film. The silicon oxide film and the doped polysilicon film are patterned by photolithography and dry etching, thereby forming the floating gate electrode 111 of the n-type doped polysilicon film and a silicon oxide film 121 located thereon. The p-type single-crystalline silicon substrate 102 corresponds to the "first layer" of the present invention, and the floating gate electrode 111 corresponds to the "second gate electrode" of the present invention.

The doped polysilicon film may be formed by any of the following methods:

Method 1: Gas containing an impurity is introduced into raw material gas when forming a polysilicon film by LPVCD.

Method 2: After forming a non-doped polysilicon film by LPCVD and thereafter forming an impurity diffusion source layer of POCl$_3$ or the like on the polysilicon film for diffusing an impurity from the impurity diffusion source layer into the polysilicon film.

Method 3: After forming a non-doped polysilicon film by LPCVD, impurity ions are implanted.

Step 13 (see FIG. 17): A resist film 122 is formed to cover a source forming region. The resist film 122 is employed as a mask for implanting phosphorus ions into the surface of the p-type single-crystalline silicon substrate 102 under conditions of about 50 keV and 1E15/cm$^2$ thereby forming the drain region 104. This drain region 104 is so formed as to extend substantially toward the center of the lower portion of the floating gate electrode 111, in order to increase the area of the portion overlapping with the floating gate electrode 111. In the silicon oxide film 112, the part held between the floating gate electrode 111 and the p-type single-crystalline silicon substrate 102 defines the second gate insulator film 112a, and the part held between the floating gate electrode 111 and the drain region 104 defines the third insulator film 112b. The drain region 104 corresponds to the "second region" of the present invention.

Step 14 (see FIG. 18): The resist film 122 is removed and thereafter the silicon oxide film 121 is removed from the floating gate electrode 111. Further, parts of the silicon oxide film 112 other than those defining the second gate insulator film 112a and the third insulator film 112b are removed. A silicon oxide film having a thickness of about 16 to 20 nm is formed on the upper surface and the side surface of the floating gate electrode 111 and the surface of the p-type single-crystalline silicon substrate 102 by thermal oxidation. In this silicon oxide film, the part formed on the side surface of the floating gate electrode 111 to be formed with the inter-gate 109 and the upper surface of this portion defines the second tunnel insulator film 110, and the part located between the p-type single-crystalline silicon substrate 102 and the portion to be formed with the control gate electrode 107 defines the first gate insulator film 106. The second tunnel insulator film 110 corresponds to the "second insulator film" in the present invention.

Step 15 (see FIG. 19): The opening 115 is formed by lithography and dry etching. An amorphous silicon film 109a is formed on the overall surface in a thickness of about 20 to 40 nm by LPCVD at a deposition temperature of about 560° C. Phosphorus ions are implanted into the amorphous silicon film 109a under conditions of 3 keV and 1E14/cm$^2$.

Step 16 (see FIG. 20): The amorphous silicon film 109a is patterned thereby forming the inter-gate 109. Heat treatment is performed at a temperature of about 600° C. for about two hours, thereby single-crystallizing the inter-gate 109 while forming the n-type diffusion layer 114 on the p-type single-crystalline silicon substrate 102. The inter-gate 109 corresponds to the "third region" or the "semiconductor region" of the present invention.

Thereafter the first insulator film 108 having a thickness of about 3 to 4 nm is formed on the side surface and the upper surface of the inter-gate 109 of a single-crystalline silicon film by thermal oxidation. The first tunnel insulator film 108 corresponds to the "first insulator film" in the present invention. A doped polysilicon film or a WSi film is formed to cover the overall surface.

The width of the inter-gate 109 (the distance between the first and second tunnel insulator films 108 and 110) is 30 nm. The width of the inter-gate 109 is properly in the range of not more than 50 nm, preferably not more than 30 to 40 nm, i.e., not more than the mean free path of carriers, and more preferably in the range of 20 to 30 nm. If the width of the inter-gate 109 exceeds 50 nm, write efficiency and erase efficiency tend to lower.

Thereafter the doped polysilicon film or the WSi film is patterned thereby forming the control gate electrode 107, as shown in FIG. 15. A resist film (not shown) is formed to cover the drain region 104 and thereafter employed as a mask for ion-implanting an n-type impurity such as phosphorus into the p-type single-crystalline silicon substrate 102, thereby forming the source region 103. The control gate electrode 107 corresponds to the "first gate electrode" in the present invention, and the source region 103 corresponds to the "first region" in the present invention.

The memory cell 101 according to the fourth embodiment is thus completed.

Thereafter an interlayer isolation film (not shown) is formed on each memory cell 101. Word lines $WL_0$ to $WL_n$ connecting each control gate electrode 107, bit lines $BL_0$ to $BL_n$ connecting each drain region 104 and a source line SL connecting each source region 103 in common are formed for forming a memory cell array 50.

(Fifth Embodiment)

Figure 21:
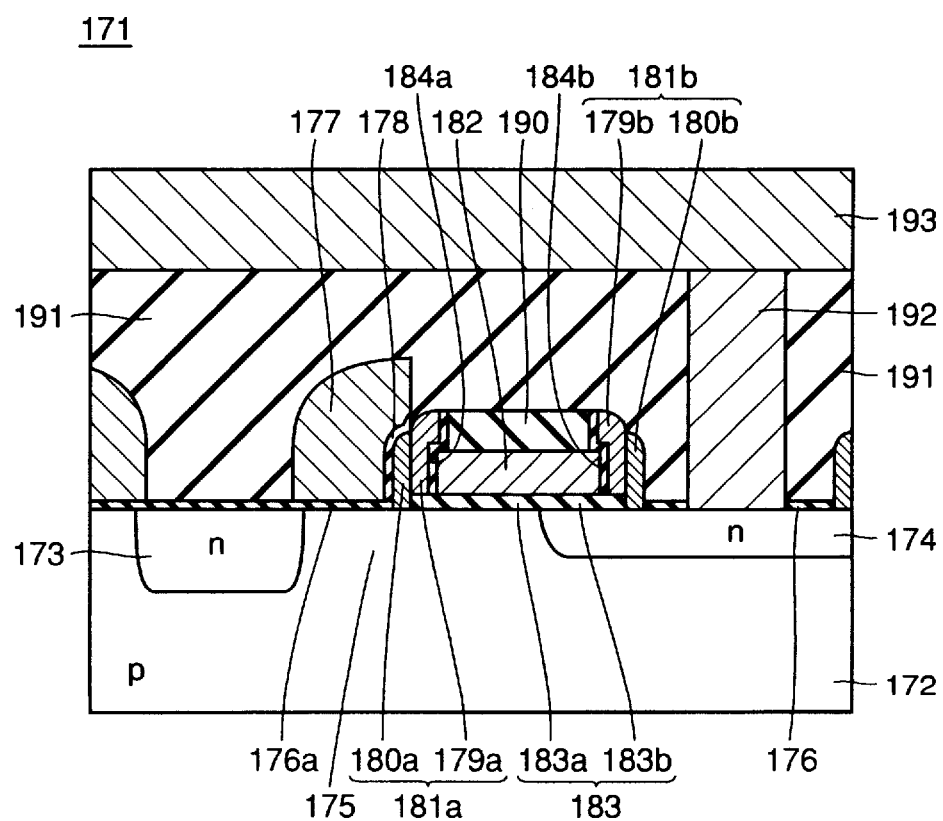
FIG. 21 is a partially fragmented sectional view of a memory cell according to a fifth embodiment of the present invention.
Figure 22:
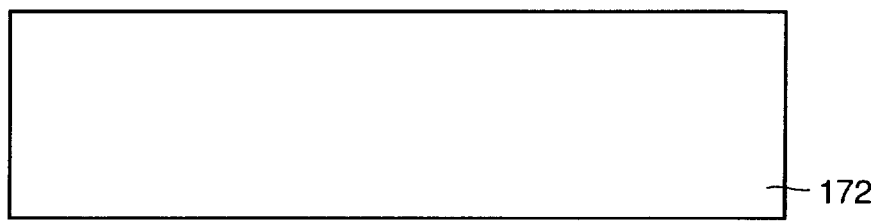
FIGS. 22 to 36 are sectional views along directions X and Y for illustrating a method of fabricating the memory cell according to the fifth embodiment.
Figure 23:
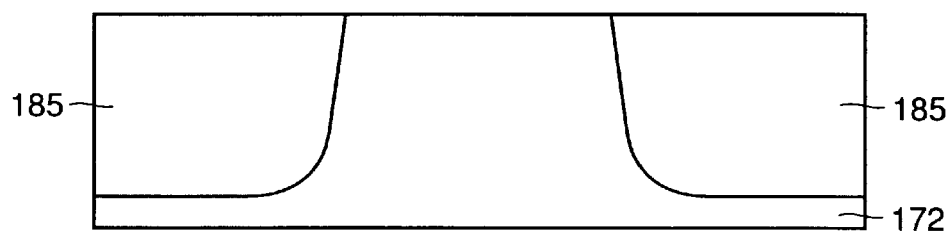
Figure 24:
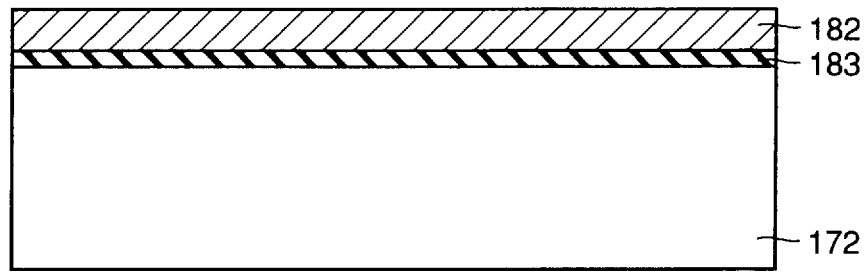
Figure 25:
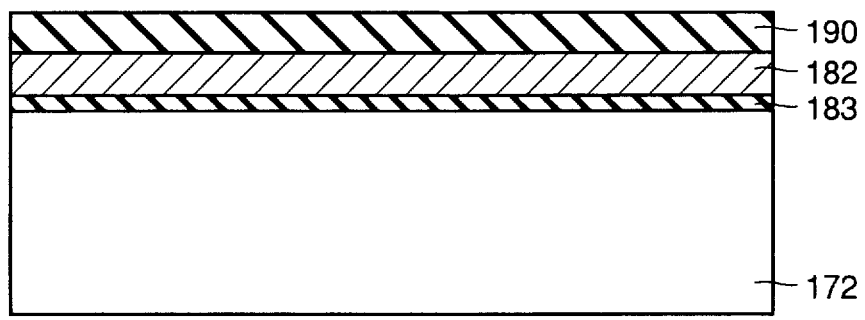
Figure 26:
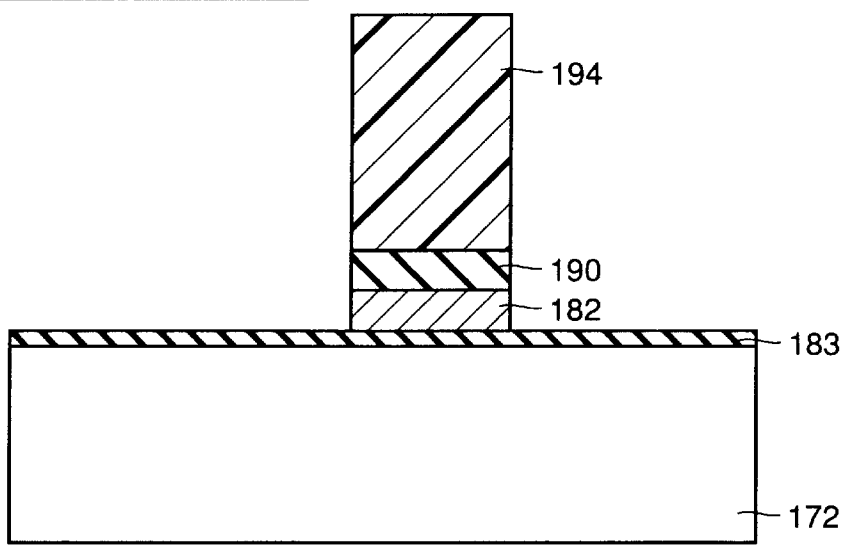
Figure 27:
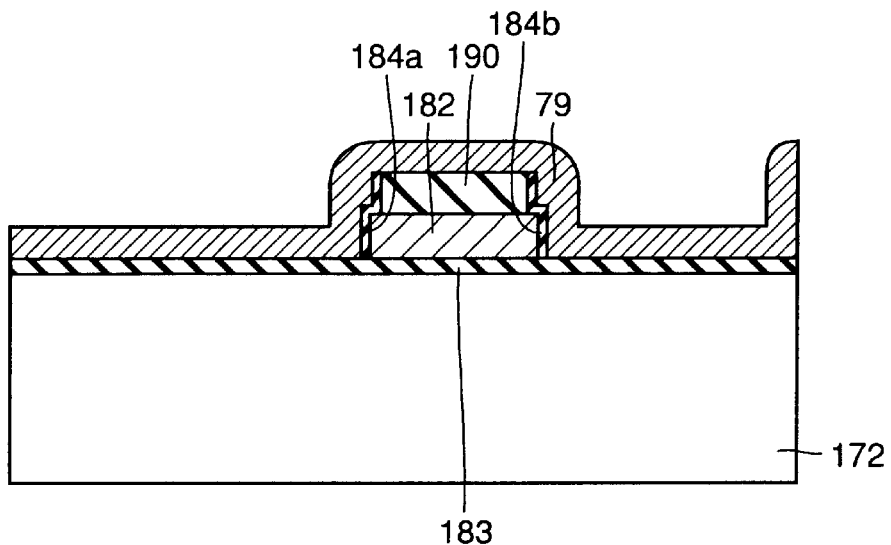
Figure 28:
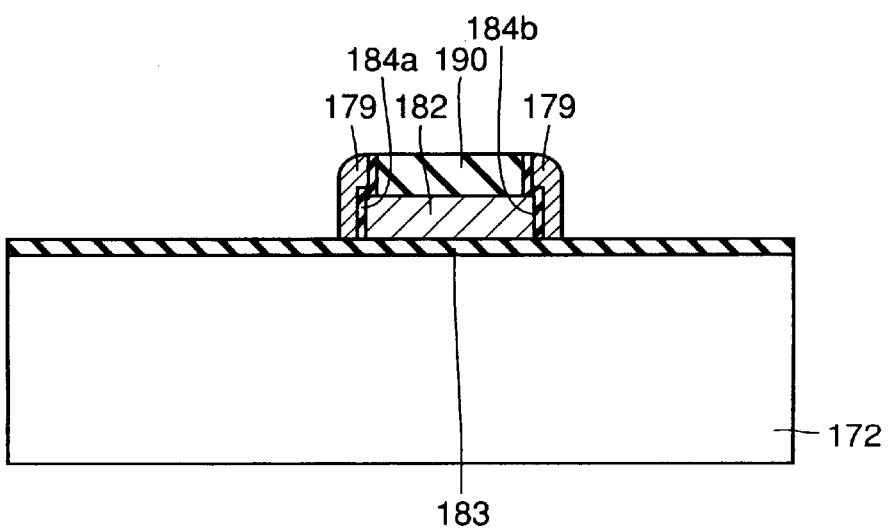
Figure 29:
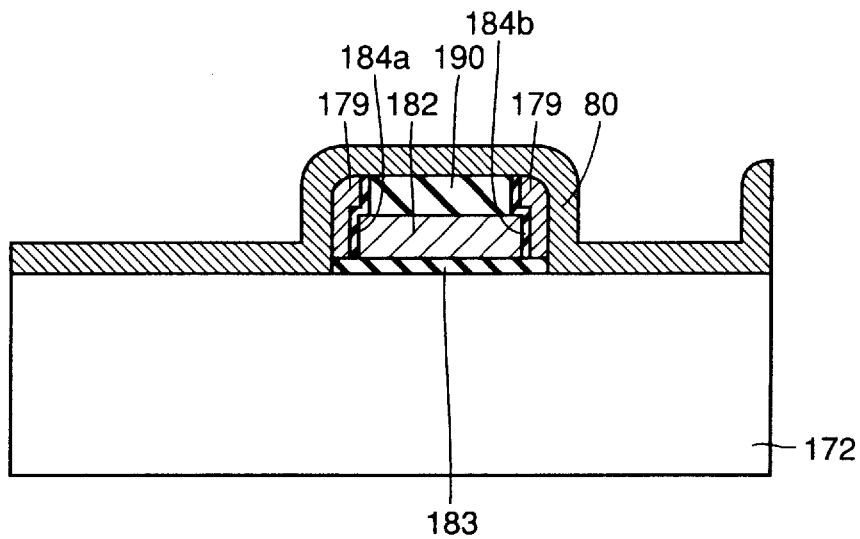
Figure 30:
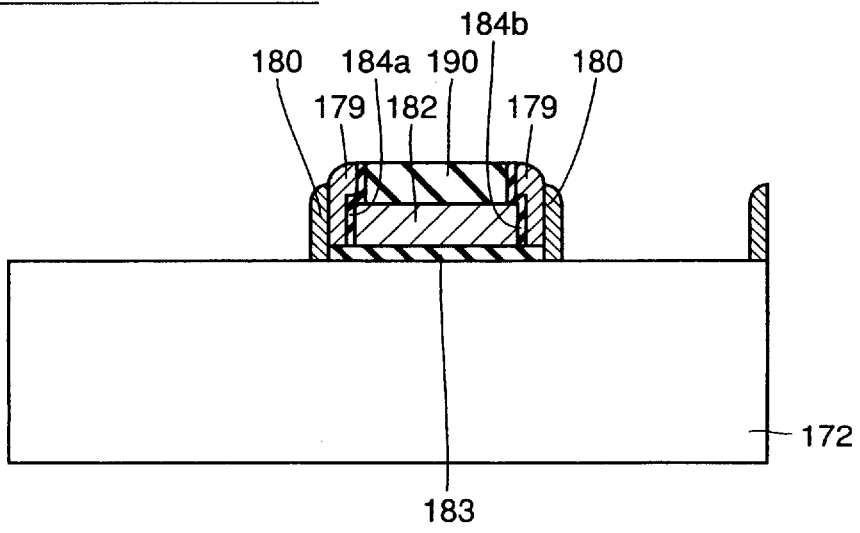

In a memory cell 171 according to a fifth embodiment of the present invention, two side wall films form an inter-gate in a self-aligned manner while two side wall films form part of a drain region in a self-aligned manner as shown in FIG. 21, dissimilarly to the fourth embodiment. The remaining basic structure of the memory cell 171 is substantially similar to that of the memory cell 101 according to the fourth embodiment. The fifth embodiment is now described.

In the memory cell 171 according to the fifth embodiment, an n-type source region 173 and an n-type drain region 174 are formed on the surface of a p-type single-crystalline silicon substrate 172 at a prescribed space to hold a channel region 175 therebetween. On the channel region 175 and part of the drain region 174, a floating gate electrode 182 of a doped polysilicon film is formed through a second gate insulator film 183a of a silicon oxide film and a third insulator film 183b. An inter-gate 181a of an n-type polysilicon film is formed on the side surface of the floating gate electrode 182 through a second tunnel insulator film 184a.

This inter-gate 181a is formed by a side wall film 179a of an n-type polysilicon film and a side wall film 180a of an n-type polysilicon film. The bottom portion of the side wall film 180a is in contact with the surface of the p-type single-crystalline silicon substrate 172.

On the drain region 174, a drain region 181b is formed by side wall films 179b and 180b of polysilicon films. The side wall film 180b and the drain region 174 are electrically connected with each other. A third insulator film 184b is formed between the drain region 181b and the floating gate electrode 182. In other words, the third insulator films 183b and 184b are formed between the drain regions 174 and 181b and the floating gate electrode 182.

A control gate electrode 177 of an n-type polysilicon film is formed on the side surface of the inter-gate 181a through a first tunnel insulator film 178. The bottom portion of the control gate electrode 177 is formed on the channel region 175 through a first gate insulator film 176a of a silicon oxide film.

An interlayer isolation film 191 is formed to cover the overall surface. A plug electrode 192 is formed in a contact hole provided in the interlayer isolation film 191. A bit line 193 connected to the plug electrode 192 is formed to extend on the interlayer isolation film 191.

Write, erase and read operations of the fifth embodiment are identical to those of the first embodiment.

According to the fifth embodiment, the following functions/effects can be attained in addition to those according to the first to fourth embodiments:

(13) The inter-gate 181a is defined by the side wall films 179a and 180a formed in a self-aligned manner, so that the thicknesses of the side wall films 179a and 180a can be controlled by those of polysilicon films forming the same. Thus, the width of the inter-gate 181a formed by the side wall films 179a and 180a can be finely set to not more than the minimum limit size (minimum exposure size) in a mask process.

The widths of the side wall films 179a and 180a can be precisely controlled by controlling the thicknesses of the polysilicon films, whereby the width of the inter-gate 181a formed by the side wall films 179a and 180a can also be precisely controlled. Consequently, dispersion of the width of the inter-gate 181a can be suppressed.

(14) The drain region 181b is formed on the drain region 184 by the side wall films 179b and 180b of polysilicon films, whereby the drain region 181b can increase the opposite areas of the drain regions 174 and 181b and the floating gate electrode 182. Thus, the electrostatic capacitance between the drain regions 174 and 181b and the floating gate electrode 182 can be readily increased. Consequently, the electrostatic capacitance between the drain regions 174 and 181b and the floating gate electrode 182 can be readily increased beyond that between the inter-gate 181a and the floating gate electrode 182. Thus, the potential of the floating gate electrode 182 can be readily controlled by changing a drain voltage Vd.

(15) In a fabrication process described later, the side wall films 179b and 180b forming the drain region 181b are simultaneously formed with the side wall films 179a and 180a forming the inter-gate 181a, whereby the fabrication process is not completed also when providing the drain region 181b.

A method of fabricating the memory cell 171 according to the fifth embodiment is now described with reference to FIGS. 22 to 36.

Step 17 (see FIGS. 22 and 23): An element isolation film 185 is formed on the surface of the p-type single-crystalline silicon substrate 172 by an STI (shallow trench isolation) method. The p-type single-crystalline silicon substrate 172 corresponds to the "first layer" in the present invention. The element isolation film 185 may alternatively be formed by another method such as a LOCOS (local oxidation of silicon) method.

Step 18 (see FIG. 24): A silicon oxide film 183 is formed on the p-type single-crystalline silicon substrate 172 in a thickness of about 8 to 10 nm by thermal oxidation. An n-type doped polysilicon film 182 is formed on the silicon oxide film 183 by LPCVD in a thickness of about 150 nm. The doped polysilicon film 182 is formed by any of the methods described with reference to the step 5.

Step 19 (see FIG. 25): A silicon oxide film 190 is deposited on the doped polysilicon film 182 in a thickness of about 200 nm.

Step 26 (see FIG. 26): A resist film 194 is selectively formed on the silicon oxide film 190 by photolithography, and thereafter employed as a mask for selectively etching the silicon oxide film 190 and the doped polysilicon film 182. Thus, the floating gate electrode 182 of a patterned n-type doped polysilicon film is formed with the silicon oxide film 190 located thereon. The floating gate electrode 182 corresponds to the "second gate electrode" in the present invention.

Step 21 (see FIG. 27): The resist film 194 is removed and thereafter parts of the silicon oxide film 183 except that located under the floating gate electrode 182 are removed by wet etching with hydrofluoric acid. At this time, the side surfaces of the silicon oxide film 190 located on the floating gate electrode 182 are also slightly removed. Thereafter the second tunnel insulator film 184a of a silicon oxide film and the third insulator film 184b are formed on the side surfaces of the floating gate electrode 182 in thicknesses of about 10 nm, and the doped polysilicon film 79 is thereafter formed by LPCVD in a thickness of about 25 nm. The doped polysilicon film 79 is formed by any of the methods described with reference to the step 5. The second tunnel insulator film 184a corresponds to the "second insulator film" of the present invention.

Step 22 (see FIG. 28): The overall surface of the doped polysilicon film 79 is etched back by RIE (reactive ion etching), thereby forming side wall films 179 of doped polysilicon films on the side surfaces of the floating gate electrode 182.

Step 23 (see FIG. 29): The silicon oxide film 183 is etched through the side wall films 179 serving as masks, thereby selectively removing the silicon oxide film 183. Thereafter a non-doped polysilicon film 80 is formed by LPCVD in a thickness of about 25 nm.

Step 24 (see FIG. 30): The overall surface of the non-doped polysilicon film 80 is etched back by RIE (reactive ion etching), thereby forming side wall films 180 of non-doped polysilicon films on the side surfaces of the side wall films 179. An n-type impurity contained in the side wall films 179 diffuses into the side wall films 180 in a later heat treatment step, thereby supplying the side wall films 180 with conductivity. Thus, the side wall films 179 and 180 are integrated with each other.

The side wall films 180 are not formed by doped polysilicon films for the following reason: When forming the polysilicon film 80 for defining the side wall films 180 by a doped polysilicon film in the step shown in FIG. 29, the impurity contained in the polysilicon film 80 which is in contact with the surface of the p-type single-crystalline silicon substrate 172 disadvantageously diffuses into the surface of the p-type single-crystalline silicon substrate 172. In the fifth embodiment, therefore, the non-doped polysilicon film 80 is formed for thereafter forming the side wall films 180 from the non-doped polysilicon film 80 and further diffusing the n-type impurity contained in the side wall films 179 into the side wall films 180 in the later heat treatment step for supplying the side wall films 180 with conductivity.

The thicknesses of the side wall films 179 and 180 formed by etching back the polysilicon films 79 and 80 respectively are about 60% of the thicknesses (25 nm each) of the deposited polysilicon films 79 and 80. Therefore, the thicknesses, 15 nm each, of the side wall films 179 and 180, are about 30 nm in total.

Figure 31:
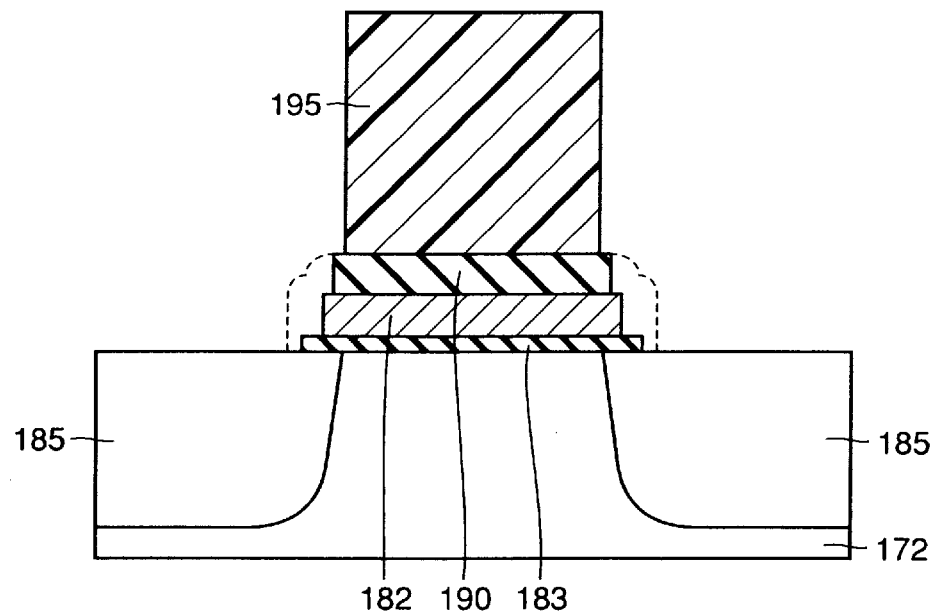
Figure 32:
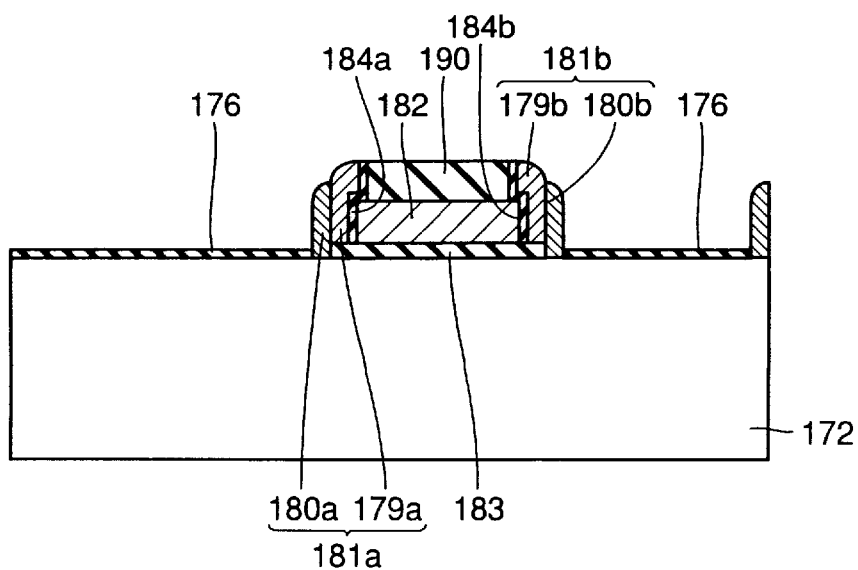
Figure 33:
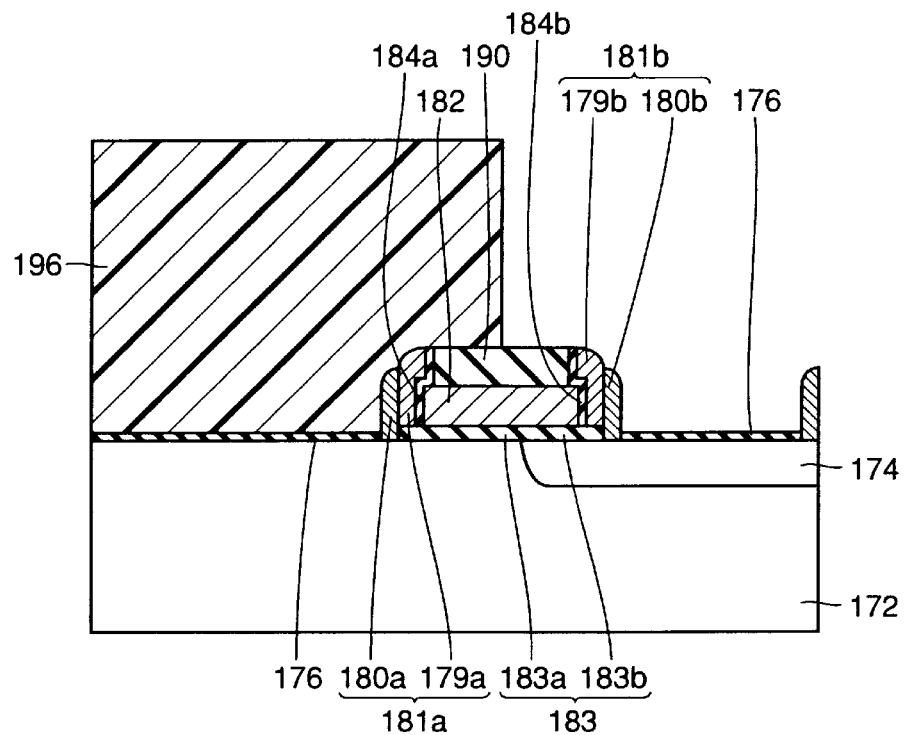
Figure 34:
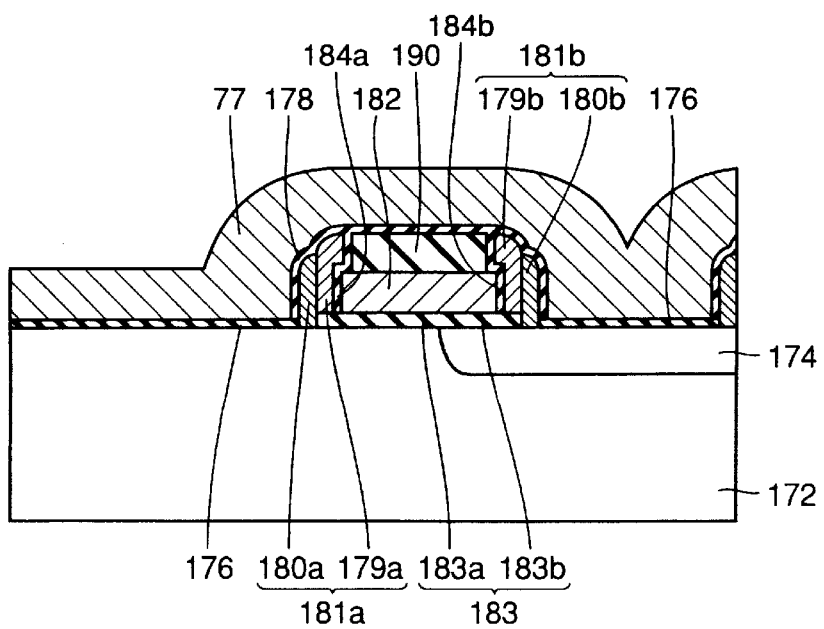
Figure 35:
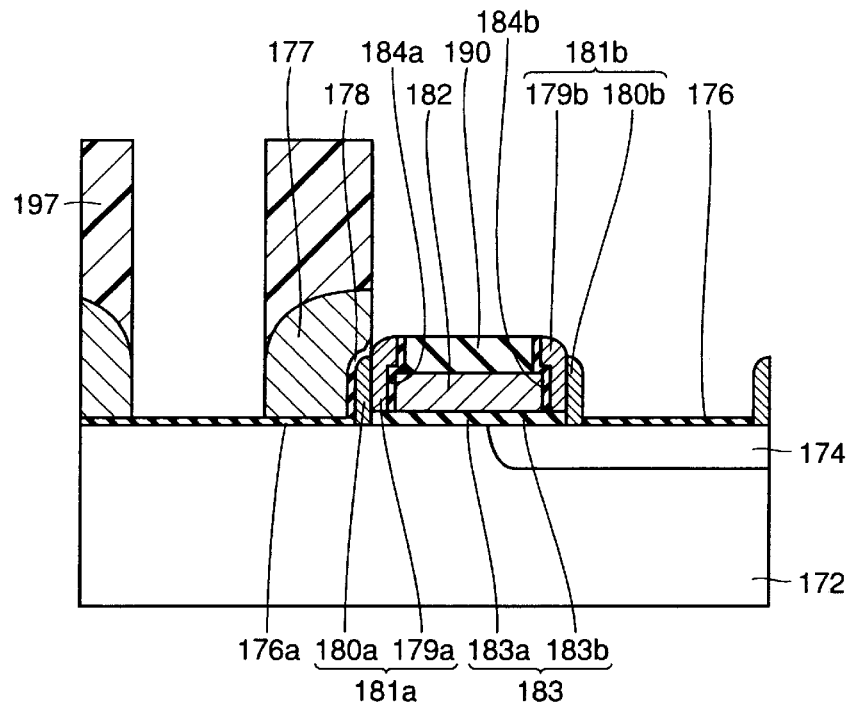
Figure 36:
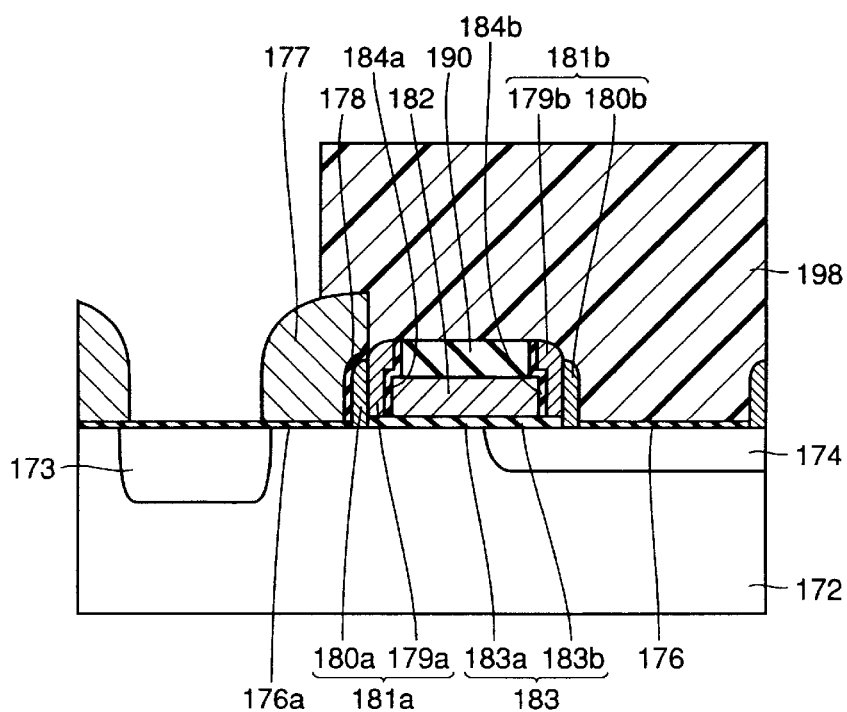

Step 25 (see FIGS. 31 and 32): A resist film 195 is formed on the silicon oxide film 190 to expose ends of the floating gate electrode 182 along a direction Y, as shown in FIG. 31. The resist mask 195 is employed as a mask for selectively removing the side wall films 179 and 180 located on the ends of the floating gate electrode 182 along the direction Y. Thus, the inter-gate 181a formed by the side wall films 179a and 180a and the drain region 181b formed by the side wall films 179b and 180b are electrically isolated from each other in a section along a direction X, as shown in FIG. 32. The inter-gate 181a and the drain region 181b electrically isolated from each other are simultaneously formed in the aforementioned manner. Thereafter a silicon oxide film 176 for defining the first gate insulator film 176a is formed on the surface of the p-type single-crystalline silicon substrate 172.

The inter-gate 181a corresponds to the "third region", the "semiconductor region" or the "first side wall film" of the present invention. The side wall films 179a and 180a correspond to the "second side wall film" and the "third side wall film" in the present invention respectively. The drain region 181b corresponds to the "second region" or the "fourth side wall film" in the present invention. Further, the side wall films 179b and 180b correspond to the "fifth side wall film" and the "sixth side wall film" in the present invention respectively.

Step 26 (see FIG. 33): After removing the resist film 195, another resist film 196 is formed to cover the source region side. The resist film 196 is employed as a mask for implanting As ions, for example, into the surface of the p-type single-crystalline substrate 172 under conditions of about 40 keV and $5E15/cm^2$, thereby forming the n-type drain region 174. This drain region 174 is so formed as to extend substantially to the center of the lower portion of the floating gate electrode 182, in order to increase the area of the portion overlapping with the floating gate electrode 182.

In the silicon oxide film 183, the part held between the floating gate electrode 182 and the p-type single-crystalline silicon substrate 172 defines the second gate insulator film 183a, and the part held between the floating gate electrode 182 and the drain region 174 defines the third insulator film 183b. The drain region 184 corresponds to the "second region" of the present invention. The third insulator film 183b is employed as an insulator film located between the drain regions 184 and 181b and the floating gate electrode 182 along with the aforementioned third insulator film 184b.

Step 27 (see FIG. 34): After removing the resist film 196, a silicon oxide film is formed in a thickness of about 3 to 4 nm. In this silicon oxide film, the part located on the side surfaces of the side wall films 179a and 180a defines the first tunnel insulator film 178. The first tunnel insulator film 178 forms the "first insulator film" of the present invention. Thereafter a doped polysilicon film 77 is formed on the overall surface. This doped polysilicon film 77 is formed by any of the methods described with reference to the step 5. After depositing a non-doped polysilicon film, for example, phosphorus ions are implanted into the non-doped polysilicon film by about $4E15/cm^2$ for supplying conductivity, thereby forming the doped polysilicon film 77.

Step 28 (see FIG. 35): A resist film 197 is formed on a prescribed region of the doped polysilicon film 77 and thereafter employed as a mask for etching the doped polysilicon film 77, thereby forming the control gate electrode 177. This control gate electrode 177 is formed on the p-type single-crystalline silicon substrate 172 through the first gate insulator film 176a. The control gate electrode 177 corresponds to the "first gate electrode" of the present invention.

Step 29 (see FIG. 36): After removing the resist film 197, another resist film 198 is formed to cover the drain region 174. The resist film 198 and the control gate electrode 177 are employed as masks for ion-implanting an n-type impurity into the p-type single-crystalline silicon substrate 172, thereby forming the n-type source region 173. The source region 173 corresponds to the "first region" of the present invention. Thereafter the resist film 198 is removed.

Thereafter the interlayer isolation film 191 is formed as shown in FIG. 21, and the bit line 193 ($BL_0$ to $BL_n$) connecting each drain region 194 is formed through the plug electrode 192.

The memory cell 171 according to the fifth embodiment is completed in the aforementioned manner.

(Sixth Embodiment)

Figure 38:
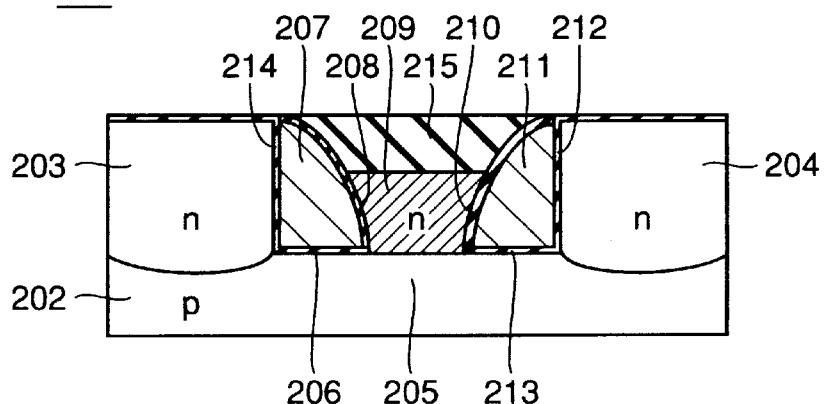
FIG. 38 is a partially fragmented sectional view of a memory cell according to a sixth embodiment of the present invention.

The structure of a memory cell 201 according to a sixth embodiment of the present invention is now described with reference to FIG. 38.

In the memory cell 201 according to this embodiment, an n-type source region 203 and an n-type drain region 204 are respectively formed on both side surfaces of a trench formed in the surface of a p-type single-crystalline silicon substrate 202. The source region 203 and the drain region 204 are formed at a prescribed space to hold a channel region 205 therebetween. In the trench of the p-type single-crystalline silicon substrate 202, a control gate electrode 207 of an n-type polysilicon film and a floating gate electrode 211 of an n-type polysilicon film are formed at a prescribed space. The control gate electrode 207 is defined by a first side wall film formed on the side surface of the source region 203 in a self-aligned manner through a third insulator film 214. The control gate electrode 207 is formed on the channel region 205 through a first gate insulator film 206 of a silicon oxide film.

The floating gate electrode 211 is defined by a second side wall film formed on the side surface of the drain region 204 in a self-aligned manner through a fourth insulator film 212. The floating gate electrode 211 is formed on the channel region 205 through a second gate insulator film 213 of a silicon oxide film.

An inter-gate 209 of an n-type polysilicon film is formed between the control gate electrode 207 and the floating gate electrode 211. The bottom portion of the inter-gate 209 is in contact with the surface of the p-type single-crystalline silicon substrate 207. A first tunnel insulator film 208 is formed between the inter-gate 209 and the control gate electrode 207. A second tunnel insulator film 210 is formed between the inter-gate 209 and the floating gate electrode 207. A fifth insulator film 215 is formed on the upper surface of the inter-gate 209 located between the control gate electrode 207 and the fifth insulator film 215.

The thicknesses of the aforementioned members are set as follows:

the thickness of the first gate insulator film 206: 8 to 10 nm the thickness of the first tunnel insulator film 208: 3 to 4 nm the thickness of the second tunnel insulator film 210: 8 to 10 nm the thickness of the fourth insulator film 212: 8 to 10 nm the thickness of the second gate insulator film 213: 8 to 10 nm the thickness of the third insulator film 214: 8 to 10 nm the width of the inter-gate 209 (the distance between the first and second tunnel insulator films 208 and 210): 20 to 40 (the width of the inter-gate 209 is most desirably set to 20 to 30 nm, so that electrons having energy of 3 to 5 eV used for writing reach the floating gate electrode 211 by at least several %)

The area of the fourth insulator film 212 located between the drain region 204 and the floating gate electrode 211 is larger than that of the second tunnel insulator film 210 located between the inter-gate 209 and the floating gate electrode 211.

In the memory cell 201 according to the sixth embodiment, therefore, the electrostatic capacitance between the drain region 204 and the floating gate electrode 211 is larger than that between the inter-gate 209 and the floating gate electrode 211. Thus, the coupling ratio between the inter-gate 209 and the floating gate electrode 211 is larger than that between the drain region 204 and the floating gate electrode 211. Consequently, the potential of the drain region 204 is readily transmitted to the floating gate electrode 211.

Respective operations (write, erase and read operations) of the memory cell 201 according to the sixth embodiment having the aforementioned structure are similar to those in the first embodiment.

According to the sixth embodiment, the following functions/effects can be attained in addition to those according to the first to fifth embodiments:

(16) The floating gate electrode 211 is embedded in the trench formed in the p-type single-crystalline silicon substrate 202 and formed on the side wall of the drain region 204 through the fourth insulator film 212, whereby the areas of the overlapping portions of the drain region 204 and the floating gate electrode 211 can be readily increased and the electrostatic capacitance between the drain region 204 and the floating gate electrode 211 can consequently be readily increased.

(17) The control gate electrode 207 and the floating gate electrode 211 can be formed in a self-aligned manner with respect to the source region 203 and the drain region 204 respectively with no problem of misalignment of masks in a mask process.

The gate lengths of the control gate electrode 207 and the floating gate electrode 211 formed in a self-aligned manner can be controlled by the thickness of a deposited doped polysilicon film. Thus, the gate lengths can be reduced below the minimum limit size (minimum exposure size) in the mask process and can be more precisely controlled than in the mask process. Consequently, the control gate electrode 207 and the floating gate electrode 211 can be further refined and dispersion of the gate lengths can be suppressed.

(18) The control gate electrode 207 and the floating gate electrode 211 are simultaneously formed as described later, whereby the fabrication process can be simplified.

(19) The inter-gate 209 can be formed in a self-aligned manner with respect to the control gate electrode 207 and the floating gate electrode 211 with no problem of misalignment of masks in a mask process.

(20) The inter-gate 209 can be reliably isolated from the control gate electrode 207 and the floating gate electrode 211 by forming the fifth insulator film 215 on the upper surface of the inter-gate 209 located between the control gate electrode 207 and the floating gate electrode 211.

A method of fabricating the memory cell 201 according to this embodiment is now described with reference to FIGS. 39 to 46.

Step 30 (see FIG. 39): Field isolation films 216 of silicon oxide films are formed on the surface of the p-type single-crystalline silicon substrate 202 by an STI (shallow trench isolation) method or a LOCOS (local oxidation of silicon) method. The p-type single-crystalline silicon substrate 202 corresponds to the "first layer" in the present invention.

Figure 39:
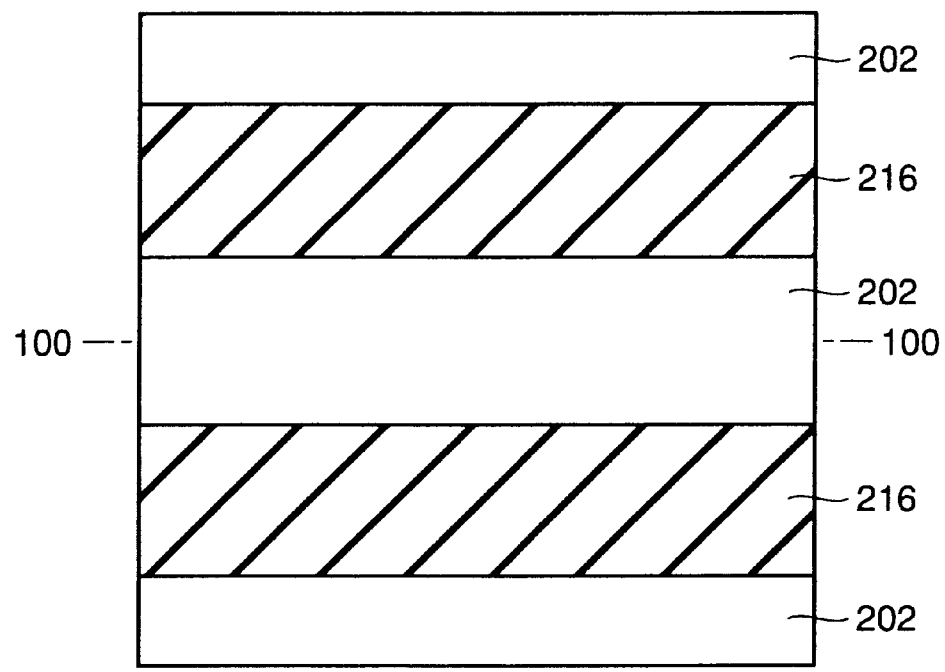
FIGS. 39 to 46 are plan views and sectional views for illustrating a method of fabricating the memory cell according to the sixth embodiment.
Figure 40:
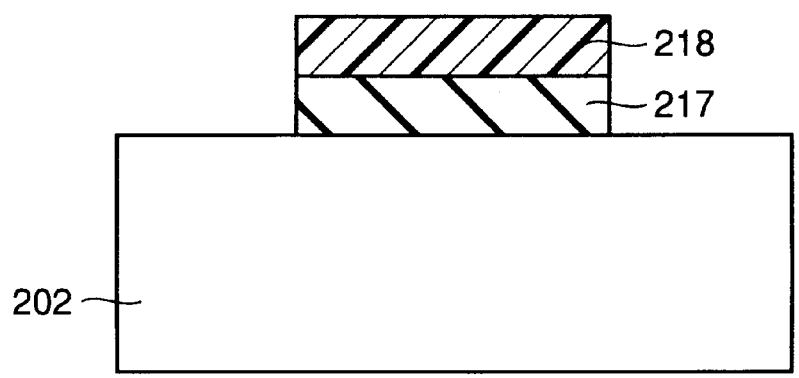
Figure 41:
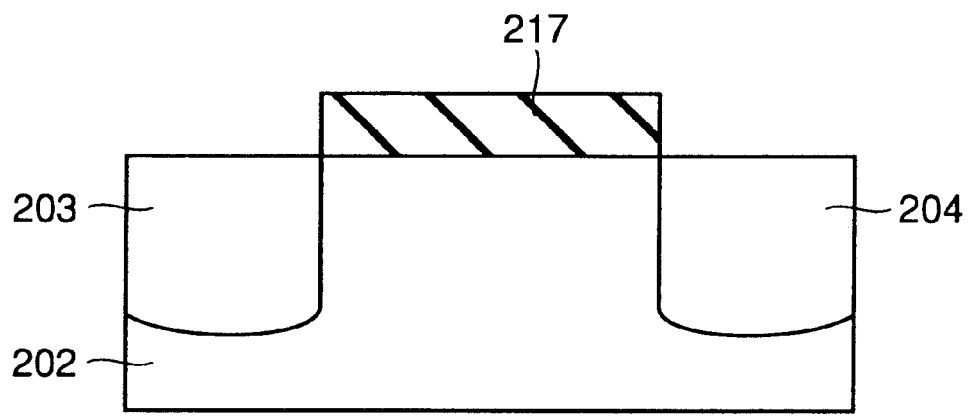
Figure 42:
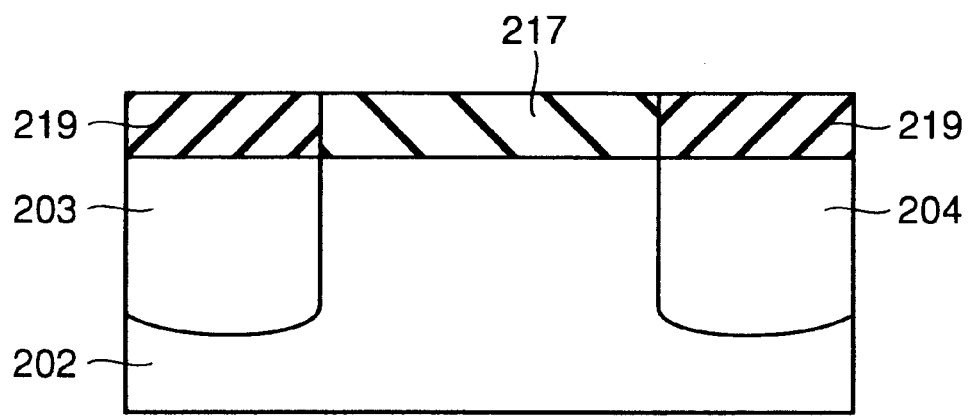
Figure 43:
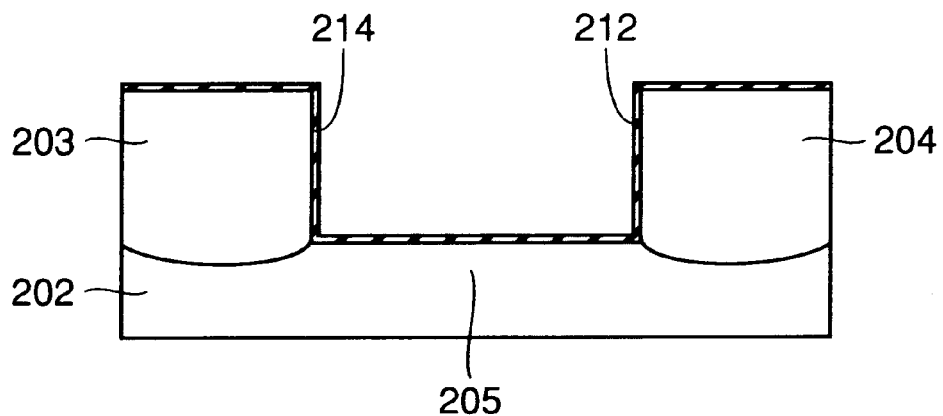
Figure 44:
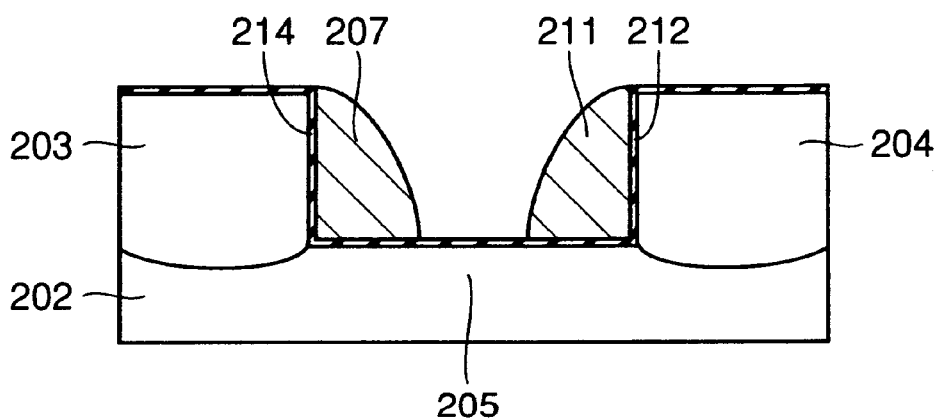
Figure 45:
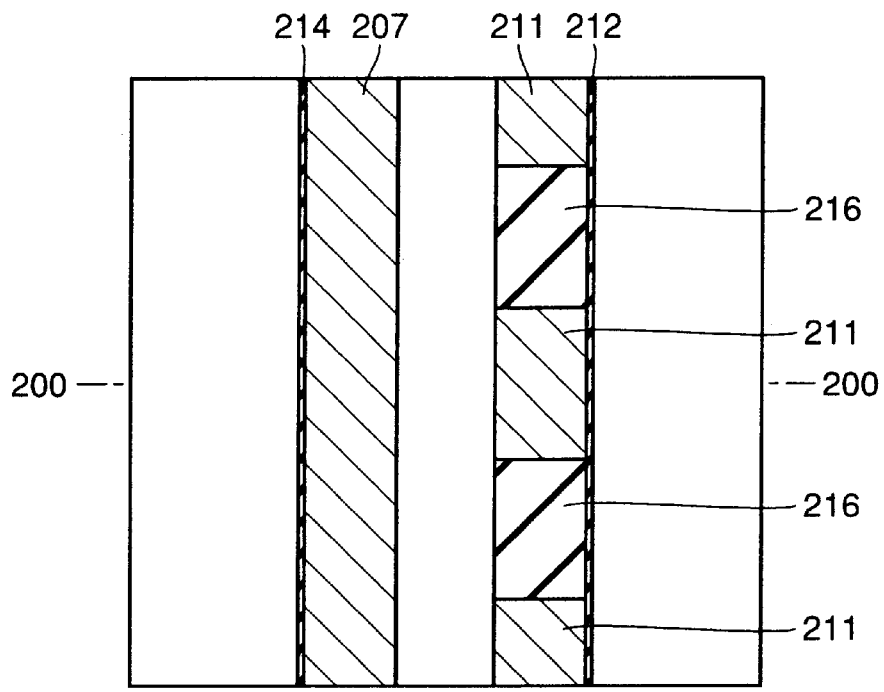
Figure 46:
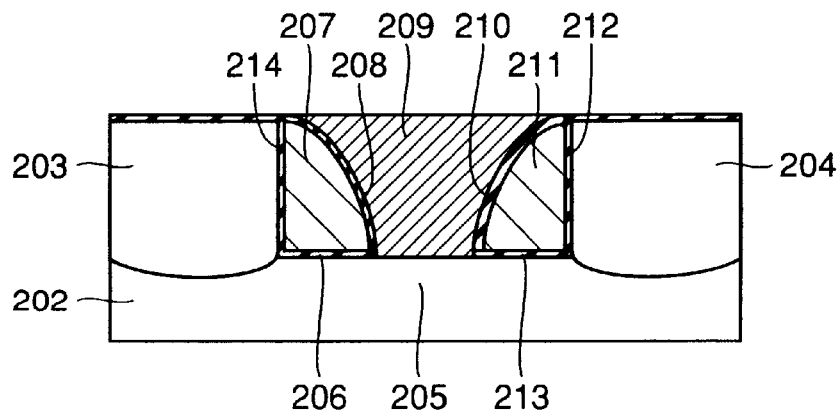

The following description is made with reference to sectional views taken along the line 100—100 in FIG. 39.

Step 31 (see FIG. 40): A silicon oxide film 217 is deposited on the overall surface in a thickness of about 150 nm, and thereafter a resist film 218 is selectively formed on the silicon oxide film 217 by lithography. The resist film 218 is employed as a mask for anisotropically etching the silicon oxide film 217, thereby removing parts of the silicon oxide film 217 not covered with the resist film 218.

Step 32 (see FIG. 41): After removing the resist film 218, the silicon oxide film 217 is employed as a mask for ion-implanting an n-type impurity ($31P^+$, for example) into the p-type single-crystalline silicon substrate 202 under conditions of 100 keV and $5.0E15/cm^{2.}$ Thus, the n-type source region 203 and the n-type drain region 204 are formed. The source region 203 corresponds to the "first region" of the present invention, and the drain region 204 corresponds to the "second region" of the present invention.

Step 33 (see FIG. 42): A silicon nitride film 219 is deposited on the overall surface in a thickness of about 150 nm, and thereafter polished by CMP (chemical mechanical polishing) to expose the silicon oxide film 217 located under the silicon nitride film 219.

Step 34 (see FIG. 43): After removing the silicon oxide film 217, the silicon nitride film 219 is employed as a mask for digging down the p-type single-crystalline silicon substrate 202 by about 150 nm, thereby forming the trench. The silicon nitride film 219 is removed by wet etching, and thereafter a thermal oxide film having a thickness of about 10 nm is formed on the surface of the p-type single-crystalline silicon substrate 202 and in the trench. In this thermal oxide film, the part formed on the side surface of the source region 203 defines the third insulator film 214, and the part formed on the side surface of the drain region 204 defines the fourth insulator film 212.

Step 35 (see FIG. 44): A doped polysilicon film doped with an n-type impurity such as phosphorus is formed on the overall surface in a thickness of about 200 nm, and thereafter the overall surface thereof is anisotropically etched back thereby simultaneously forming the control gate electrode 207 and the floating gate electrode 211 of side wall films. Thus, the control gate electrode 207 and the floating gate electrode 211 can be formed in a self-aligned manner with respect to the source region 203 and the drain region 204 respectively. The control gate electrode 207 corresponds to the "first gate electrode" of the present invention, and the floating gate electrode 211 corresponds to the "second gate electrode" of the present invention.

The doped polysilicon film is formed by any of the methods described with reference to the step 5.

Step 36 (see FIG. 45): A resist film (not shown) is formed on the parts of the floating gate electrode 211 other than those located on the field isolation films 216, and thereafter employed as a mask for anisotropically etching the floating gate electrode 211. Thus, the parts of the floating gate electrode 211 located on the field isolation films 216 are removed for defining the floating gate electrode 211 independent for each memory cell 201.

Step 37 (see FIG. 46): A thermal oxide film having a thickness of about 10 nm is formed on the side surfaces of the control gate electrode 207 and the floating gate electrode 211 by thermal oxidation. In this thermal oxide film, the part formed on the side surface of the control gate electrode 207 defines the first tunnel insulator film 208, and the part formed on the side surface of the floating gate electrode 211 defines the second tunnel insulator film 210. The part of the thermal oxide film formed between the control gate electrode 207 and the floating gate electrode 211 is removed by etchback. Thus, the first gate insulator film 206 and the second gate insulator film 213 are formed.

The first and second tunnel insulator films 208 and 210 are also slightly removed by this etchback so that the thicknesses thereof are about 8 nm respectively. Further, the thickness of the first tunnel insulator film 208 is reduced to about 3 nm by masking the remaining portions and thereafter etching back the first tunnel insulator film 208. The first tunnel insulator film 208 corresponds to the "first insulator film" of the present invention, and the second tunnel insulator film 210 corresponds to the "second insulator film" of the present invention.

A doped polysilicon film doped with an n-type impurity such as phosphorus is deposited on the overall surface and thereafter embedded in the trench by etchback or CMP. The doped polysilicon film is formed by any of the methods described with reference to the step 5. Thus, the inter-gate 209 of an n-type doped polysilicon film can be formed in a self-aligned manner with respect to the control gate electrode 207 and the floating gate electrode 211. The bottom surface of the inter-gate 209 is in contact with the p-type single-crystalline silicon substrate 202. The inter-gate 209 corresponds to the "third region" or the "semiconductor region" of the present invention.

Thereafter the upper surface of the inter-gate 209 of a doped polysilicon film is thermally oxidized under conditions of about 900° C. and for about 30 minutes by wet oxidation, thereby forming the fifth insulator film 215. The fifth insulator film 215 can reliably isolate the control gate electrode 207 and the floating gate electrode 211 from the inter-gate 209.

In the step 37, the first and second tunnel insulator films 208 and 210 are more readily etched back on the upper portions of the side surfaces of the control gate electrode 207 and the floating gate electrode 211 of side wall films than on the lower portions. When the first and second tunnel insulator films 208 and 210 are etched back, therefore, the portions located on the upper portions of the side surfaces of the control gate electrode 207 and the floating gate electrode 211 may disappear. In this case, the inter-gate 209 disadvantageously electrically comes into contact with the control gate electrode 207 and the floating gate electrode 211.

According to the sixth embodiment, the fifth insulator film 215 is formed on the upper surface of the inter-gate 209, so that the inter-gate 209 can be reliably isolated from the control gate electrode 207 and the floating gate electrode 211 also when the portions of the first and second tunnel insulator films 208 and 210 located on the upper portions of the side surfaces of the control gate electrode 207 and the floating gate electrode 211 disappear.

The mean value of the width of the inter-gate 209 (the distance between the first and second tunnel insulator films 208 and 210) is about 30 nm. The width of the inter-gate 209 is properly in the range of not more than 50 nm, desirably not more than 30 to 40 nm, i.e., not more than the mean free path of carriers, and more desirably in the range of 20 to 30 nm. If the width of the inter-gate 209 exceeds 50 nm, write efficiency and erase efficiency tend to lower.

The memory cell 201 according to the sixth embodiment is thus completed.

Thereafter an interlayer isolation film (not shown) is formed on each memory cell 201. Word lines $WL_0$ to $WL_n$ connecting each control gate electrode 207, bit lines $BL_0$ to $BL_n$ connecting each drain region 204 and a source line SL connecting each source region 203 in common are formed for forming a memory cell array 50.

(Seventh Embodiment)

A seventh embodiment of the present invention is different in structure and operating method from the aforementioned first to sixth embodiments. However, data writing is performed through an n-type impurity region (third region), similarly to the first to sixth embodiments. The seventh embodiment is now described.

Figure 47:
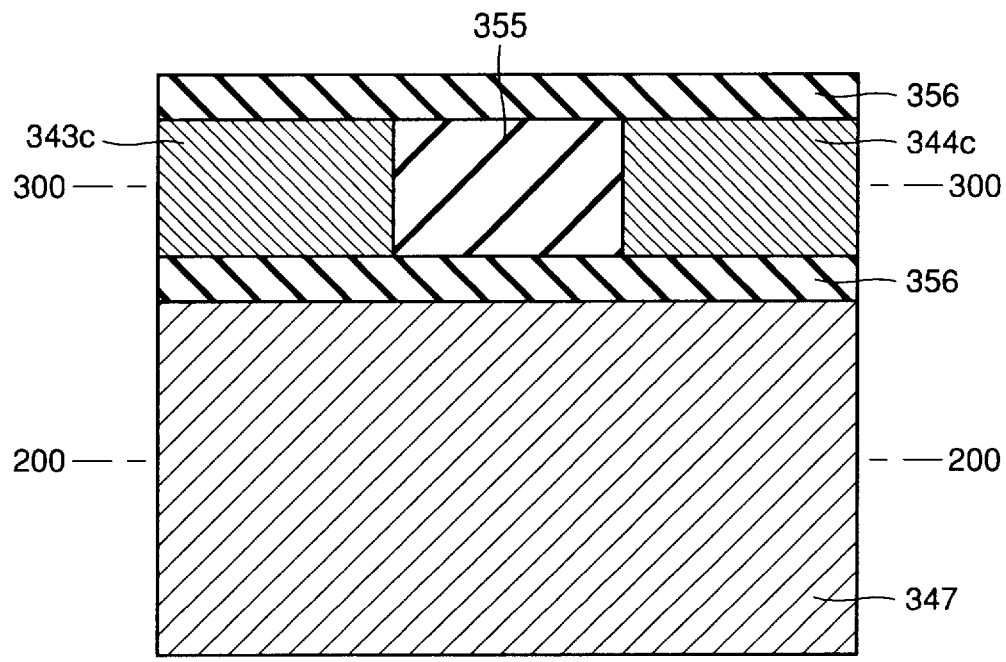
FIG. 47 is a plan view of a memory cell according to a seventh embodiment of the present invention.
Figure 48:
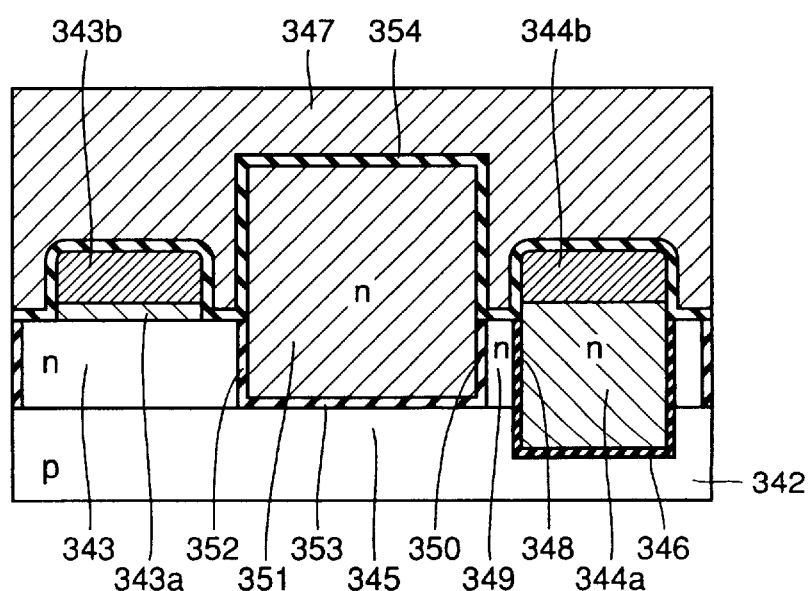
FIG. 48 is a sectional view taken along the line 200—200 in FIG. 47.

According to the seventh embodiment, a source region 343 of an n-type impurity region is formed on a p-type single-crystalline silicon substrate 342, as shown in FIGS. 47 and 48. A drain region 344a of an n-type polysilicon film is formed at a prescribed space from the source region 343. The n-type drain region 344a is formed on the p-type single-crystalline silicon substrate 342 through an insulator film 346. A floating gate electrode 351 is formed between the drain region 344a and the source region 343. The floating gate electrode 351 is formed on the p-type single-crystalline silicon substrate 342 through a gate insulator film 353. A channel region 345 is formed under the gate insulator film 353.

An n-type impurity region 349 is formed between the floating gate electrode 351 and the drain region 344a. A first tunnel insulator film 348 is formed between the n-type impurity region 349 and the drain region 344a. A second tunnel insulator film 350 is formed between the n-type impurity region 349 and the floating gate electrode 351. A third tunnel insulator film 352 is formed between the floating gate electrode 351 and the source region 343.

A source region 343a of an n-type polysilicon film and another source region 343b of a silicide film are formed on the source region 343. A drain region 344b of a suicide film is formed on the drain region 344a. A control gate electrode 347 of a p-type polysilicon film is formed on the source region 343b, the floating gate electrode 351 and the drain region 344b through an insulator film 354. The control gate electrode 347 is formed to extend perpendicularly to the longitudinal direction of the source region 343 and the drain region 344a. The electrostatic capacitance between the control gate electrode 347 and the floating gate electrode 351 is set larger than that between the remaining portions.

Figure 49:
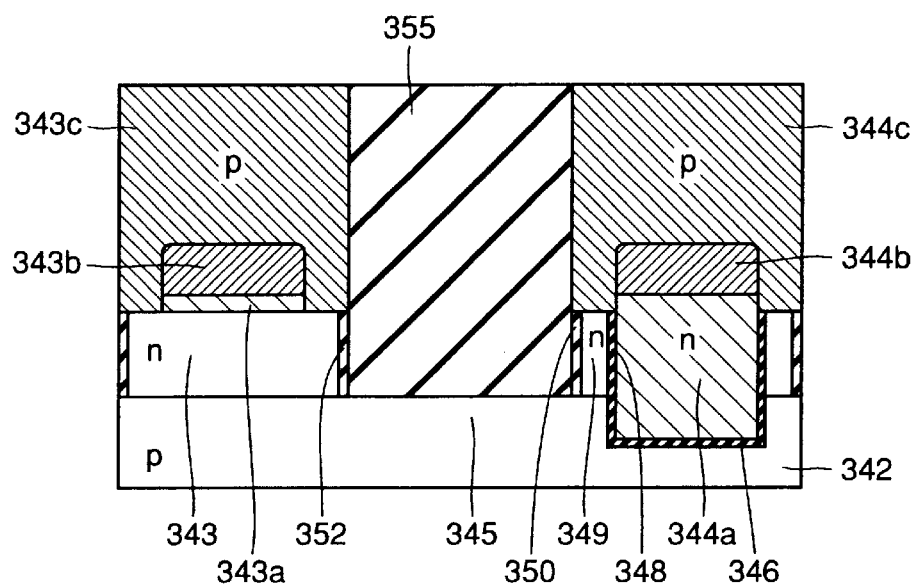
FIG. 49 is a sectional view taken along the line 300—300 in FIG. 47.
Figure 50:
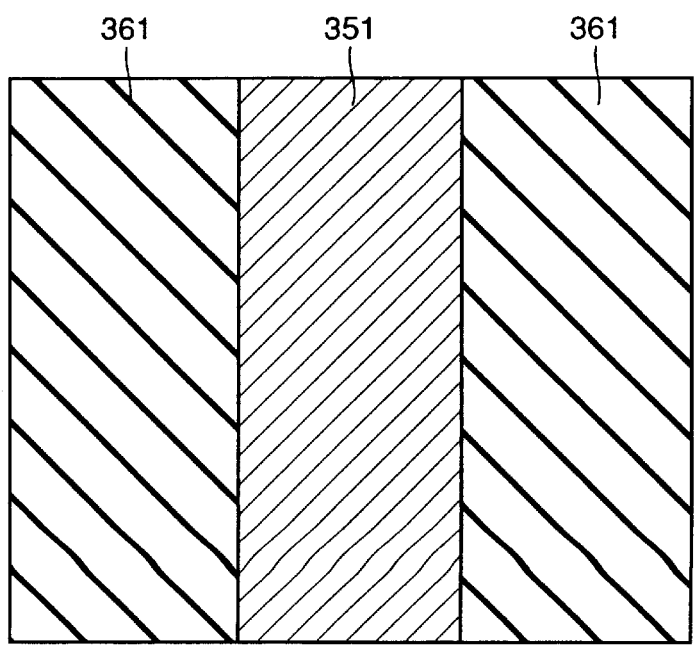
FIGS. 50 to 60 are plan views and sectional views for illustrating a method of fabricating the memory cell according to the seventh embodiment.
Figure 51:
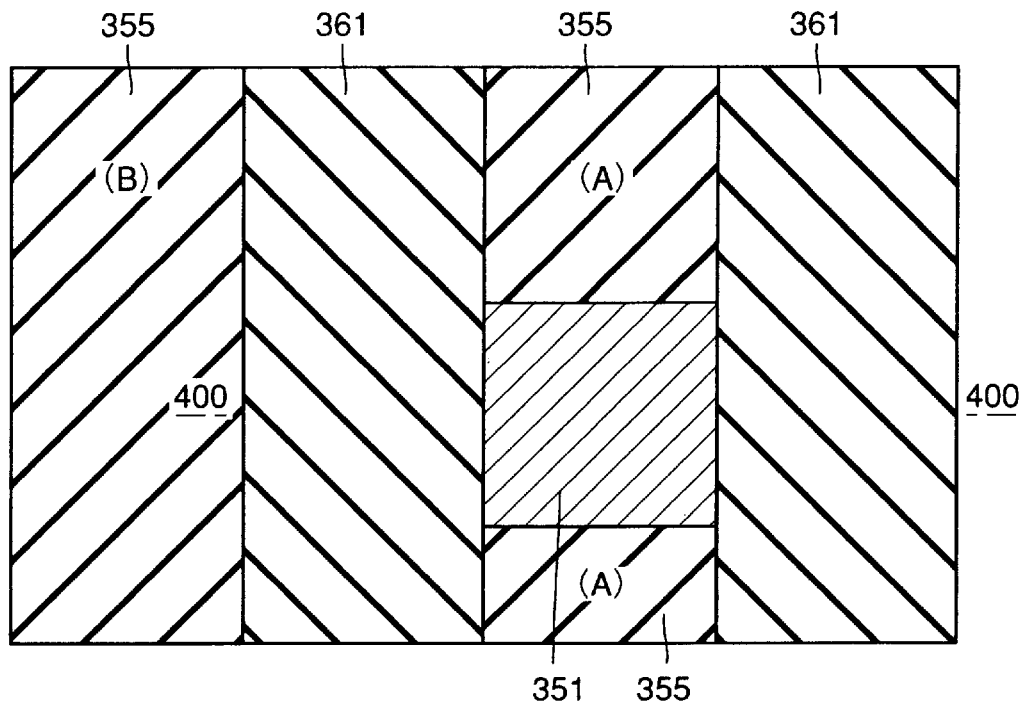
Figure 52:
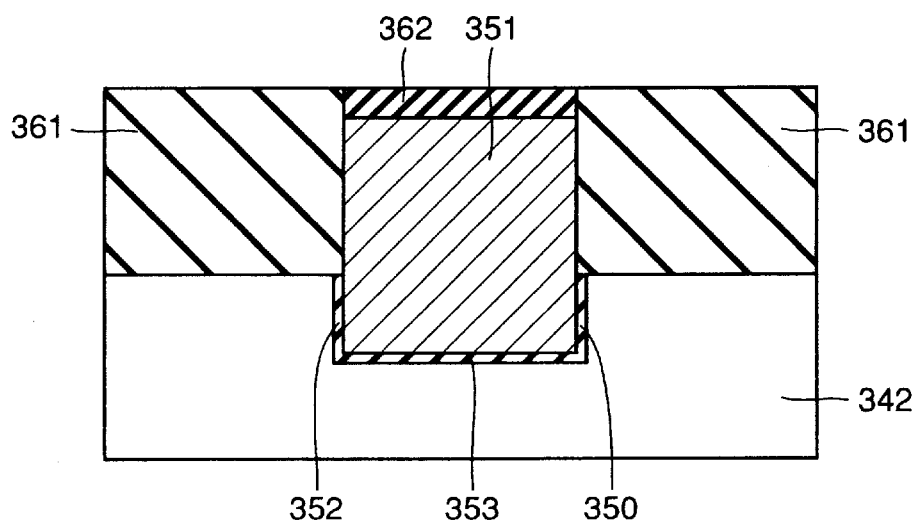
Figure 53:
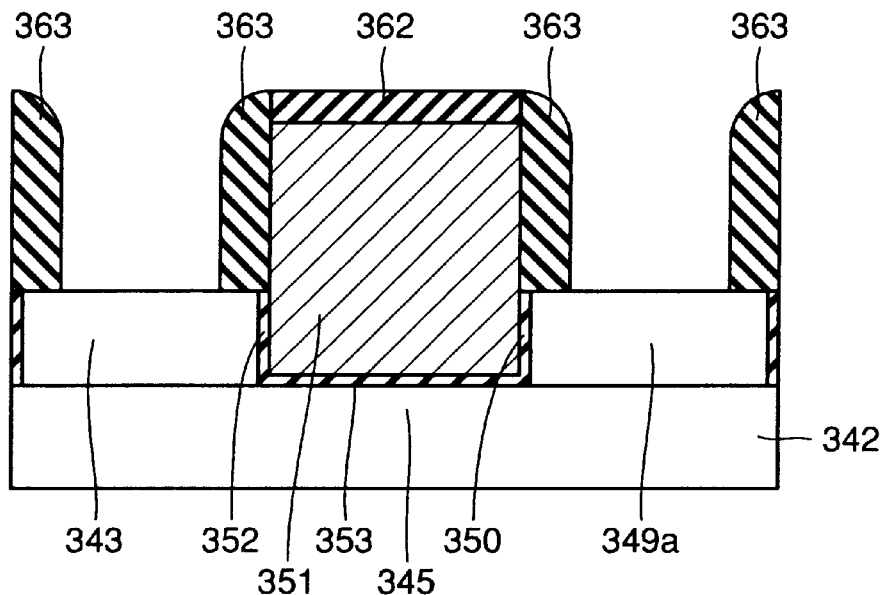
Figure 54:
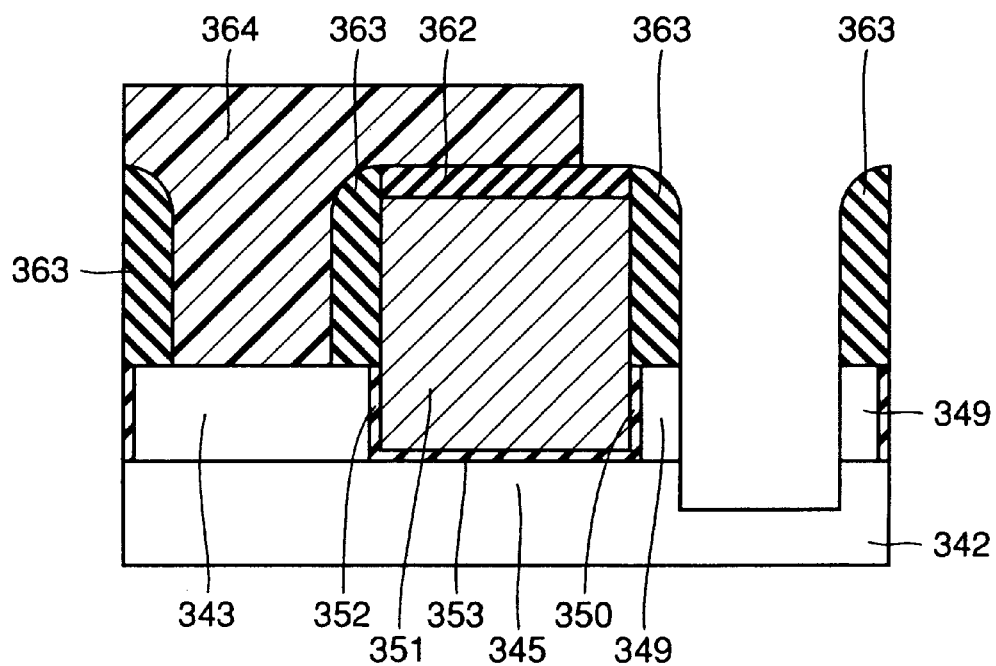
Figure 55:
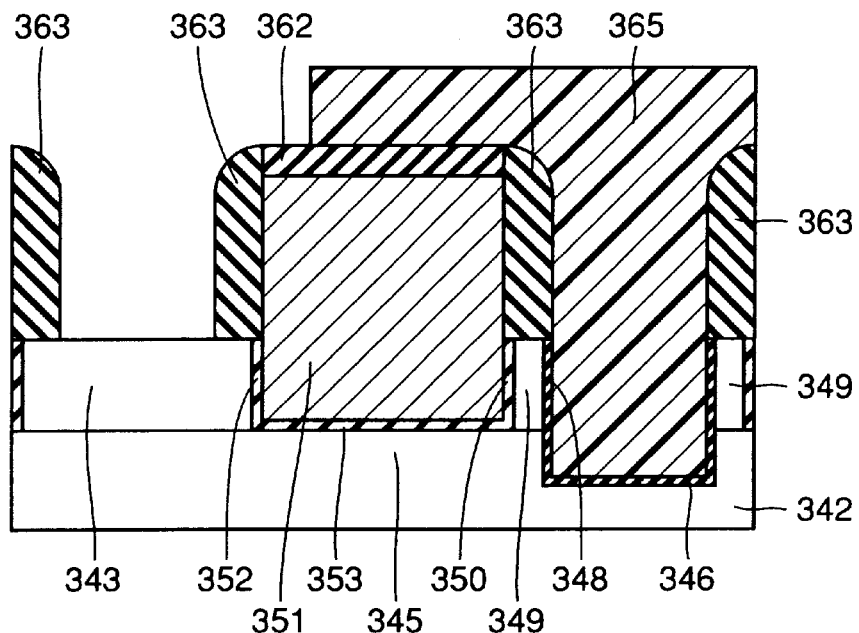
Figure 56:
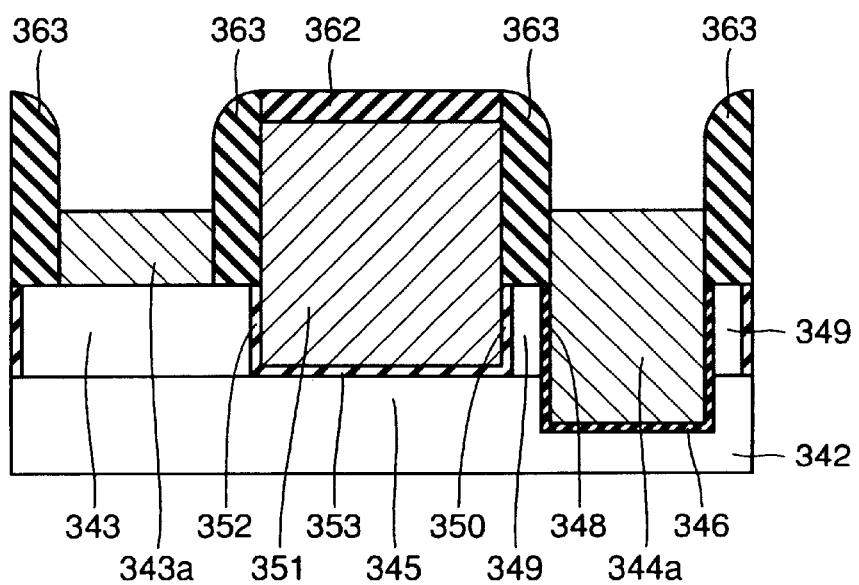
Figure 57:
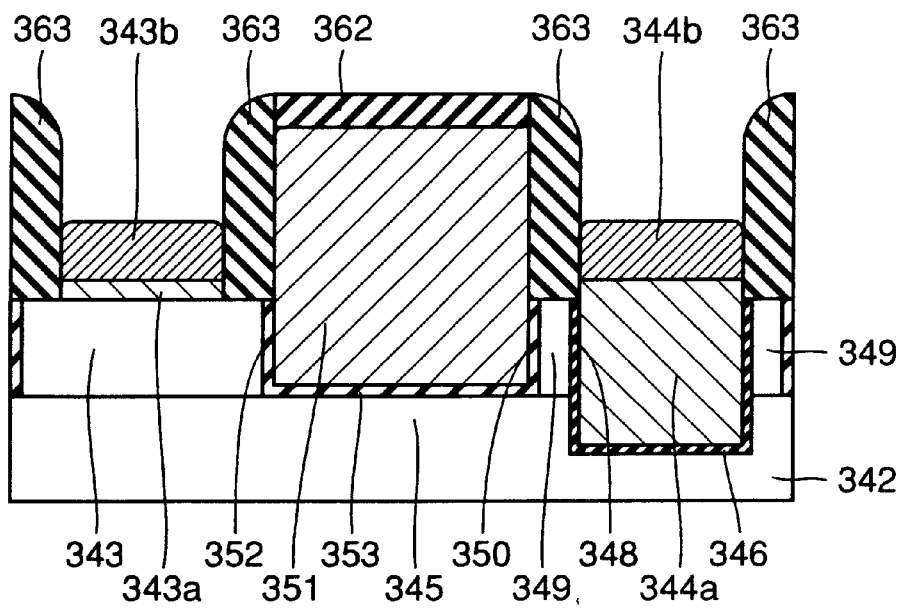
Figure 58:
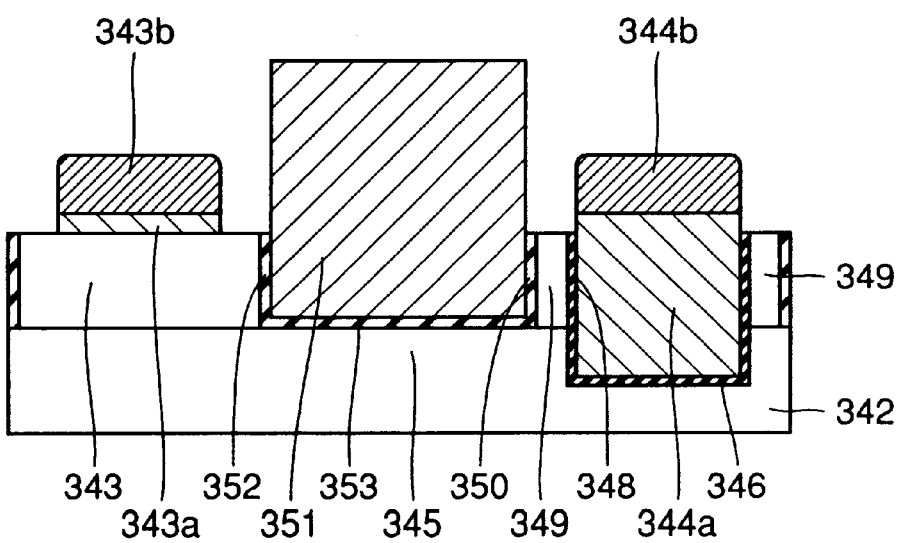
Figure 59:
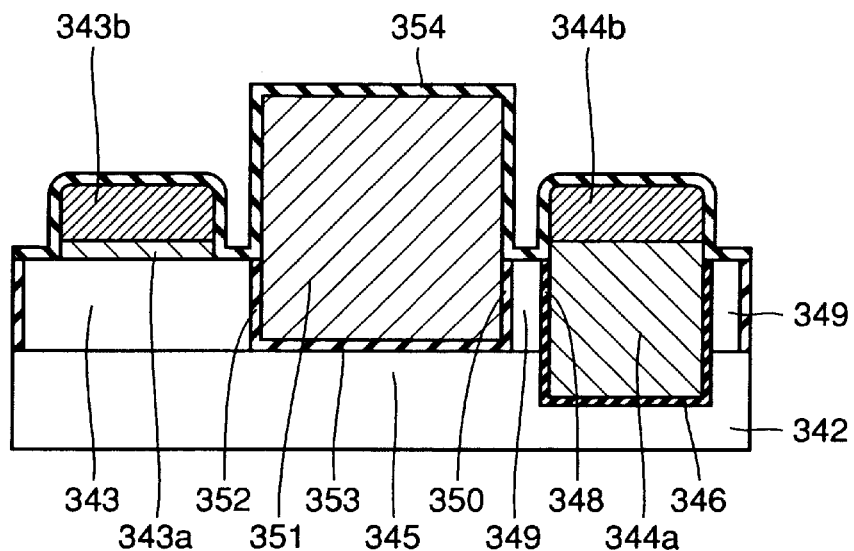
Figure 60:
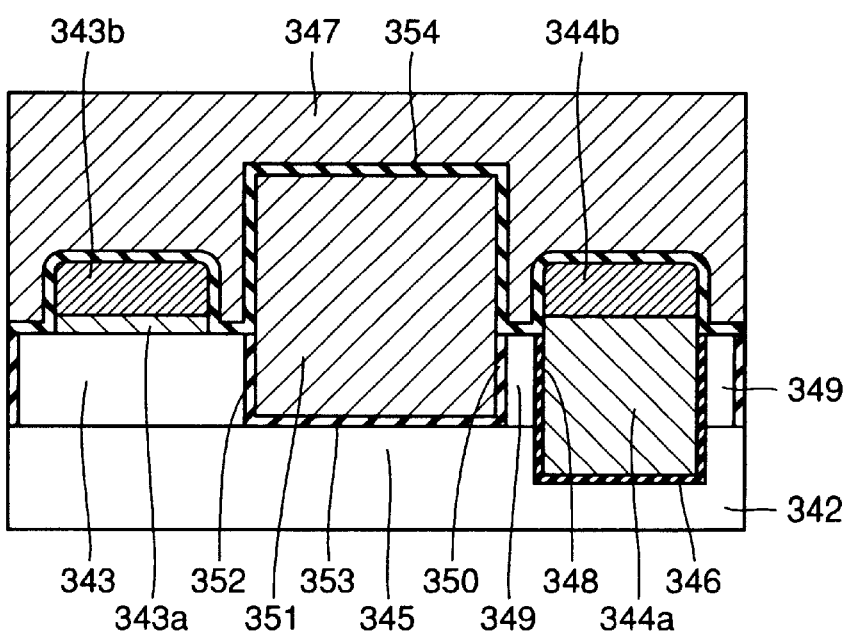

As shown in FIG. 47, side wall spacers 356 of oxide films are formed on the side walls of the control gate electrode 347. A silicon oxide film 355 for isolating floating gate electrodes 351 of adjacent memory cells is formed between the side wall spacers 356. In the portion located between the side wall spacers 356, a source region 343c of a p-type polysilicon film is formed on the n-type source region 343 through the source region 343a of an n-type polysilicon film and the source region 343b of a silicide film, as shown in FIGS. 47 and 49.

A drain region 344c of a p-type polysilicon film is formed on the drain region 344a of an n-type polysilicon film and the n-type impurity region 349. A diode of a p-n junction is formed on the interface between the n-type impurity region 349 and the n-type drain region 344c. The drain region 344a of an n-type polysilicon film and the drain region 344c of a p-type polysilicon film are connected with each other through the drain region 344b of a silicide film.

Respective operations (write, erase and read operations) of the memory cell according to the seventh embodiment having the aforementioned structure are now described. A source voltage Vs is applied to the source regions 343 to 343c through a source line SL. A drain voltage Vd is applied to the drain regions 344a to 344c through bit lines $BL_0$ to $BL_n$. A control gate voltage Vcg is applied to the control gate electrode 347 through word lines $WL_1$ to $WL_n$. A substrate voltage Vsub is applied to the substrate 342.

According to the seventh embodiment, operating voltages in the write and erase operations are identical to each other except only the control gate voltage Vcg. In other words, the write and erase operations can be controlled only with a positive/negative voltage applied to the control gate electrode 347 in the seventh embodiment.

(Write Operation)

Before performing the write operation, the floating gate electrode 351 is in an erased state (where electrons are extracted), and the floating gate electrode 351 in the erased state keeps a potential of about 0 V in the seventh embodiment. In the seventh embodiment, it is assumed that the threshold voltage Vt of a transistor having the floating gate electrode 351 as a gate is 0.5 V.

In the write operation, the source voltage Vs is set to 3 V, the drain voltage Vd is set to −3 V, the control gate voltage Vcg is set to 3 V, and the substrate voltage Vsub is set to 0 V as the operating voltages of the memory cell.

The control gate electrode 347 and the floating gate electrode 351 are strongly electrostatically coupled with each other as described above, and hence it is assumed that about 80% of the potential of the control gate electrode 347 is transmitted to the floating gate electrode 351. In this case, the potential of the floating gate electrode 351 increases from 0 V to about 2.5 V. Thus, the transistor having the floating gate electrode 351 as the gate is turned on and the n-type impurity region 349 communicates with the source region 343. Therefore, the potential of the n-type impurity region 349 reaches about 2 V (voltage level-shifted from the potential of the floating gate electrode 351 by the aforementioned threshold voltage Vt with an upper limit of the source voltage Vd).

On the other hand, the voltage of −3 V is applied to the drain region 344a and hence a high electric field is generated between the n-type impurity region 349 and the drain region 344a. Consequently, a Fowler-Nordheim tunnel current (hereinafter referred to as an FN tunnel current) flows and electrons move from the drain region 344a to the n-type impurity region 349. Electrons permeating through (tunneling) the barrier of the first tunnel insulator film 348 located between the drain region 344a and the n-type impurity region 349 are accelerated by the high electric field generated between the n-type impurity region 349 and the drain region 344a, and injected into the floating gate electrode 351 through the second tunnel insulator film 350. Consequently, the floating gate electrode 351 stores the electrons for writing data.

The writing is automatically terminated, similarly to the first embodiment.

Similarly to the first embodiment, the width of the n-type impurity region 349 is set to 30 nm, which is smaller than the mean free path of electrons. Therefore, the electrons permeating through the barrier of the first tunnel insulator film 348 located between the drain region 344a and the n-type impurity region 349 are accelerated to at least 3.2 eV in a short distance not more than the mean free path (=about 30 to 40 nm).

Therefore, almost all electrons permeating through the barrier of the first tunnel insulator film 348 acquire energy for passing through the barrier (=3.2 eV) of the second tunnel insulator film 350 and turn into hot electrons, which are injected into the floating gate electrode 351 in an extremely high probability without remaining in the n-type impurity region 349.

(Erase Operation)

In the erase operation, the source voltage Vs is set to 3 V, the drain voltage Vd is set to −3 V, the control gate voltage Vcg is set to −6 V and the substrate voltage (well voltage) Vsub is set to 0 V as the operating voltages of the memory cell.

In the erase operation, the control gate electrode 347 and the floating gate electrode 351 are strongly electrostatically coupled with each other and hence the floating gate electrode 351 reaches a negative potential of about −5 V, assuming that about 80% of the potential of the control gate electrode 347 is transmitted to the floating gate electrode 351.

On the other hand, the potential of the source region 343 is 3 V and hence a high electric field of about 10 MV is generated in the third tunnel insulator film 352 located between the source region 343 and the floating gate electrode 351. Consequently, an FN tunnel current flows and electrons are extracted from the floating gate electrode 351 to the source region 343, for erasing data.

(Read Operation)

The read operation in the seventh embodiment is similar to that in the first embodiment. The source voltage Vs is set to 0 V, the drain voltage Vd is set to 3 V, the control gate voltage Vcg is set to 3 V and the substrate voltage (well voltage) Vsub is set to 0 V as the operating voltages of the memory cell.

A current (cell current) flowing between the source region 343 and the drain region 344a is detected thereby determining whether or not the floating gate electrode 351 stores electrons. Thus, data stored in the memory cell can be read.

According to the seventh embodiment, the following functions/effects can be attained in addition to those according to the first to sixth embodiments:

(21) In the seventh embodiment, the write and erase operations can be controlled only with a positive/negative voltage applied to the control gate electrode 347. Thus, batch rewriting is enabled for simultaneously performing erasing and writing on 1000 to 4000 memory cells connected to control gate electrodes 347 respectively, which are subjected to writing after batch erasing in the conventional flash memory.

In other words, a positive voltage (3 V) and a negative voltage (–3 V) are applied to the source region 343 and the drain region 344a respectively while applying a negative voltage (–6 V) and a positive voltage (3 V) to the control gate electrode 347 of a memory cell subjected to erasing and the control gate electrode 347 of a memory cell subjected to writing respectively when rewriting data. Thus, a number of memory cells held between the source region 343 and the drain region 344a are simultaneously subjected to erasing and writing, while memory cells requiring no data change hold the data as such.

Thus, batch rewriting is enabled for simultaneously performing writing and erasing, whereby the write and erase operations can be simplified and consequently performed at a high speed. The memory cells requiring no rewriting automatically hold the data as such without erasing the data and newly rewriting the same data, whereby stress applied to the tunnel insulator films is reduced. Thus, the lives of the tunnel insulator films are increased and the number of rewriting times can consequently be increased.

(22) The electrostatic capacitance between the control gate electrode 347 and the floating gate electrode 351 is set larger than that between the remaining portions. Thus, the voltage applied to the control gate electrode 347 is transmitted to the floating gate electrode 351 due to the electrostatic coupling between the control gate electrode 347 and the floating gate electrode 351. Consequently, the potential of the floating gate electrode 351 can be readily controlled by simply controlling the potential of the control gate electrode 347.

(23) The n-type impurity region 349 and the drain region 344a are connected with each other through the diode formed by the p-n junction. Thus, the potential difference between the drain region 344a and the n-type impurity region 349 can be held when a negative voltage is applied to the drain region 344a and a positive or ground voltage is transmitted to the n-type impurity region 349 in writing. When a positive voltage is applied to the drain region 344a in reading, a current can be fed between the drain region 344a and the n-type impurity region 349 with no or low resistance.

(24) The memory cell region shown in FIG. 48 has no contact region, whereby the degree of integration of the memory cell region can be improved.

A method of fabricating the memory cell according to the seventh embodiment is now described with reference to FIGS. 50 to 60.

Step 38 (see FIG. 50): A silicon nitride film 361 is formed on the substrate 342 and thereafter worked into the form of stripes. The exposed substrate 342 is dug down by about 100 nm for forming a groove, and thereafter oxidized for forming a silicon oxide film having a thickness of about 10 nm on the inner surface of the groove of the substrate 342. In this silicon oxide film, the part formed on the side surface of the groove closer to the drain region defines the second tunnel insulator film 350 (see FIG. 48) and the part formed on the side surface of the groove closer to the source region defines the third tunnel insulator film 352, while the part formed on the bottom surface of the groove defines the gate insulator film 353. The second tunnel insulator film 350 corresponds to the "second insulator film" of the present invention, and the third tunnel insulator film 352 corresponds to the "third insulator film" of the present invention. A polysilicon film 351 is embedded in the groove of the substrate 342.

Step 39 (see FIG. 51): The polysilicon film 351 embedded in the groove is anisotropically etched thereby forming grooves (A) for floating gate isolation and a groove (B) for source isolation. Silicon oxide films 355 are embedded in the grooves (A) and (B). The floating gate electrode 351 of a polysilicon film isolated for each memory cell is formed by the anisotropic etching of the polysilicon film 351. The floating gate electrode 351 defines the "second gate electrode" of the present invention.

Step 40 (see FIG. 52): The upper surface of the floating gate electrode 351 of a polysilicon film is oxidized thereby forming a silicon oxide film 362 having a thickness of about 30 nm.

Step 41 (see FIG. 53): The silicon nitride film 361 is removed and thereafter another silicon nitride film is deposited on the overall surface. The deposited silicon nitride film is anisotropically etched back thereby forming side wall spacers 363 having a thickness of 20 to 30 nm on the side surfaces of the floating gate electrode 351. The side wall spacers 363 are employed as masks for ion-implanting an n-type impurity such as arsenic or phosphorus into the substrate 342 and thereafter heat treatment is performed for forming the n-type source region 343 and an impurity region 349a for defining the n-type impurity region 349. The n-type source region 343 defines the "first region" of the present invention.

Step 42 (see FIG. 54): A resist film 364 is formed to cover the n-type source region 343 and thereafter the resist film 364, the silicon oxide film 362 and the side wall spacers 363 are employed as masks for digging down the substrate 342 by about 150 nm by anisotropic etching and forming a groove. Thus, the n-type impurity region 349 is formed. The n-type impurity region 349 defines the "first region" of the present invention.

Step 43 (see FIG. 55): A silicon oxide film having a thickness of about 2 nm to 3 nm is formed on the inner surface of the groove of the substrate 342 by thermal oxidation. In this silicon oxide film, the part formed on the bottom surface of the groove of the substrate 342 defines the insulator film 346, and the part formed on the side surface of the n-type impurity region 349 defines the first tunnel insulator film 348. The first tunnel insulator film 348 corresponds to the "first insulator film" of the present invention. Thereafter a resist film 365 is formed to cover the groove of the substrate 342, and the resist film 365, the silicon oxide film 362 and the side wall spacers 363 are employed as masks for removing a natural oxide film formed on the surface of the source region 343 by anisotropic etching.

Step 44 (see FIG. 56): The resist film 365 is removed and thereafter a polysilicon film is deposited on the overall surface. An n-type impurity is ion-implanted into the polysilicon film, followed by heat treatment. Thereafter the polysilicon film is etched back thereby forming the n-type drain region 344a of a polysilicon film filling up the groove of the substrate 342 and the n-type source region 343a of a polysilicon film located on the source region 343. The drain region 344a defines the "second region" of the present invention.

Step 45 (see FIG. 57): The surfaces of the source region 343a and the drain region 344a are silicified through a salicide (self-aligned suicide) process, thereby forming metal silicide films 343b and 344b of WSi or the like on the source region 343a and the drain region 344a respectively.

Step 46 (see FIG. 58): The silicon oxide film 362 and the side wall spacers 363 are removed.

Step 47 (see FIG. 59): A silicon oxide film 354 of about 10 to 15 nm in thickness is formed on the overall surface by thermal oxidation or CVD.

Step 48 (see FIG. 60): A polysilicon film is deposited on the overall surface and thereafter a p-type impurity is ion-implanted into the polysilicon film. Heat treatment is performed and thereafter the polysilicon film is patterned thereby forming the control gate electrode 347 extending in the direction perpendicular to the source and drain direction. The control gate electrode 347 corresponds to the "first gate electrode" of the present invention.

Thereafter the side wall spacers 356 of oxide films are formed on the side surfaces of the control gate electrode 347, as shown in FIG. 47. A polysilicon film is deposited on the overall surface and thereafter a p-type impurity (e.g., B) is ion-implanted into the polysilicon film. After performing heat treatment, the polysilicon film is anisotropically etched back thereby forming the source region 343c and the drain region 344c of p-type polysilicon films embedded between the side wall spacers 356. Further, the upper portions of the control gate electrode 347 of a p-type polysilicon film and the source region 343c and the drain region 344c of p-type polysilicon films are silicified by the salicide technique.

The memory cell according to the seventh embodiment is completed in the aforementioned manner.

Thereafter an interlayer isolation film (not shown) is formed on each memory cell, similarly to the first embodiment. Word lines $WL_0$ to $WL_n$ connecting each control gate electrode 347, bit lines $BL_0$ to $BL_n$ connecting each drain region 344a and a source line SL connecting each source region 343 in common are formed thereby forming a memory cell array 50.

In this case, the insulator film 346 located between the drain region 344a and the substrate 342 preferably has a thickness capable of isolating the drain region 344a and the substrate 342 from each other. Thus, even if the drain region 344a and the substrate 342 are forward-biased when the n-type impurity region 349 and the drain region 344a are reverse-biased through a Schottky barrier, the insulator film 346 can sufficiently isolate the drain region 344a and the substrate 342 from each other. In order to form the insulator film 346, the substrate 342 is first dug down for forming the drain region 344a and thereafter an oxide film is thickly deposited. The oxide film is etched back thereby forming the insulator film 346 while leaving the oxide film only on the bottom portion of the substrate 342. Thereafter the side surface of the substrate 342 is oxidized thereby forming the first tunnel insulator film 348 having a small thickness.

Although the present invention has been described and illustrated in detail, it is clearly understood that the same is by way of illustration and example only and is not to be taken by way of limitation, the spirit and scope of the present invention being limited only by the terms of the appended claims.

For example, the aforementioned embodiments may be modified as follows, for attaining functions/effects similar to those described above:

(i) In each of the aforementioned first to sixth embodiments, the conductivity type of the p-type single-crystalline silicon substrate is changed to an n type while changing the conductivity type of the n-type source region, the n-type drain region and the n-type impurity region (inter-gate) to a p type. Thus, electrons can be moved from the control gate electrode also when further reducing the potential difference between any of these regions and the control gate electrode, so that further reduction of the voltage can consequently be implemented.

(ii) In the erase operation in each of the aforementioned first to sixth embodiments, the drain voltage Vd is set to 0 V and thereafter the drain region (bit line) is held in an open state.

As hereinabove described, an electric field of about 10 MV is applied to the second tunnel insulator film located between the floating gate electrode and the n-type impurity region (inter-gate) in an initial stage of the erase operation, for continuously performing erasing (extracting electrons to the n-type impurity region). The electrons are continuously extracted from the floating gate electrode with progress of the erase operation, and hence the potential of the floating gate electrode gradually increases. The channel region located under the floating gate electrode enters an ON state when the potential of the floating gate electrode exceeds the threshold voltage Vt. Thus, electrons are extracted also from the drain region, whose potential also increases. The potential difference between the floating gate electrode and the n-type impurity region decreases. Consequently, electrons contained in the floating gate electrode cannot permeate through the barrier of the second tunnel insulator film, so that the erase operation is not performed any more.

In other words, the erase operation is automatically terminated and hence no circuit is separately required for detecting termination of the erase operation but simplification of the structure in a peripheral circuit, reduction of the area and low power consumption can be implemented. Further, erase levels of respective memory cells are substantially uniformalized.

(iii) In the erase operation in each of the aforementioned first to sixth embodiments, the drain voltage Vd is set to 0 V and thereafter the drain region (bit line) is connected to the sense amplifier group 61. As described with reference to the above item (i), the potential of the drain region increases with the progress of the erase operation, and hence the sense amplifier group 61 detects that the potential of the bit line $BL_n$ changes in excess of a prescribed value for determining termination of the erase operation.

(iv) When performing the erase operation in units of word lines in the above item (iii), termination of the erase operation is determined by detecting potential change of a plurality of bit lines. Memory cells connected to a single word line terminate the erase operation at different times due to dispersion of the characteristics thereof. In consideration of this dispersion, therefore, potential change of not a single but a plurality of bit lines is checked.

(v) In the erase operation in each of the first to sixth embodiments, the source voltage Vs is set to 6 V, the drain voltage Vd is set to −3 V, the control gate voltage Vcg is set to 6 V and the substrate voltage (well voltage) Vsub is set to −3 V as the operating voltages of the memory cell.

Thus, the source voltage Vs and the control gate voltage Vcg for the erase operation can be set low by setting the substrate (well) to a minus potential.

The power supply voltage for an electronic apparatus is recently lowered for attaining low power consumption, and the power supply voltage for a semiconductor integrated circuit is generally not more than 3.3 V. According to the first embodiment, the scale of a step-up circuit for generating the voltages for the erase operation of the memory cell 1 can be reduced also with respect to such a low voltage.

(vi) While electrons are injected into the floating gate electrode in the write operation and extracted from the floating gate electrode in the erase operation in each of the aforementioned first to seventh embodiments, such operations may be reversed. In other words, the state where the floating gate electrode stores electrons may be defined as the erased state of the memory cell, and the state where the floating gate electrode stores no electrons may be defined as the written state of the memory cell.

(vii) In the read operation according to the second embodiment, the quantity of the electrons stored in the floating gate electrode 11 as well as the potential difference between the source region 3 and the drain region 4 required for feeding a cell current vary with the value ("00", "01", "10" or "11") of each data. In consideration of this, the source-to-drain potential difference for feeding a cell current is previously defined for each data value for successively changing the potential difference and determining the data value in response to the potential difference starting to feed the cell current.

Figure 37:
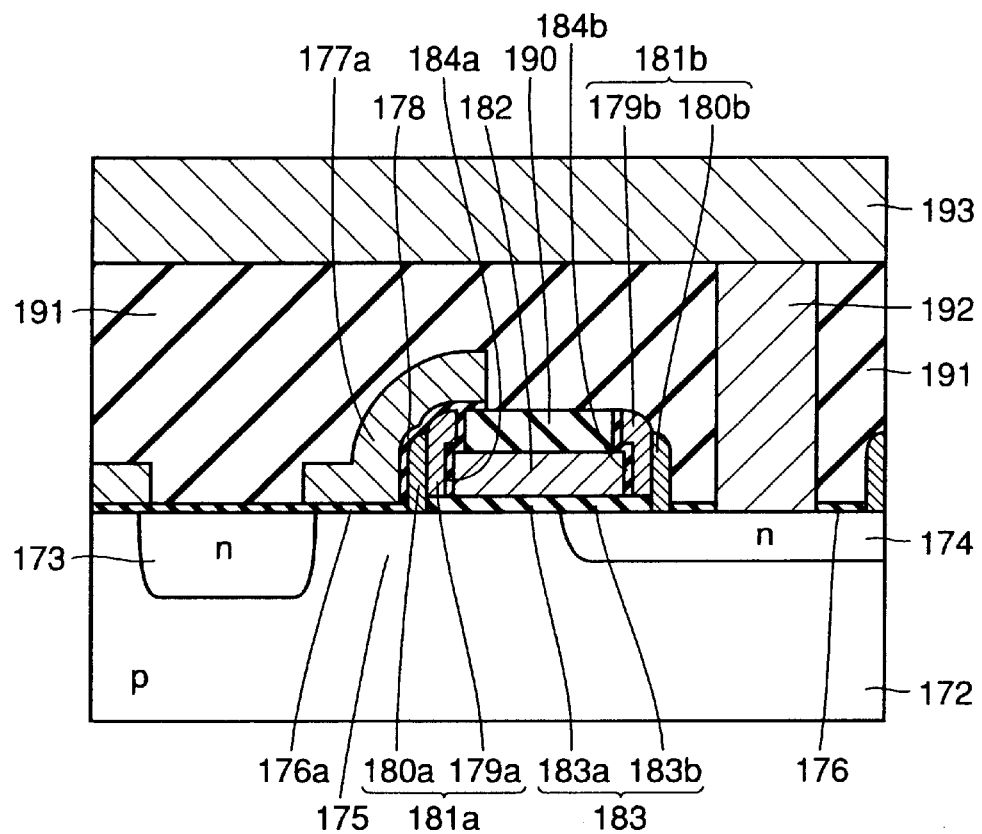
FIG. 37 is a partially fragmented sectional view showing a modification of the memory cell according to the first embodiment.

(viii) In the fifth embodiment, the control gate electrode 177 may be located on the floating gate electrode 182. More specifically, the control gate electrode 177a may overlap on the floating gate electrode 182, as shown in FIG. 37.

(ix) While the first tunnel insulator film 208 smaller in thickness than the second tunnel insulator film 210 is formed by etching back the first tunnel insulator film 208 in the step 37 of the sixth embodiment, the present invention is not restricted to this but the first and second tunnel insulator films 208 and 210 having different thicknesses may be formed by implanting argon ions or the like prompting oxidation into the floating gate electrode 211 while implanting nitrogen ions or the like suppressing oxidation into the control gate electrode 207 and thereafter performing oxidation. Thus, the first and second tunnel insulator films 208 and 210 having different thicknesses can be formed in a single thermal oxidation step without employing etchback.

(x) In the aforementioned seventh embodiment, the drain region 344a is made of a material (e.g., WSi or TiN) having a Schottky barrier with respect to silicon. Thus, potential difference is kept between the n-type impurity region 349 and the drain region 344a in writing due to the Schottky barrier, so that electrons can be accelerated. Further, the Schottky barrier has a relatively small height of about 0.5 eV, and hence a large quantity of electrons can be extracted from the drain region 344a also when the potential difference between the drain region 344a and the n-type impurity region 349 is small. In this case, the first tunnel insulator film 348 is omitted or reduced in thickness.

When reducing the first tunnel insulator film 348 in thickness, the thickness of the first tunnel insulator film 348 is preferably minimized (to not more than 3 nm, for example) within the range for stabilizing the interface between the drain region 344a and the n-type impurity region 349. Thus, the barrier defined by the first tunnel insulator film 348 can be thinned by reducing the thickness of the first tunnel insulator film 348, whereby the first tunnel insulator film 348 can be prevented from exerting influence on the Schottky barrier characteristic. At the same time, the first tunnel insulator film 348 can readily stabilize the interface between the drain region 344a and the n-type impurity region 349, which is readily unstabilized due to a large number of interfacial levels.

The thickness of the Schottky barrier can be precisely controlled by the impurity concentration of the n-type impurity region 349. In this case, a potential gradient can be provided in the n-type impurity region 349 by lowering the impurity concentration thereof. Thus, the electrons extracted from the drain region 344a can be gradually accelerated to be supplied with energy for passing through the oxide film barrier of the second tunnel insulator film 350 immediately before being injected into the floating gate electrode 351. Therefore, the electrons are transported to a portion close to the floating gate electrode 351 in a low energy state having a long mean free path and injected with acceleration, to hardly lose energy in an intermediate stage. Consequently, the electrons are injected into the floating gate electrode 351 with a high probability.

(xi) When returning the control gate electrode 347 to a potential set as the ground or neutral potential in the erase operation in the seventh embodiment, weak writing takes place so that overerasing can be corrected. More specifically, the potential difference between the floating gate electrode 351 and the source region 343 decreases to terminate the erase operation when returning the control gate electrode 347 from −6 V to the potential set as the ground (0 V) or neutral voltage if the floating gate electrode 351 is overerased up to 2 V exceeding the threshold voltage (0.5 V), for example. The transistor located under the floating gate electrode 351 is turned on. Thus, the potential of the n-type impurity region 349 increases to 1.5 V (value obtained by level-shifting the threshold voltage (0.5 V) from the potential (2 V) of the floating gate electrode 351 with the upper limit of the potential (3 V) of the source region 343). In this case, a voltage of −3 V is applied to the drain region 344a, and hence potential difference is caused between the n-type impurity region 349 and the drain region 344a so that electrons from the drain region 344a are injected into the floating gate electrode 351 for performing weak writing as a result. Thus, overerasing can be corrected.

What is claimed is:

1. A semiconductor memory comprising a semiconductor region, a first gate electrode, formed on a first insulator film, said first insulator film formed on one surface of said semiconductor region, and a second gate electrode formed on a second insulator film, said second insulator film formed on another surface of said semiconductor region, for injecting carriers into said second gate electrode through said first insulator film, said semiconductor region and said second insulator film.

2. The semiconductor memory according to claim 1, wherein
said semiconductor region is formed by a second conductivity type impurity region formed on a first layer consisting of a first conductivity type semiconductor.

3. The semiconductor memory according to claim 1, wherein
said semiconductor region includes a second conductivity type semiconductor film formed on a first layer consisting of a first conductivity type semiconductor.

4. The semiconductor memory according to claim 3, wherein
said first gate electrode and said second gate electrode are formed in a self-aligned manner.

5. A semiconductor memory comprising:
a second conductivity type first region and a second conductivity type second region formed on a first layer consisting of a first conductivity type semiconductor;

a first gate electrode and a second gate electrode formed on said first layer between said first region and said second region;

a second conductivity type third region formed on said first layer between said first gate electrode and said second gate electrode;

a first insulator film formed between said first gate electrode and said third region; and a second insulator film formed between said second gate electrode and said third region.

6. The semiconductor memory according to claim 5, wherein said third region is formed by a second conductivity type impurity region.

7. The semiconductor memory according to claim 5, wherein said first gate electrode is formed through a first gate insulator film with respect to said first layer, and said second gate electrode is formed through a second gate insulator film with respect to said first layer.

8. The semiconductor memory according to claim 5, wherein the electrostatic capacitance between said second region and said second gate electrode is set larger than the electrostatic capacitance between said third region and said second gate electrode, and a voltage applied to said second region is transmitted to said second gate electrode by electrostatic coupling between said second region and said second gate electrode so that said third region connected with said second region through said first layer is substantially equalized in potential with said second region.

9. The semiconductor memory according to claim 5, wherein the width of said third region is set substantially not more than the mean free path of carriers permeating through a barrier of said first insulator film located between said first gate electrode and said third region when having energy necessary for passing through a barrier of said second insulator film.

10. The semiconductor memory according to claim 5, wherein said second gate electrode is formed on the side wall of said second region through a third insulator film.

11. The semiconductor memory according to claim 10, wherein a groove is formed in said first layer for thereafter forming said second gate electrode in said groove through said third insulator film on the side of said second region.

12. The semiconductor memory according to claim 5, wherein a first conductivity type fourth region is formed on said second conductivity type second region, and said second region is formed on the overall region between said first layer and said fourth region.

13. The semiconductor memory according to claim 12, wherein said second region and said fourth region are capacitively coupled with said second gate electrode through a third insulator film.

14. The semiconductor memory according to claim 5, wherein said first gate electrode includes a side wall film formed in a self-aligned manner with respect to said third region.

15. The semiconductor memory according to claim 14, wherein said side wall film is formed by depositing a first conductive film on the side surface of said third region and thereafter etching back said first conductive film.

16. The semiconductor memory according to claim 5, further comprising a wire connected to said first region, wherein said wire is formed in a self-aligned manner with respect to said first region.

17. The semiconductor memory according to claim 18, wherein said wire is formed by depositing a first conductive film on the side surface of said first gate electrode through a fourth insulator film and thereafter etching back said first conductive film.

18. The semiconductor memory according to claim 5, wherein said third region is formed by forming a side wall insulator film on the side surface of said first gate electrode in a self-aligned manner and thereafter etching back said first layer through said side wall insulator film.

19. The semiconductor memory according to claim 5, wherein said third region includes a second conductivity type conductive film.

20. The semiconductor memory according to claim 19, wherein said first gate electrode and said second gate electrode are formed on the major surface of said first layer, and said third region consisting of said conductive film is formed between said first gate electrode and said second gate electrode on the major surface of said first layer.

21. The semiconductor memory according to claim 20, wherein at least part of said third region is formed on the upper surface of said second gate electrode, and at least part of said first gate electrode is formed on the upper surface of said third region.

22. The semiconductor memory according to claim 19, wherein said third region includes a single-crystalline silicon film.

23. The semiconductor memory according to claim 19, wherein said third region includes a first side wall film consisting of a first conductive film formed in a self-aligned manner.

24. The semiconductor memory according to claim 23, wherein said first side wall film includes:

a second side wall film consisting of a second conductive film formed on the side wall of said second gate electrode through said second insulator film, and a third side wall film consisting of a third conductive film formed to be in contact with the side surface of said second side wall film and the surface of said first layer.

25. The semiconductor memory according to claim 24, wherein said second side wall film is formed by depositing said second conductive film on the side surface of said second gate electrode through said second insulator film and thereafter etching back said second conductive film, and said third side wall film is formed by depositing a third conductive film to cover said first layer and said second side wall film and thereafter etching back said third conductive film, to be in contact with the side surface of said second side wall film and the surface of said first layer.

26. The semiconductor memory according to claim 23, wherein said second region includes a fourth side wall film consisting of a fourth conductive film formed on the side surface of said second gate electrode in a self-aligned manner through a third insulator film.

27. The semiconductor memory according to claim 26, wherein said fourth side wall film includes:

a fifth side wall film consisting of a fifth conductive film formed on the side wall of said second gate electrode through said third insulator film, and a sixth side wall film consisting of a sixth conductive film formed to be in contact with the side surface of said fifth side wall film and the surface of said first layer.

28. The semiconductor memory according to claim 26, wherein said fourth side wall film is formed simultaneously with said first side wall film.

29. The semiconductor memory according to claim 19, wherein said first gate electrode and said second gate electrode are formed in a self-aligned manner.

30. The semiconductor memory according to claim 29, wherein said first region and said second region are so formed on said first layer as to expose the side surfaces thereof, said first gate electrode includes a seventh side wall film formed on the side surface of said first region in a self-aligned manner through a third insulator film, and said second gate electrode includes an eighth side wall film formed on the side surface of said second region in a self-aligned manner through a fourth insulator film.

31. The semiconductor memory according to claim 30, wherein said seventh side wall film and said eighth side wall film are simultaneously formed by depositing a seventh conductive film to cover the overall surface and thereafter etching back said seventh conductive film.

32. The semiconductor memory according to claim 29, wherein said third region consisting of said conductive film is formed in a self-aligned manner with respect to said first gate electrode and said second gate electrode.

33. The semiconductor memory according to claim 32, wherein said third region is formed to fill up a clearance between said seventh side wall film and said eighth side wall film.

34. The semiconductor memory according to claim 29, wherein the thickness of said first insulator film is smaller than the thickness of said second insulator film.

35. The semiconductor memory according to claim 34, wherein said first insulator film and said second insulator film are formed by introducing an impurity suppressing oxidation into said first gate electrode while introducing an impurity prompting oxidation into said second gate electrode and thereafter oxidizing said first gate electrode and said second gate electrode.

36. The semiconductor memory according to claim 29, wherein a fifth insulator film is formed between the upper surface of said third region located between said first gate electrode and said second gate electrode and the upper side surfaces of said first gate electrode and said second gate electrode.

37. A semiconductor memory comprising a second conductivity type region formed on a first layer consisting of a first conductivity type semiconductor, a gate electrode and a semiconductor region formed between said second conductivity type region and said gate electrode through insulator films respectively, for injecting carriers into said gate electrode from said second conductivity type region through said insulator films and said semiconductor region.

38. The semiconductor memory according to claim 37, wherein said semiconductor region consists of a second conductivity type impurity region formed on said first layer consisting of said first conductivity type semiconductor.

39. A semiconductor memory comprising:

a second conductivity type first region and a second conductivity type second region formed on a first layer consisting of a first conductivity type semiconductor;

a first gate electrode formed on said first layer;

a second gate electrode formed on said first layer between said first region and said second region;

a second conductivity type third region formed between either said first gate electrode or said second region on said first layer and said second gate electrode;

a first insulator film formed on one surface of said third region; and a second insulator film formed on another surface of said third region.

40. The semiconductor memory according to claim 39, wherein said second gate electrode is formed through a gate insulator film with respect to said first layer.

41. The semiconductor memory according to claim 39, wherein the width of said third region is set substantially not more than the mean free path of carriers permeating through a barrier of said first insulator film located between said second region and said third region when having energy necessary for passing through a barrier of said second insulator film.

42. The semiconductor memory according to claim 39, further comprising a third insulator film formed between said second gate electrode and said first region, wherein said first gate electrode extends in a direction intersecting with said first region and said second region, said first insulator film is formed between said third region and said second region, and said second insulator film is formed between said third region and said second gate electrode.

43. The semiconductor memory according to claim 42, wherein the electrostatic capacitance between said first gate electrode and said second gate electrode is set larger than the electrostatic capacitance of the remaining parts, and a voltage applied to said first gate electrode is transmitted to said second gate electrode by electrostatic coupling between said first gate electrode and said second gate electrode so that said third region connected with said first region through said first layer is substantially equalized in potential with said first region.

44. The semiconductor memory according to claim 42, wherein said third region and said second region are connected through a diode.

45. The semiconductor memory according to claim 42, wherein said second region includes a material having a Schottky barrier with respect to silicon.

46. The semiconductor memory according to claim 45, wherein said first insulator film located between said second region and said third region has the smallest possible thickness within the range stabilizing the interface between said second region and said third region.

47. The semiconductor memory according to claim 45, wherein a potential gradient is provided on said third region by lowering the impurity concentration of said third region.

48. The semiconductor memory according to claim 45, wherein an insulator film located between said second region and said first layer has a thickness capable of isolating said second region and said first layer from each other.

49. A method of operating a semiconductor memory, said method comprising the steps of:

forming a second conductivity type first region and a second conductivity type second region on a first layer consisting of a first conductivity type semiconductor;

forming a first gate electrode on said first layer between said first region and said second region through a first gate insulator film with respect to said first layer;

forming a second gate electrode on said first layer between said first region through a second gate insulator film with respect to said first layer;

forming a second conductivity type third region on said first layer between said first gate electrode and said second gate electrode;

forming a first insulator film between said first gate electrode and said third region; and forming a second insulator film between said second gate electrode and said third region, writing data by injecting hot carriers into said second gate electrode from said first gate electrode through said first insulator film, said third region and said second insulator film.

50. The method of operating a semiconductor device according to claim 49, writing data of at least three values by varying the initial field intensity between said first gate electrode and said third region thereby controlling the quantity of said hot carriers injected into said second gate electrode.

51. The method of operating a semiconductor device according to claim 49, further comprising the step of:

erasing data by extracting said hot carriers from said second gate electrode to said third region through said second insulator film.

52. The method of operating a semiconductor device according to claim 49, wherein the width of said third region is set substantially not more than the mean free path of carriers permeating through a barrier of said first insulator film located between said first gate electrode and said third region when having energy necessary for passing through a barrier of said second insulator film.

53. The method of operating a semiconductor device according to claim 49, wherein the electrostatic capacitance between said second region and said second gate electrode is set larger than the electrostatic capacitance between said third region and said second gate electrode, and a voltage applied to said second region is transmitted to said second gate electrode by electrostatic coupling between said second region and said second gate electrode so that said third region connected with said second region through said first layer is substantially equalized in potential with said second region.

54. The method of operating a semiconductor device according to claim 53, further comprising the step of:

temporarily setting the voltage of said second region coupled with said second gate electrode to a prescribed value and thereafter holding said second region in an open state when erasing data.

55. A method of operating a semiconductor memory comprising:

forming a second conductivity type first region and a second conductivity type second region on a first layer consisting of a first conductivity type semiconductor;

forming a first gate electrode on said first layer;

forming a second gate electrode on said first layer between said first region and said second region through a gate insulator film with respect to said first layer;

forming a second conductivity type third region between either said first gate electrode or said second region on said first layer gate electrode;

forming a first insulator film on one surface of said third region; and forming a second insulator film on another surface of said third region, writing data by injecting hot carriers from either said first gate electrode or said second region into said second gate electrode through said first insulator film, said third region and said second insulator film.

56. The method of operating a semiconductor memory according to claim 55, erasing data by extracting said hot carriers from said gate electrode to said first region through a third insulator film.

57. The method of operating a semiconductor memory according to claim 55, wherein the electrostatic capacitance between said first gate electrode and said second gate electrode is set larger than the electrostatic capacitance of the remaining parts, and a voltage applied to said first gate electrode is transmitted to said second gate electrode by electrostatic coupling between said first gate electrode and said second gate electrode so that said third region connected with said first region through said first layer is substantially equalized in potential with said first region.

58. The method of operating a semiconductor memory according to claim 55, wherein the width of said third region is set substantially not more than the mean free path of carriers permeating through a barrier of said first insulator film located between said second region and said third region when having energy necessary for passing through a barrier of said second insulator film.

59. The method of operating a semiconductor memory according to claim 55, further comprising the step of:

applying a positive voltage and a negative voltage to said first region and said second region respectively while applying a negative voltage and a positive voltage to said first gate electrode of a memory cell subjected to erasing and said first gate electrode of a memory cell subjected to wiring respectively when rewriting data thereby simultaneously performing erasing and writing on a plurality of memory cells connected with a plurality of said first gate electrodes respectively and holding data such as to a memory cell requiring no data change.

60. The method of operating a semiconductor memory according to claim 55, further comprising the step of:

temporarily setting the voltage of said first gate electrode coupled with said second gate electrode to a prescribed negative potential and thereafter returning the potential of said first gate electrode to a potential set as a ground potential or a neutral potential when erasing data.

* * * * *